(12) United States Patent
Ryley, III et al.

(10) Patent No.: US 11,720,084 B2
(45) Date of Patent: Aug. 8, 2023

(54) EFFICIENT AND MANUFACTURABLE MECHANICAL COMPUTING

(71) Applicant: CBN Nano Technologies Inc., Ottawa (CA)

(72) Inventors: James F. Ryley, III, Downey, CA (US); Mark N. Jobes, Ottawa (CA); James MacArthur, Manchester (GB); Jeffrey E. Semprebon, Claremont, NH (US)

(73) Assignee: CBN Nano Technologies Inc., Ottawa (CA)

( * ) Notice: Subject to any disclaimer, the term of this patent is extended or adjusted under 35 U.S.C. 154(b) by 0 days.

(21) Appl. No.: 17/802,742

(22) PCT Filed: Sep. 22, 2021

(86) PCT No.: PCT/US2021/051405
§ 371 (c)(1),
(2) Date: Aug. 26, 2022

(87) PCT Pub. No.: WO2022/066679
PCT Pub. Date: Mar. 31, 2022

(65) Prior Publication Data
US 2023/0087289 A1 Mar. 23, 2023

Related U.S. Application Data

(60) Provisional application No. 63/083,276, filed on Sep. 25, 2020, provisional application No. 63/083,265, filed on Sep. 25, 2020.

(51) Int. Cl.
*G05B 19/4155* (2006.01)
*B82Y 10/00* (2011.01)
*G06F 5/01* (2006.01)

(52) U.S. Cl.
CPC .......... *G05B 19/4155* (2013.01); *B82Y 10/00* (2013.01); *G06F 5/01* (2013.01); *G05B 2219/33291* (2013.01)

(58) Field of Classification Search
CPC ...... G05B 19/4155; G05B 2219/33291; B82Y 10/00; G06F 5/01; G06D 3/00; H03K 19/02; H03K 19/20; G06C 15/02
See application file for complete search history.

(56) References Cited

U.S. PATENT DOCUMENTS 2,621,855 A  12/1952 Hauser
3,273,794 A  9/1966 Lieberman et al.
(Continued)

OTHER PUBLICATIONS

Sharma, Ram, & Amarnath. Mechanical Logic Devices and Circuits. 14th National Conference on Machines and Mechanisms (NaCoMM-09). (2009) pp. 235-239.
(Continued)

*Primary Examiner* — Seung H Lee

(57) ABSTRACT

Logic mechanisms operate to define the position of at least one mechanical output based on the position of at least one mechanical input. Some mechanisms are configured to determine, based on the input position(s), whether a path to transmit motion to an output exists or does not exist. Some mechanisms are configured to determine, based on the input position(s), whether or not motion of a driven element can be accommodated without moving an output. Some mechanisms are configured to determine, based on the input position(s), whether or not one or more elements are constrained to transmit motion to an output.

23 Claims, 40 Drawing Sheets

(56) References Cited

U.S. PATENT DOCUMENTS

| | | | | |
|---|---|---|---|---|
| 10,678,293 B2* | 6/2020 | Pascall | .................. | H03K 19/20 |
| 2017/0192748 A1* | 7/2017 | Merkle | .................. | H03K 19/20 |
| 2020/0225911 A1 | 7/2020 | Merkle et al. | | |

OTHER PUBLICATIONS

Hilton, William; "K'Nex Adding Machine", published on YouTube Dec. 5, 2006 at URL: https://www.youtube.com/watch?v=3vXIQZvS-nM, screenshots from video taken Oct. 13, 2021.

Carnegie Mellon University, "Build 18: LEGO gates", published online Jan. 26, 2013 at URL: https://mechalogic.wordpress.com/2013/01/26/build-18-lego-gates/, website accessed Oct. 13, 2021.

Patrick Barnes, "Logic Gate Linkage Calculations" published Oct. 13, 2014 and "Springless Reversible Mechanical Logic" published Oct. 8, 2014 at URL: https://mindbleach.com/words/tag/mechanical-logic/, website accessed Oct. 13, 2021.

PRP for corresponding PCT application PCT/US21/51405, dated Dec. 14, 2022.

Charles Bennett & Landauer. The Fundamental Physical Limits of Computation. Scientific American. (1985).

Bradley. Mechanical Computing in Microelectromechanical Systems (MEMS). Air Force Institute of Technology. (2003). Ohio.

Drexler. Nanomechanical Computation Systems. Nanosystems Molecular Machinery, Manufacturing, and Computation. (1992) pp. 342-371. New York: John Wiley & Sons, Inc.

R. Merkle. Two Types of Mechanical Reversible Logic. Nanotechnology. (1990) vol. 4, pp. 114-131.

Svoboda. Computing Mechanisms and Linkages. H. James (Ed.). (1965) pp. 359. New York: Dover Publications.

Ion, Wall, Kovacs, & Baudisch. Digital Mechanical Metamaterials. Proceedings of the 2017 CHI Conference on Human Factors in Computing Systems—CHI '17. (2017) pp. 977-988.

Raney et al. Stable propagation of mechanical signals in soft media using stored elastic energy. Proc Natl Acad Sci USA. (2016), Aug. 16, 2016 ed., vol. 113, pp. 9722-9727.

* cited by examiner

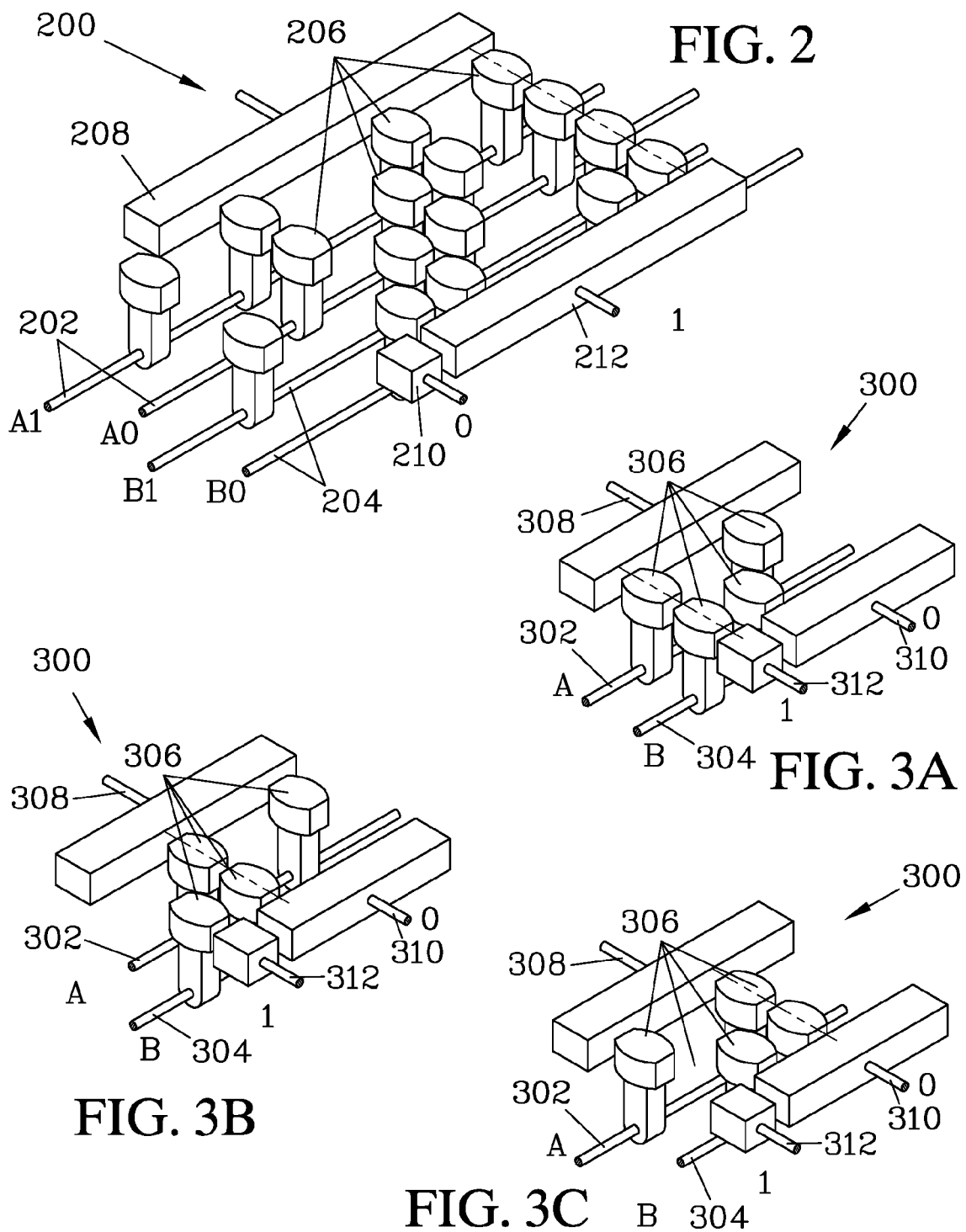

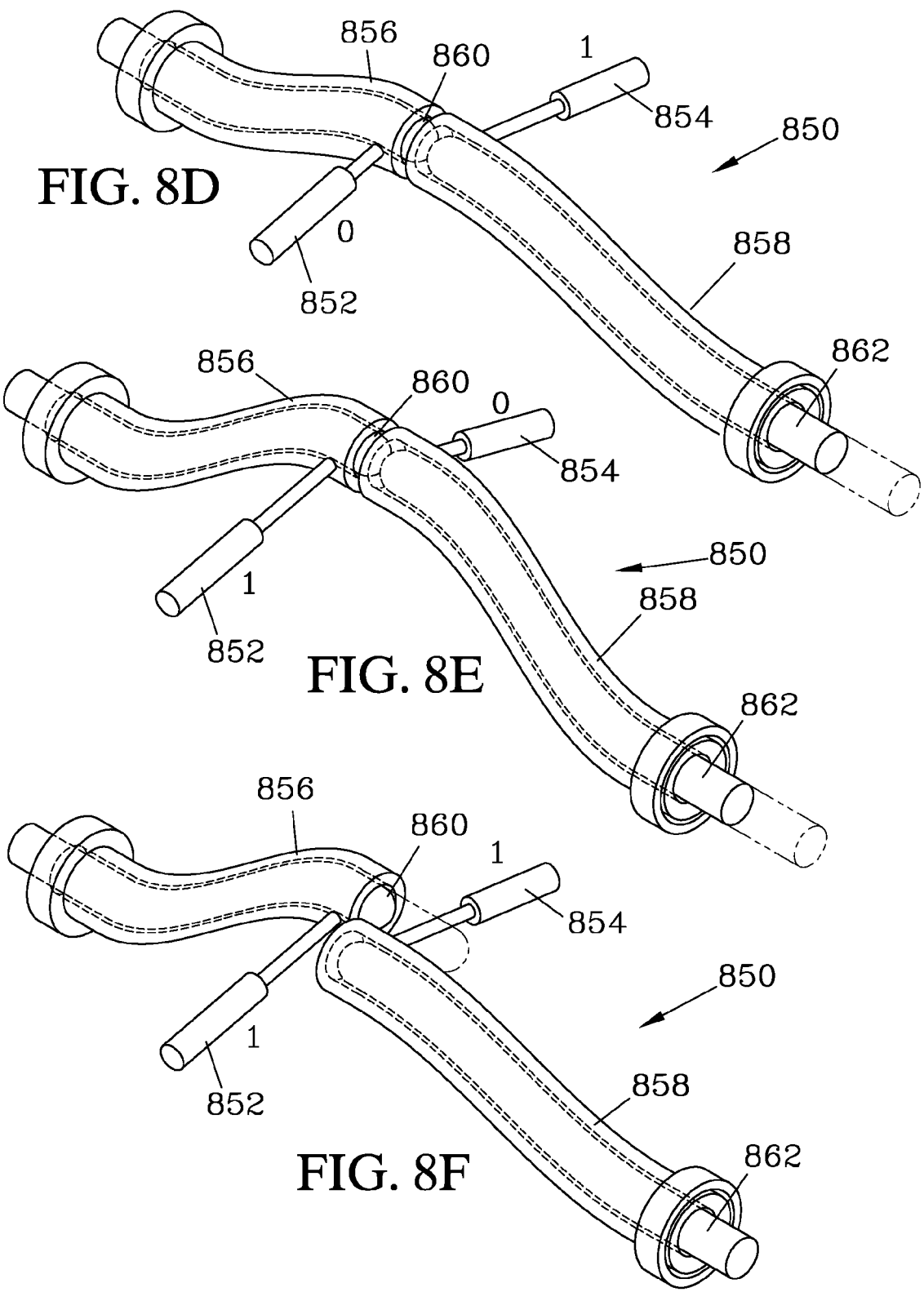

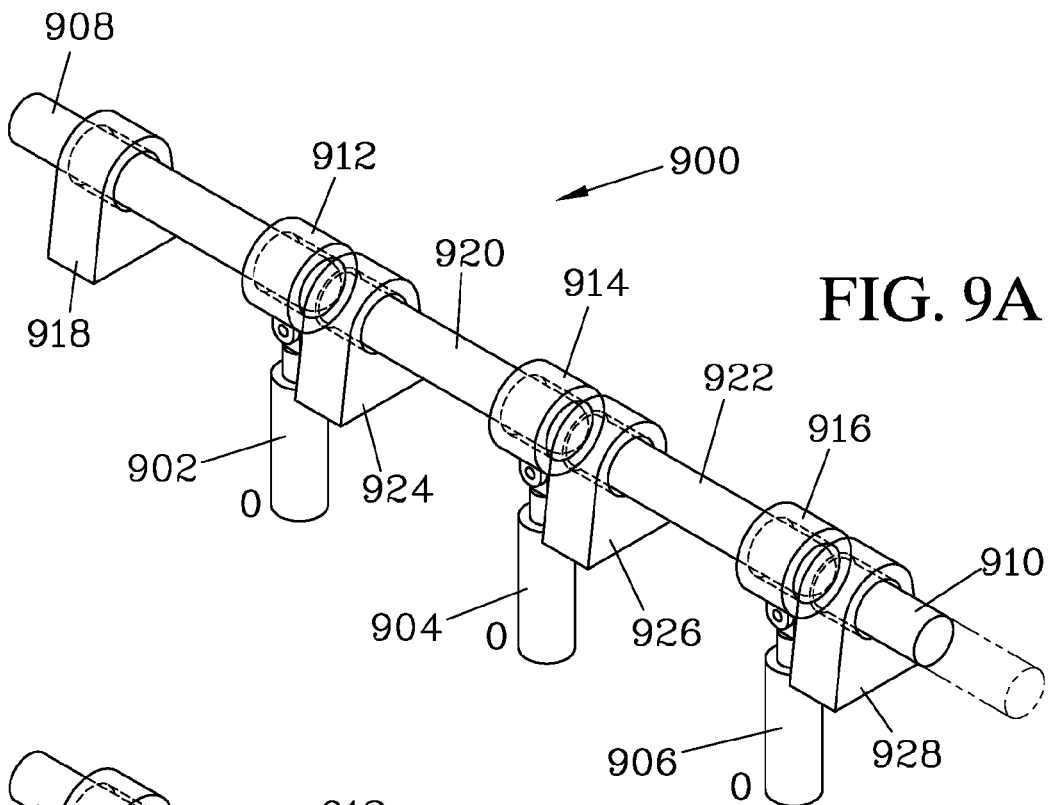
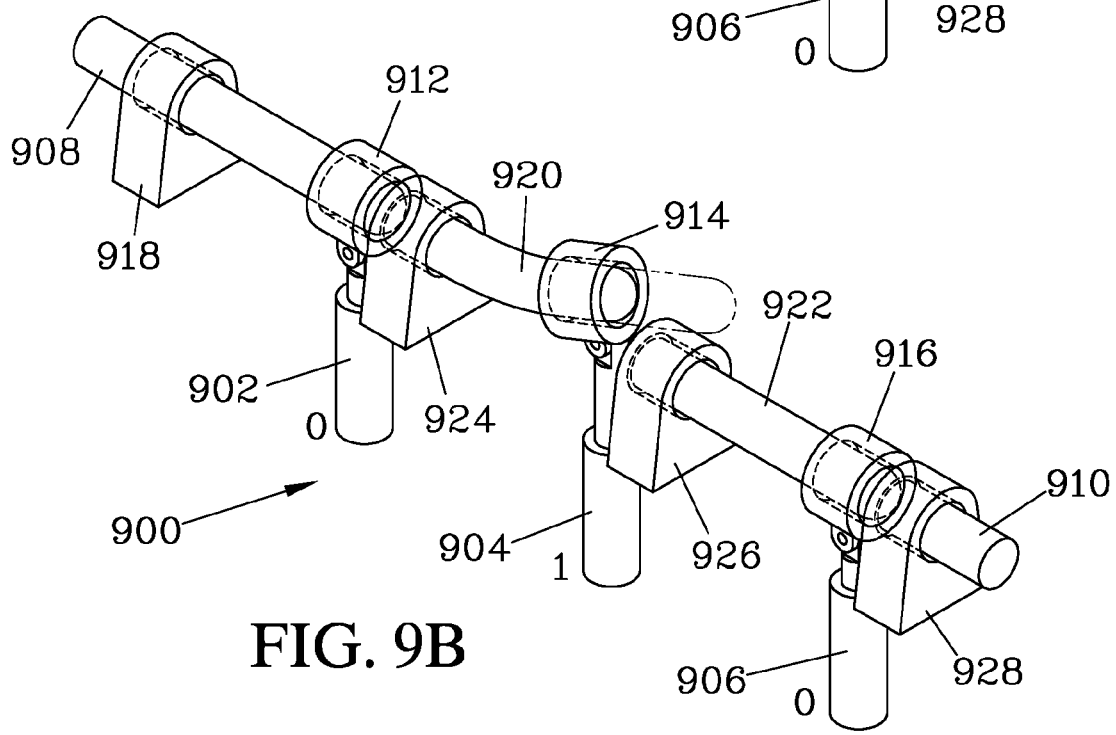

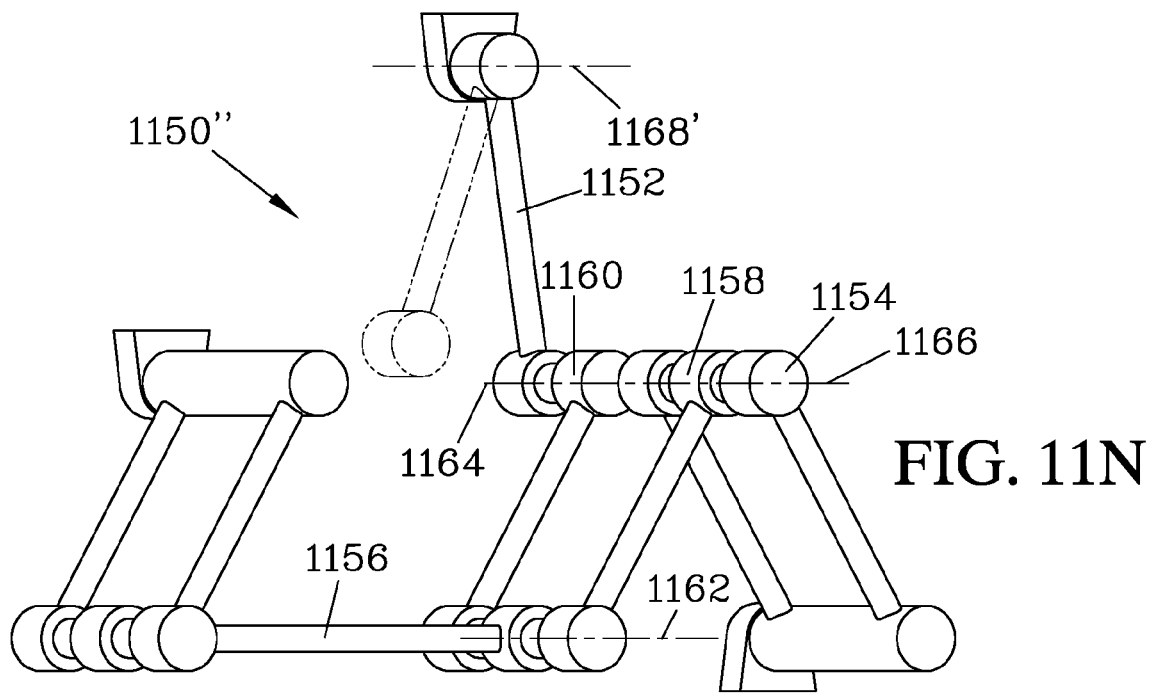
FIG. 11N
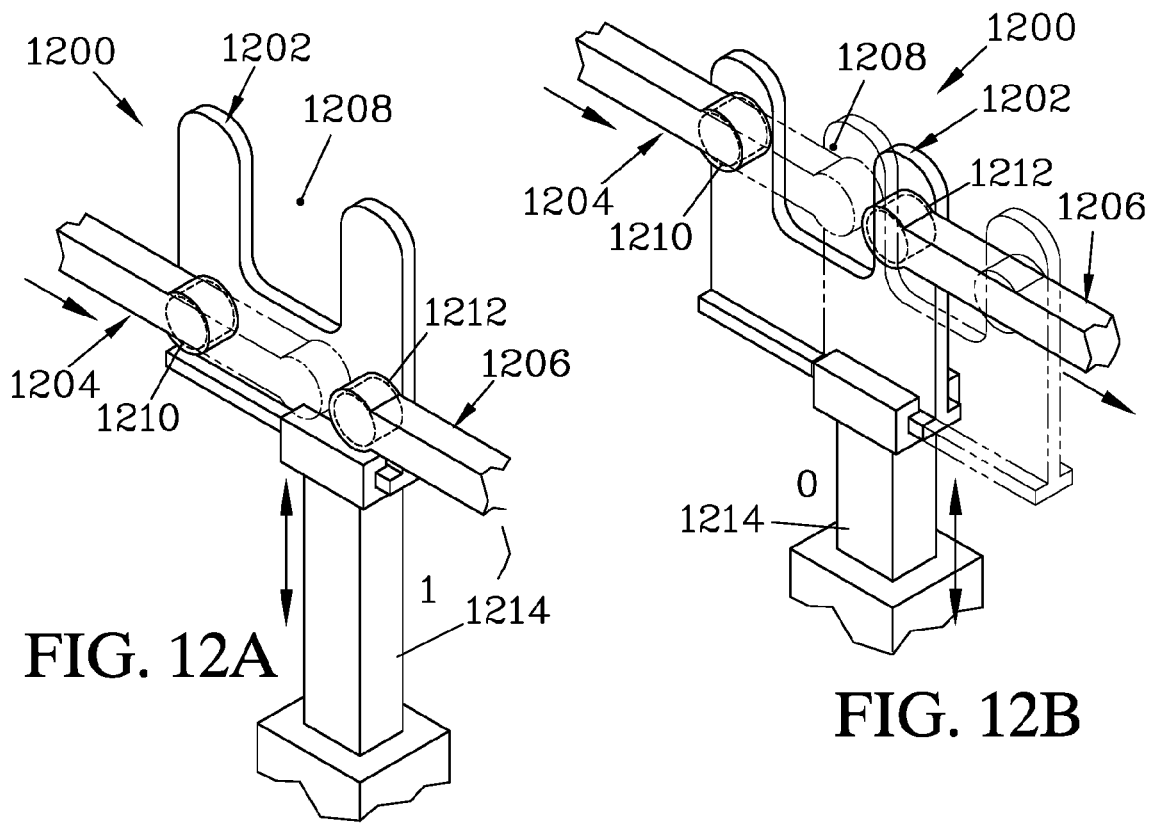
FIG. 12A
FIG. 12B

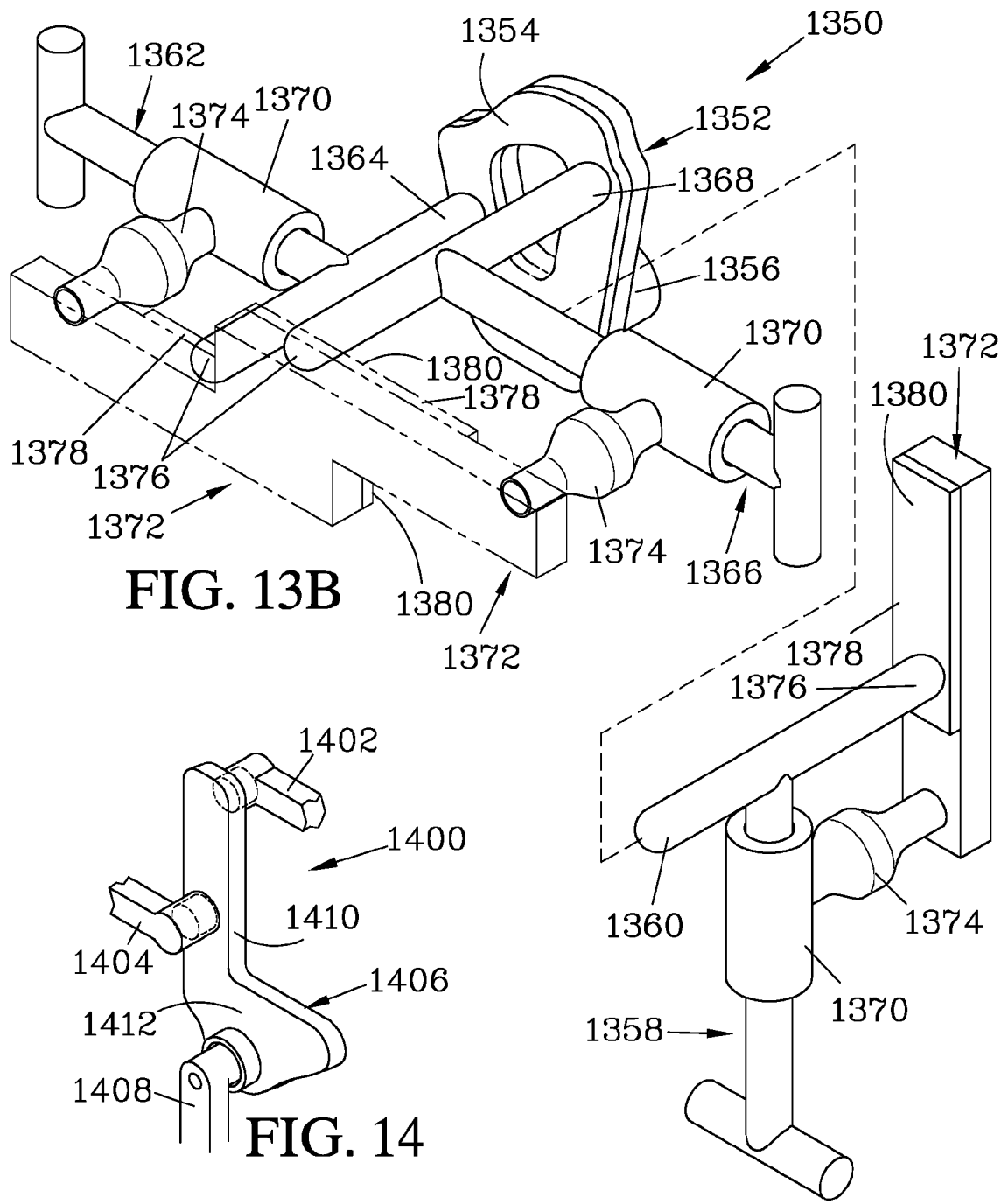

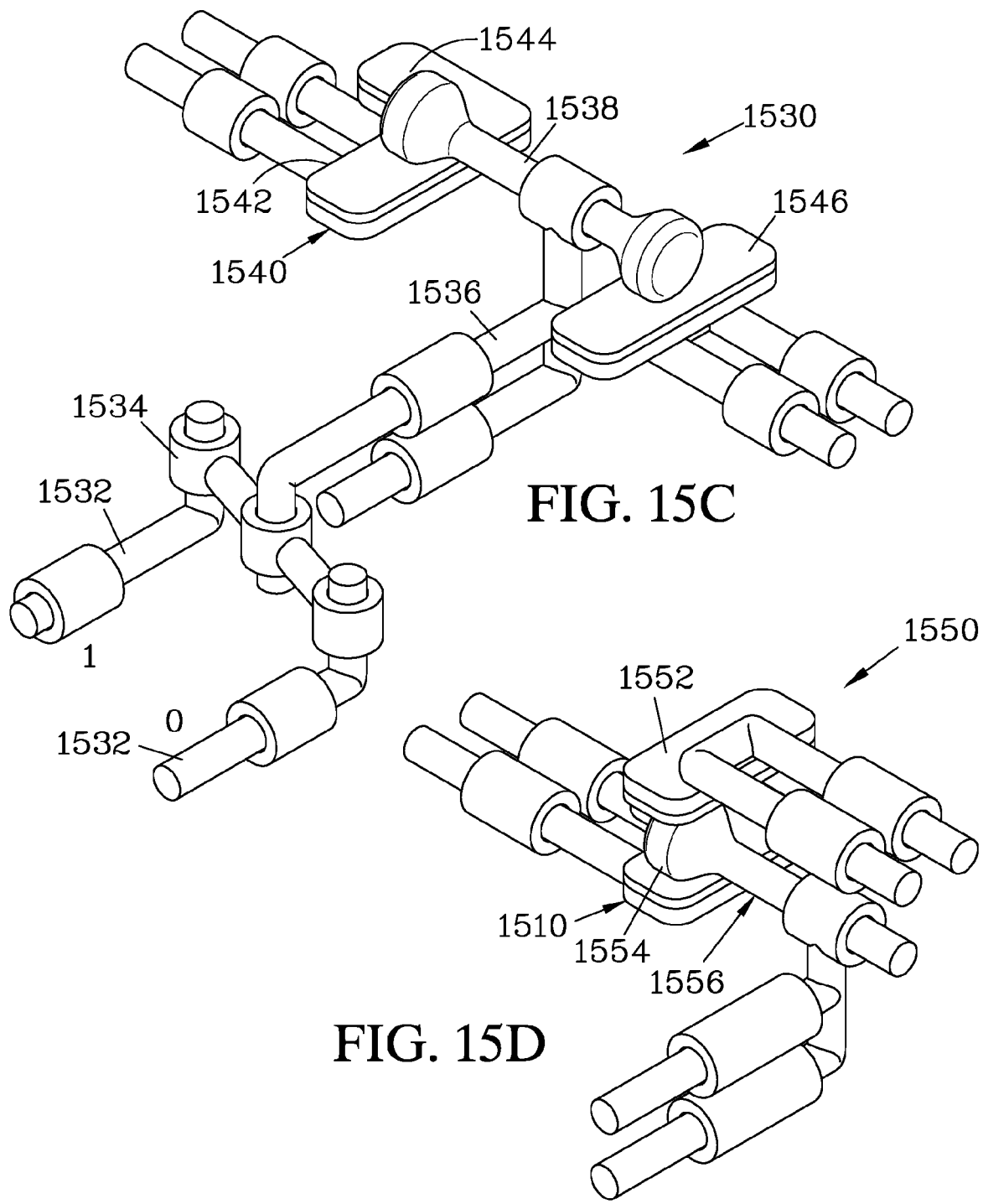

EFFICIENT AND MANUFACTURABLE MECHANICAL COMPUTING

TECHNICAL FIELD

The present application relates to mechanical logic structures, including schemes for logic mechanisms that can be compact, efficient, and/or amenable to fabrication at small scales.

BACKGROUND

Mechanical logic and computing designs date back to Babbage's Analytical Engine, described in 1837. More recently, there has been interest in developing mechanical logic for nanotechnology computers, such as the rod logic described by Drexler in his 1992 book "Nanosystems: Molecular Machinery, Manufacturing, and Computation". Logic mechanisms designed for reduced energy consumption are taught in U.S. Pat. Nos. 10,481,866; 10,664,233; 10,949,166; and U.S. Publication 2021/0149630, all incorporated herein by reference in those jurisdictions where such incorporation is appropriate. Mechanisms such as taught in the '866 patent are designed to be suitable for molecular-scale fabrication by mechanosynthesis (such as the techniques taught in U.S. Pat. Nos. 8,171,568; 8,276,211; 9,676,677; 10,067,160; 10,072,031; 10,138,172; 10,197,597; 10,308,514; 10,309,985; 10,822,229; and 10,822,230, all incorporated herein by reference in those jurisdictions where such incorporation is appropriate); however, such mechanisms are typically also suitable for larger-scale fabrication using conventional techniques such as micro- and nano-lithography techniques, other MEMS ("MicroElectroMechanical Systems") or NEMS ("NanoElectroMechanical Systems") techniques, and via macroscopic manufacturing techniques (e.g., CNC, casting, molding, 3D printing) to create mechanical computing devices suitable for purposes including computation, computational system testing and design, and educational models.

SUMMARY

The following remarks summarize several aspects of the invention to facilitate an understanding of some of the inventive aspects claimed in the present application. However, the following summary is not intended to be limiting, and additional inventive aspects should be apparent from the entirety of the disclosure and claims.

Logic mechanisms as taught herein have at least one mechanical input and at least one mechanical output, and are configured to define the position of the output(s) based on the position(s) of the input(s). Mechanisms may have two or more inputs, and may have two or more outputs. The input(s) may determine the position that one or more outputs reside in after a driven element of the mechanism (which could be considered as an additional input) has been displaced.

Some mechanisms are configured such that the position(s) of the input(s) determine whether or not movement of the driven element is transmitted to the output by determining whether or not a path for transmitting such motion exists. Some mechanisms are configured such that the position(s) of the input(s) determine whether or not free motion of the driven element is constrained, and thus determine whether or not movement of the driven element can be accommodated without transmitting motion to the output.

Some mechanisms that have at least two inputs are configured such that the inputs determine whether or not movement of a driven element is transmitted to the output, and wherein such determination is the same for more than one position of at least one element of the mechanism. In some such mechanisms, at least one of the inputs can engage the driven element to deflect it from transmitting motion to the output. For mechanisms having two or more inputs that determine whether or not motion is transmitted to an output, such determination may be defined by a Boolean logic operation of the positions of at least two of the inputs, and such Boolean logic operation could be a NOR, NAND, or XOR logic operation.

Some mechanisms have at least one motion-transmitting element that is selectively interposable between the driven element and the output, with the position(s) of the motion-transmitting element(s) being defined by position(s) of the input(s) such that the position(s) of the input(s) determine whether or not the motion-transmitting element(s) is/are interposed between the driven element and the output so as to transmit motion therebetween. The motion-transmitting element(s) may be attached to the input(s) and directly positioned thereby. Multiple inputs could move parallel to each other and perpendicularly to the driven element and the output, in which case the motion-transmitting elements can be attached to the inputs so as to be movable into alignment with at least one motion-transmitting element attached to an adjacent input to transmit motion thereto. In some mechanisms, at least one motion-transmitting element is connected to at least two inputs and positioned by the combined positions thereof. Mechanisms may employ at least one guide attached to and directly positioned one of the inputs, such guide serving to direct one of the motion-transmitting element(s). Mechanisms may be configured such that a motion-transmitting element has an active portion, which acts to transmit motion from the driven element to the output when this portion is interposed therebetween, and an inactive portion, which can accommodate motion of the driven element without transmitting such motion to the output when this portion is interposed therebetween.

Some mechanisms employ at least one guide for directing either or both of the driven element and the output, with the position(s) of the guide(s) being defined by position(s) of the input(s) such that the position(s) of the input(s) determine whether or not the driven element and the output are positioned relative to each other so as to transmit motion therebetween. Such mechanisms may also have at least one motion-transmitting elements that is directed by a guide, in turn positioned by an input, and where the guide determines whether or not the motion-transmitting element is positioned to transmit motion from the driven element to the output (either by itself or in combination with other motion-transmitting elements, some of which may also be directed by guides).

In some mechanisms, a driven element and the output have aligned positions, in which they are positioned such that motion of the driven element is transmitted to the output, and where one or more the inputs can be positioned to displace at least one of the driven element and the output away from its aligned position. In some cases, the driven element is aligned to transmit motion to the output unless it is deflected from such alignment, and at least one input acts to either deflect or not deflect the driven element; the input may directly engage the driven element, or may act to position a guide that can deflect the driven element. The driven element may directly engage the output when it is aligned therewith and displaced.

Some mechanisms employ at least one motion-transmitting element that positionable so as to transmit motion between the driven element and the output, as well as a constraining structure for selectively limiting the range of free motion of the motion-transmitting element(s) (based on the position(s) of the input(s)) so to either constrain or not constrain the motion-transmitting element(s), and where there is sufficient free motion of the motion-transmitting element(s) to accommodate movement of the driven element without causing motion of the output when unconstrained. When the constrained by the constraining structure (determined by the input position(s)), the motion-transmitting element(s) is/are positioned to transmit motion from the driven element to the output.

Some mechanisms employ a motion-controlling structure having at least one motion-control element that is positioned by the input(s) to selectively place the motion-controlling structure in multiple positions, including at least a motion-accommodating configuration (where motion of the driven element can be accommodated without causing movement of the output) and a motion-transmitting configuration (where motion of the driven element is transmitted to the output by at least one element of the motion-controlling structure). In some such mechanisms, the motion-controlling structure is provided by a single motion-control element, which may serve as the motion-transmitting element. In other mechanisms, a motion-transmitting element may be positioned by the input(s) relative to one or more motion-controlling elements. In some mechanisms, the motion-controlling structure has a motion-transmitting element, and wherein the position(s) of the motion-control element(s) determines the allowable motion of the motion-transmitting element.

In some mechanisms, the position(s) of the input(s) determine whether or not elements of the mechanism are aligned along a common axis of rotation, such alignment condition determining whether or not movement of said driven element can be accommodated by rotational motion without transmitting motion to said output.

For many of the mechanisms as discussed above, the input(s) and the output(s) can comprise carbon nanotubes (CNTs). Mechanisms can be fabricated small enough to occupy a volume no greater than 0.001 mm3, and/or to require no more than 1 μN force to position the output(s). For many of the mechanisms discussed above, the output can be complimented by at least one complimentary output, which defines a value different from the value that is defined by the output, and where the position(s) of the input(s) determine whether or not motion is transmitted to the output or to the complimentary output(s).

BRIEF DESCRIPTION OF THE FIGURES

FIG. 2. illustrates an example of a logic mechanism similar to those shown in FIG. 1F, but where the components are arranged such that the mechanism provides a NAND logic function on the inputs.

FIGS. 3A-3D illustrate additional examples of a logic mechanisms that employ aligned or misaligned motion-transmitting elements similar to those shown in FIGS. 1A-2, but where single inputs are employed and the knobs associated with each input are either displaced or not displaced. FIGS. 3A-3C show mechanisms that displace either a 0-value output or a 1-value output, while FIG. 3D shows a mechanism that displaces only a 1-value output, with no displacement indicating an output value of 0.

FIGS. 7E-H show three NOR gates are combined to create an AND logic output, with the output of one mechanism providing an input for another. FIG. 7I shows a half-adder formed using four NOR gates (as well as signal splitters) and operated by three sequential clock pulses.

FIGS. 8A-8F illustrate logic mechanisms where inputs control the position of guides that determine whether or not an aligned transmission path exists to transmit the motion of a driven element to an output; when the tubes are aligned, displacement of the driven element is transmitted or propagated to the output. The mechanism shown in FIGS. 8A & 8B is arranged to provide a NOR logic operation on the inputs. The mechanism shown in FIGS. 8C-8F is arranged to provide an XOR logic operation.

FIGS. 9A & 9B illustrate a logic mechanism where three inputs control the positions of guides to determine whether or not there is a path of aligned elements to transmit displacement of a driven element to an output, thus providing a 3-input NOR logic function.

In FIGS. 10A & 10B a constraining element can constrain the available positions of two motion-transmitting elements, aligning them sufficiently to transmit motion. In FIGS. 10C & 10D a flexible element only has sufficient rigidity to transmit movement when constrained. In FIG. 10E a hinged element can be constrained, and constraint is only needed in the direction of motion of the hinge. In FIGS. 10F & 10G available space containing a fluid can be constrained such that the fluid exerts sufficient pressure to move the output.

FIGS. 11A-11N illustrate logic mechanisms that employ hinge joints that can be constrained based on the position of an input, the constraint determining whether the hinge accommodates or transmits motion. In FIGS. 11A-11D the available motion of the hinge is constrained by a slot that is aligned to either allow bending or translation of the hinge. FIGS. 11I-11N illustrate logic mechanisms constructed only from links and pivot joints, where alignment or misalignment of axes of rotation determines whether or not motion of a driven element can be accommodated without forcing motion of an output.

FIGS. 12A-12I illustrate logic mechanisms where each input determines the position of an intermediate element (formed as a shaped plate) that can either accommodate the motion of a driven element without moving, or is forced to move therewith, and which in turn moves an output when it is moved with the driven element. FIGS. 12A & 12B illustrate a transmission gate that either transmits or does not transmit motion, and FIG. 12C illustrates a 3-input NOR gate that can be formed using such gates. FIGS. 12D-12F illustrate alternative configurations that can be employed, where the plate is pivotably mounted to the input. FIGS. 12G & 12H illustrate a switch gate that employs two opposed transmission gates, serveing to direct motion to either of two outputs. FIG. 12I illustrates a transmission gate where the plate is provided with channels to increase the force of motion that can be transmitted.

FIGS. 13A and 13B illustrate two examples of transmission gates providing a similar function to that of the gate shown in FIGS. 12E & 12F, but designed for nano-scale fabrication by molecular assembly. These gates can be fabricated from CNTs, engaging tubes formed from CNTs anchored to diamondoid blocks.

FIG. 14 illustrates a transmission gate similar to those of FIGS. 12E, 12F, 13A, & 13B, but where the output engages a shaped plate at a different distance than does a driven element, resulting in a mechanical gain when the shaped plate is in its active position.

FIGS. 15A-15D illustrate mechanisms with shaped plates attached to the driven elements and outputs, and where a connector that engages the plates is positioned by one or more inputs; the shapes of the plates determine whether or not motion is transmitted for a particular position of the connector.

FIGS. 16A-C illustrate a logic mechanism suitable for nano-scale fabrication, where van der Waals attraction serves as a non-contact force blocking translation of a central element if either of the inputs is angularly displaced. FIGS. 16D-F illustrate a larger scale analogous logic mechanism, where magnets provide the non-contact force.

DETAILED DESCRIPTION

Figure 1A:
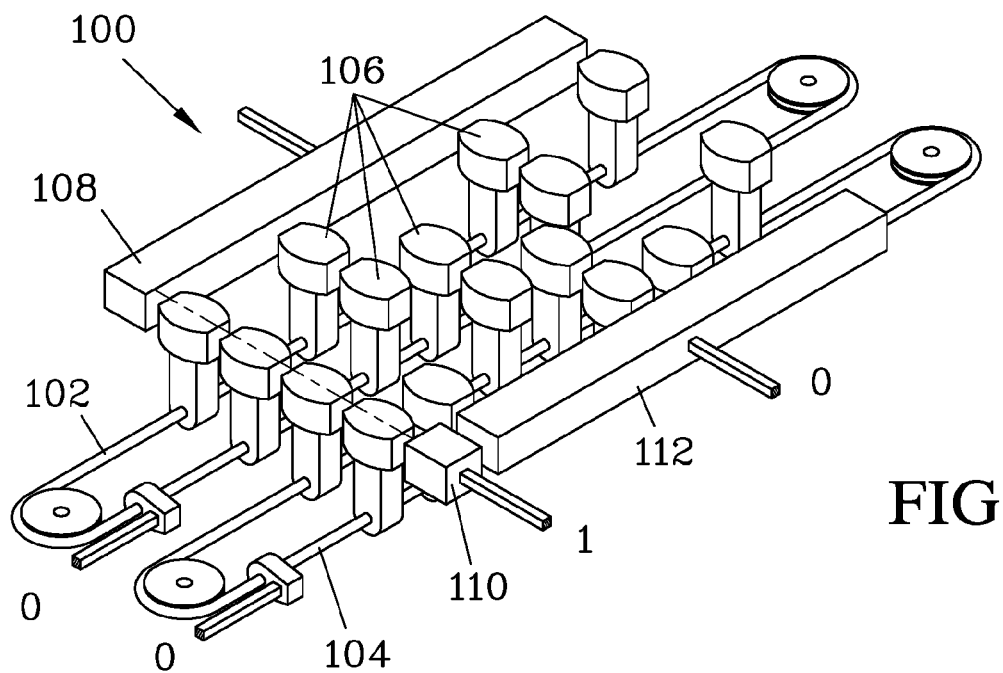
FIGS. 1A-1E illustrate one example of a logic mechanism where motion-transmitting elements (knobs) are aligned by inputs to transmit movement either to a 0-value output or to a 1-value output. In the example shown, the knobs are configured to provide a NOR logic operation on the positions of the inputs.

The drawings and accompanying descriptions illustrate several examples of logic mechanisms that can be built, many of which offer simplified structures, fewer parts, and/or smaller size compared to structures taught in U.S. Pat. No. 10,481,866 and related patents/applications for providing equivalent functions. While particular examples are illustrated, alternative arrangements that employ the same strategies could be designed using variations on the specific examples. It should be noted that in many cases, for reasons of clarity, additional conventional elements employed in mechanical computing devices are not shown, such elements including (but not limited to) anchoring structures, guiding structures, structures for setting inputs at desired values, clock signal generators (which may comprise, e.g., motors, gears, cams, cam followers, and related linkages and other parts), structures for distributing and/or redirecting clock signals (e.g., the physical equivalent of what would be called a bus bar in electronics), elements for distributing and/or redirecting motion from outputs, buffers for temporarily holding one or more bits of information, etc. While many of the examples shown are for structures scaled to be fabricated by conventional manufacturing techniques (including micro- and nano-scale lithography), equivalent molecular-scale and atomically-precise structures could be formed having an analogous arrangement of parts. The present application incorporates by reference the disclosure of Applicant's previously filed U.S. Provisional applications 63/083,265 and 63/083,276 as well as concurrently filed applications entitled Efficient and Manufacturable Mechanical Computing and Managing Non-Contact Forces in Mechanisms, in those jurisdictions where such incorporation by reference is appropriate.

Several examples of logic mechanisms that incorporate different schemes for defining positions of one or more mechanical outputs based on position(s) of one or more mechanical inputs are illustrated and described. In general, each input and each output is a movable element that defines or encodes a value by its position. In a typical scheme, displacement from a neutral position indicates a value of 1, while lack of such displacement indicates a value of 0. In some cases, a set of complimentary elements may be employed, with one of the elements moving to indicate a value, such as for an output value. In a binary example, one output moves to indicate a 1-value output, while another output moves to indicate a 0-value output. These output options may be matched to corresponding input options of other mechanisms; mechanisms can be set up to use a single input or dual inputs (also called "single rail" and "dual rail"). Dual rail input is where each possible input and input value has its own line. For example, if there are two inputs, A and B, and each can have a value of 0 or 1, then there are four input lines: A=0, A=1, B=0, and B=1. For any computations, one input line for each input is set to a position that logically means "true." For example, if (A, B)=(1, 0) then the A=1 line is set, and the B=0 line is set. This differs from a scheme where 1 line represents A, and 1 line represents B, and different positions of the line determine whether the values are, e.g., 0 or 1. Single input reduces the number of input lines, but dual input can have advantages in simplifying or otherwise improving mechanisms. Any logic can be performed either way.

For a particular use, it may be beneficial to combine features of particular examples to provide logic mechanisms optimized for a particular situation and/or use. In some mechanisms, positioning the input(s) defines the position(s) of the output(s) responsive to displacement of a driven element such as a mechanical clock signal. Such a driven element could be considered as an input, but one that is displaced sequentially to positioning one or more data inputs. Examples of mechanisms suitable for providing clock signals for mechanical computing devices are taught in U.S. Pat. No. 10,683,924 and PCT/US2020/031645, incorporated herein by reference in those jurisdictions where such incorporation is appropriate.

In some logic mechanisms taught herein, the mechanism is designed such that a mechanical output value is dependent on whether elements are or are not aligned, such alignment or misalignment being based on the positions of one or more mechanical input values, and such alignment or misalignment functioning to determine whether or not there is a path to convey movement from a driven element (which, as used herein, may be a "clock signal", or "input") to a particular output. Mechanical inputs may be positioned to place elements into alignment to form a path to transmit movement, and/or may act to displace elements from alignment to avoid creating such a path. In some cases, inputs may position one or more guides that direct motion, and/or configure a constraint structure that limits available motion. Mechanical inputs may also serve to directly deflect or align a driven element to cause it to not engage or engage a particular output when the driven element is displaced (such as by a mechanical clock signal). In some mechanisms, alignment or misalignment to define a path to transmit motion to an output could be characterized as the input(s) defining the constraint placed on available free motion of the driven element, determining whether or not movement of the driven element can or cannot be accommodated without it applying force to move an output.

In some logic mechanisms, elements are arranged to represent each possible input state, and aligned to provide a desired output value as desired for that input state. In some logic mechanisms, inputs act in parallel to determine whether an aligned path of movement transmission exists or doesn't exist, while in some mechanisms, inputs act in sequence. In addition to the inputs themselves, elements that are positioned by one or more inputs and determine whether or not a path to convey movement exists may be employed, and may be considered to be "control elements", "motion-transmitting elements", "motion-control elements", and/or "guides", depending on the particular configuration of the mechanism.

Various mechanisms taught herein provide the "universal" logic functions of NOR or NAND gates, which can be configured and/or combined to provide any other Boolean logic function. With an appropriate clocking scheme, NOR or NAND gates can be connected to form a flip-flop to provide memory; more sophisticated mechanisms for providing arithmetic logic operations and/or memory based on simple logic gates could be formed in a manner parallel to that in which such higher-level mechanisms have been constructed using analogous electronic logic gates and combinations thereof into, e.g., shift registers, adders, and even higher-level mechanisms, up to complete computing systems. Other devices using the same paradigms could be designed, such as half-adders, full adders, ripple-carry adders, etc. While higher level mechanisms could be formed from universal gates in a manner analogous to constructing higher-level structures from electronic logic gates, such mechanisms could also be made more directly using the paradigms taught herein for obtaining one or more output values based on one or more input values.

Due to the relatively simple structure of the mechanisms discussed herein, they are suitable for fabrication on a micro-scale, using conventional MEMS fabrication technology, or on a nano-scale, using techniques such as nano-lithography or molecular assembly by mechanosynthesis. The resulting mechanisms, when fabricated on a microscale, should be able to fit within the volume of a cube measuring 100 µm on a side, and such devices are expected to require an actuation force of no greater than 1 µN. Smaller size mechanisms could be fabricated to fit within the volume of a 10 µm or 1 µm cube, with correspondingly lower activation forces, such as 100 nN or 10 nN. Even smaller devices could be made by nano-scale fabrication techniques, and could fit within the volume of a cube 100 nm one a side, and or even small enough to fit inside a 50 nm cube, a 25 nm cube, or a 10 nm cube. For many of the mechanisms discussed herein, components such as the recited first and second parts, inputs, and outputs can comprise carbon nanotubes or structures of diamond, lonsdaleite, or diamondoid materials. For nano-scale mechanisms, actuation forces could be 1 nN or less, and molecular dynamics simulations indicate that some mechanisms such as logic gates employing non-contact forces (NCFs) to coordinate movement of the component should function with actuation forces below 100 pN, or even less than 10 pN.

For nano-scale mechanisms, many of the elements could be formed from materials such as carbon nanotubes (CNTs), diamond, Lonsdaleite, and/or diamondoid for rigid structures. CNTs can be curved and branched to a desired configuration formed by substituting pentagons and heptagons into the otherwise hexagonal structure of carbon atoms. Flexible elements could be made from materials such as graphene sheets, ribbons, or similar graphene forms, polyyne, polytetrafluorethylene, a hydrocarbon or substituted variant thereof, or any other structure providing the desired characteristics of appropriate diameter, longitudinal stiffness, and lateral flexibility desired for a particular use. Hydrocarbon hinges, single bond (e.g., acetylenic) rotary joints, or nested CNTs could be used to provide pivoting joints between connected elements. Such examples should not be considered as limiting the materials that could be employed.

Figure 1B:
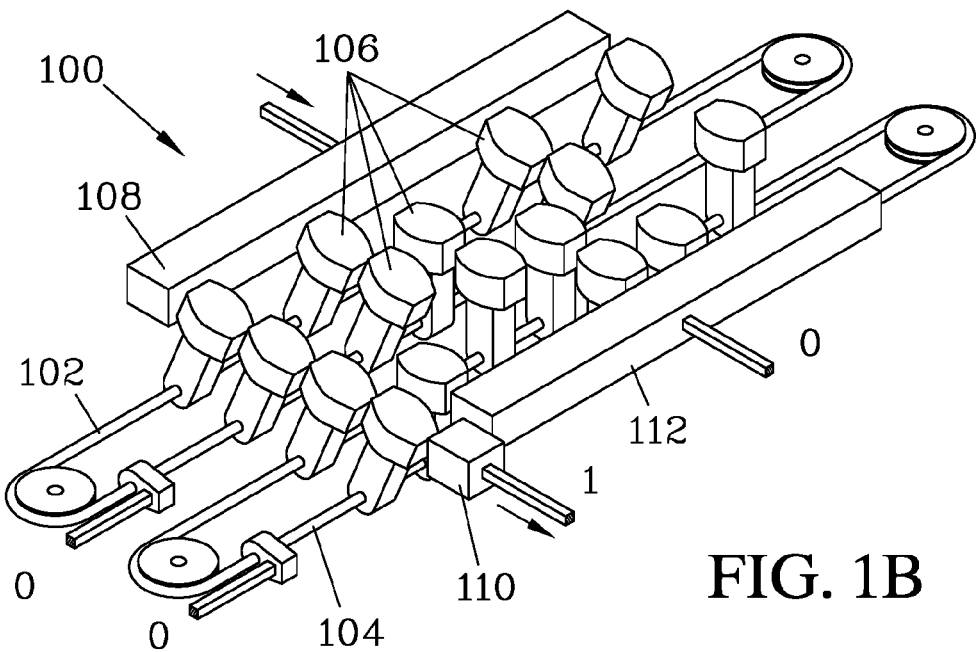
Figure 1C:
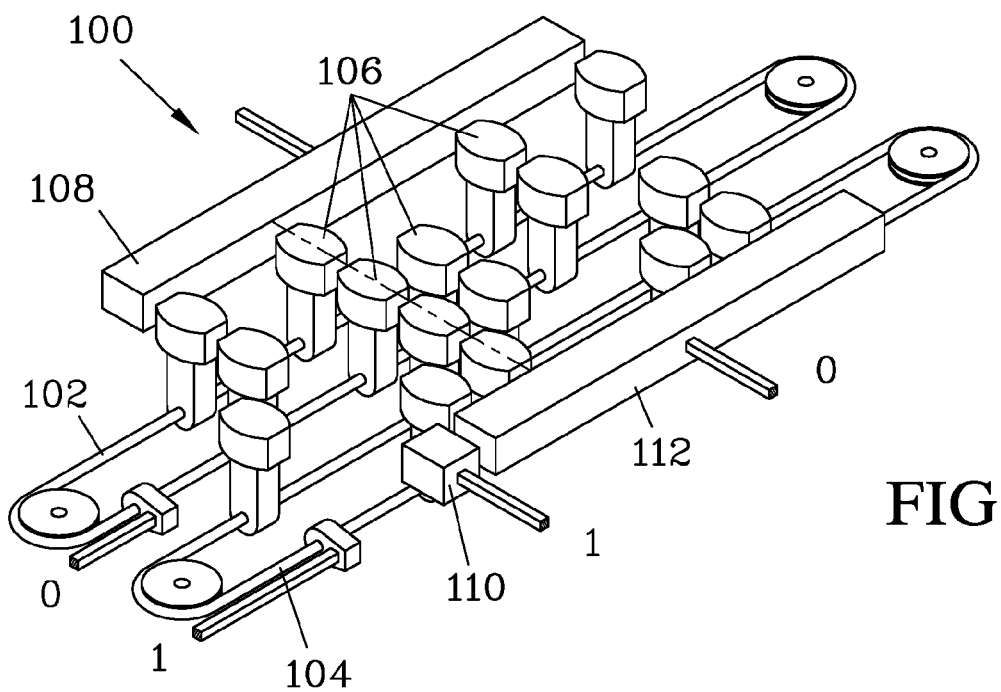
Figure 1D:
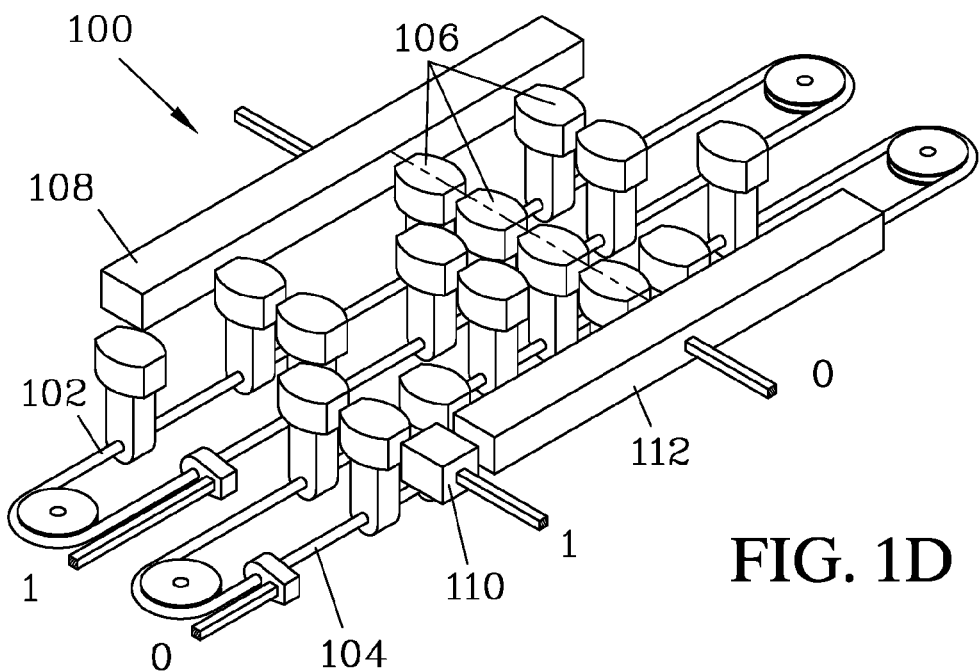
Figure 1E:
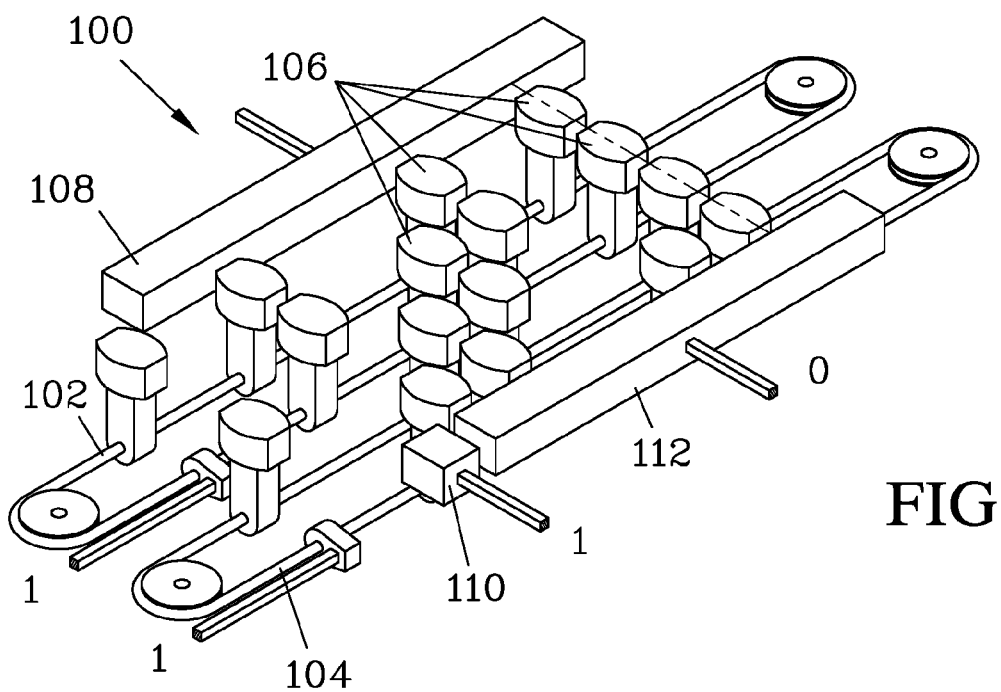

FIGS. 1A-1E illustrate the operation of a logic mechanism 100 that is configured to provide the function of a binary Boolean logic gate; in the example shown, the mechanism 100 provides the function of a 2-input NOR gate. Depending on the positions of input cables 102 and 104, several knobs 106 (which serve as motion-transmitting elements) mounted on the cables (102, 104) are positioned in alignment to either create a path for conveying displacement from a driven element 108 to a 1-value output 110 (as shown in FIGS. 1A-B) or to a 0-value output 112 (as shown in FIGS. 1C-IE). The knobs 106 can be movably and/or flexibly mounted to the cables (102, 104) to allow them to be pushed by the driven element 108 or by an adjacent knob 106, and/or the cables (102, 104) themselves can have sufficient movement or flexibility to allow the knobs 106 to be pushed. FIGS. 1A and 1B show the arrangement of the knobs 106 when both cables (102, 104) are positioned to represent input values (0, 0); FIG. 1A shows the mechanism 100 before the driven element 108 is moved, and FIG. 1B shows the mechanism 100 after the driven element 108 has been moved. When the cables (102, 104) are both in their positions to represent inputs of (0, 0), a row of the knobs 106 are aligned (as indicated by the dashed line) to transmit movement from the driven element 108 to the 1-value output 110. No path is available to transmit movement to the 0-value output 112, because any such path has at least one gap in it that terminates the transmission of movement. In contrast, FIGS. 1C-1E show the cables (102, 104) positioned to respectively represent input values of (0, 1), (1, 0), and (1, 1). In each of these cases, there is a row of the knobs 106 that are aligned to form a path to transmit movement from the driven element 108 to the 0-value output 112, but no complete path for transfer of movement to the 1-value output 110. Thus, the truth table for the gate 100 is that of a NOR gate:

| A<br>102 | B<br>104 | Output<br>110 or 112 |
|---|---|---|
| 0 | 0 | 1 |
| 0 | 1 | 0 |
| 1 | 0 | 0 |
| 1 | 1 | 0 |

Since a NOR gate is a "universal" logic gate, any other type of 2-input Boolean logic gate could be formed from only NOR gates. However, the flexible design of the gate 100 allows other types of logic gates to be constructed simply by changing the positions of the knobs on the cables to obtain the desired truth table of outputs. For example, FIG. 2 illustrates a NAND gate (another "universal" logic gate) formed according to a similar scheme.

Figure 1F:
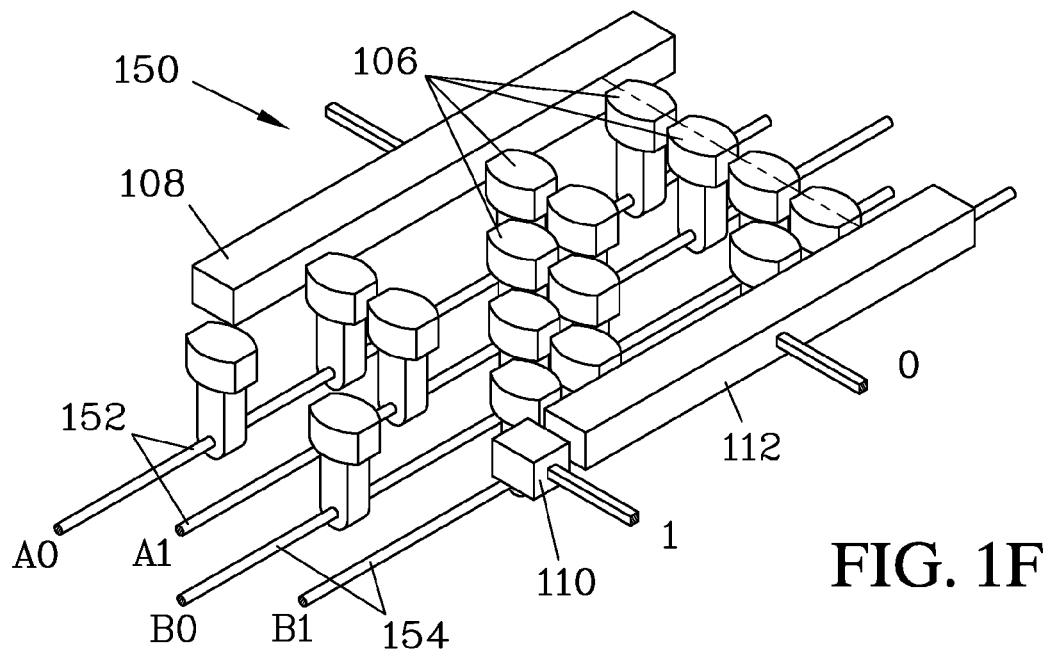
FIG. 1F illustrates a logic mechanism which functions similarly to that shown in FIGS. 1A-1E, but where the knobs are positioned by paired inputs.
Figure 3D:
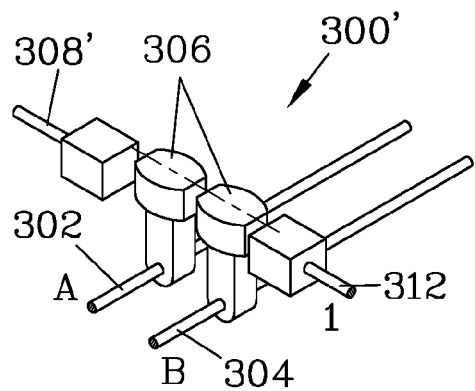

As illustrated in FIGS. 1A-IE, the mechanism 100 employs inputs (102, 104) where the values are encoded by a single input element, which is either not displaced (encoding a value of 0) or displaced (encoding a value of 1); however, these single inputs (102, 104) are connected to dual rows of reciprocating knobs 106, since the inputs (102, 104) incorporate looped cables (an example of single inputs that move single rows of knobs is shown in FIGS. 3A-3C, discussed below). In some cases, it is desirable to employ dual inputs where one of multiple elements move to encode the value of each input. As one example, FIG. 1F shows a mechanism 150 that is similar to the mechanism 100, but where paired input elements are employed. The mechanism 150 has a pair of A inputs 152 and a pair of B inputs 154, and in each pair there is one input (152, 154) that is displaced to encode a 0 (A0, B0) and another that is displaced to encode a 1 (A1, B1). The inputs (152, 154) are typically connected (by structure not illustrated) such that only one of each pair is displaced. For example, each pair of inputs (152, 154) could be provided by the outputs of another logic mechanism where either a 0-value output or a 1-value output is displaced by motion of a driven element. For ease of comparison to FIG. 1E, the mechanism 150 is shown when the input values are (1, 1).

FIG. 2 illustrates another example of a mechanism that provides a binary Boolean logic gate; gate mechanism 200 operates in a manner similar to the gate 150, but differs in that knobs 206 are arranged to provide a NAND truth table of transmitting movement from a driven element 208 to either a 0-value output 210 or to a 1-value output 212 based on the positions of two pairs of input rods (202, 204).

While paired input elements, and thus four rows of knobs are shown in the above examples to encode all possible states of the inputs, in many cases the structure can be simplified, while still obtaining the desired logic function. FIGS. 3A-3C illustrate a gate mechanism 300 that employs single inputs (302, 304), each of which controls the position of a single row of knobs 306, and each of which is either displaced, to encode an input value of 1, or undisplaced, to encode an input value of 0. Like the gate 100, the gate 300 provides a NOR function in determining whether to convey motion of a driven element 308 to a 0-value output 310 or to a 1-value output 312. FIGS. 3A-3C respectively show the input values (0, 0), (1, 0), and (0, 1), and thus are respectively comparable to the condition of the gate 100 as shown in FIGS. 1A, 1D, and 1C.

The logic mechanisms shown in FIGS. 1A-3C transmit motion to either a 0-value output or a 1-value output, being dual rail mechanisms (so far as output is concerned). Similar single rail logic mechanisms can be made that either transmit or do not transmit motion to a single output. FIG. 3D shows a logic mechanism 300' that provides the same NOR logic function as the gate 300, but which differs in having only the 1-value output 312, and having those knobs 306 which would have served to form paths to transmit force from the input 308' to the 0-value output omitted. The resulting mechanism 300' is simpler, but the lack of a 0-value output that is displaced limits the ability to provide a 0-value input displacement to subsequent logic mechanisms. This limitation can be addressed by inverting the output 312 to provide a 0-value input.

Figure 3E:
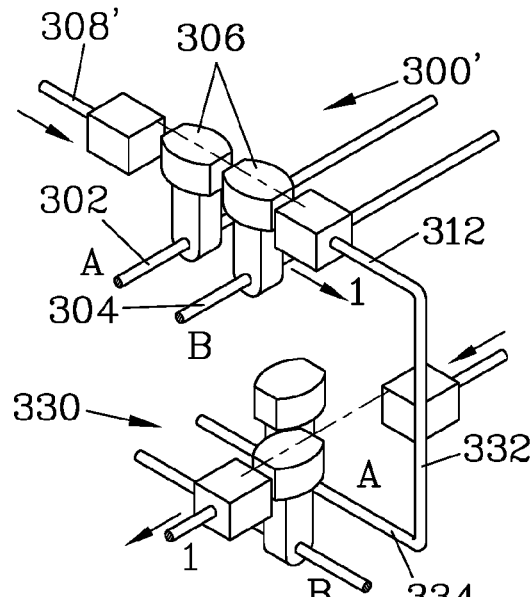
FIGS. 3E & 3F show a pair of mechanisms arranged such that a displacement output of 1 results in an input value of 0, providing an effective inversion of the output value.
Figure 3F:
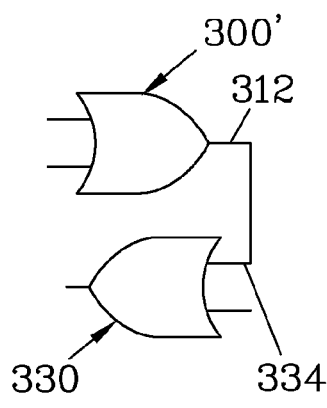

One approach to inverting the output is to arrange a subsequent mechanism 330 in a functionally reversed orientation, such that its displacements are oppositely directed compared to the mechanism 300'. FIG. 3E shows such an arrangement, with the output 312 connected through a sliding connector 332 (which may be limited to translational movement by additional guidance structure(s), not shown) to an A input 334 of the mechanism 330. The mechanism 300' is configured such that A input 302 is aligned with the driven element 308' and the output 312, representing a logic value of 0, when not displaced, and misaligned, representing a logic value of 1, when displaced. In contrast, the mechanism 330 is arranged such that its A input 334 is misaligned with a driven element 336 and an output 338, representing a logic value of 1, when not displaced, and is aligned, representing a logic value of 0, when displaced. Thus, displacement of the output 312 (to the right as viewed in FIG. 3E) results in a 0-value position of input 334, rather than a 1-value position. FIG. 3F is a schematic view showing the reverse orientation of the mechanisms (300', 330) to achieve the effect of an inverted output. Mechanism 330 is oriented in reverse to mechanism 300', such that an extended (1-value) position for output 312 is seen by mechanism 330 as a retracted (0-value) position of its input 334. Various mechanisms such as disclosed herein could be similarly arranged relative to other mechanisms to provide such an inversion effect.

Figure 3G:
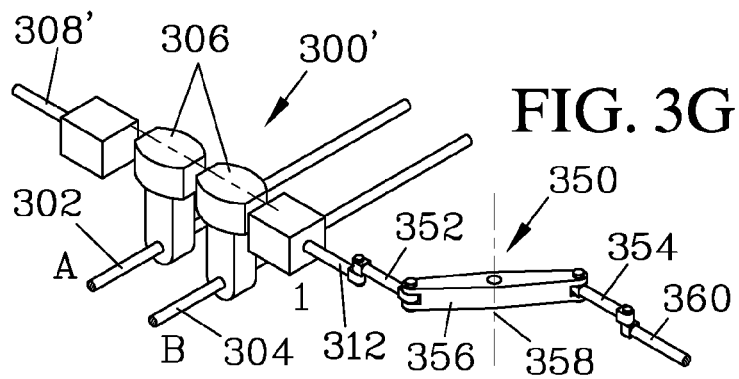
FIGS. 3G-3I illustrate examples of mechanical inverters that could be employed to reverse the displacement of an output.

Another approach to inverting an output value is to employ a mechanical inverter such as the beam inverter 350 shown in FIG. 3G. The inverter 350 has an inverter input 352 and an inverter output 354, both of which are pivotably engaged with a beam 356 that itself is mounted to pivot about a pivot axis 358. The inverter input 352 is pivotably connected to output 312 of mechanism 300', while the inverter output 354 is pivotably connected to an input 360 of another mechanism (the remainder of which is not shown). When the output 312 is displaced, it displaces the inverter input 352, forcing the beam 356 to pivot, and causing a reverse-direction motion of the inverter output 354, placing the input 360 in a retracted position; while such position is actually a displacement of the input 360, it corresponds to the convention of the mechanism 300' of a leftward (as shown) position being undisplaced, indicating a value of 0.

Figure 3H:
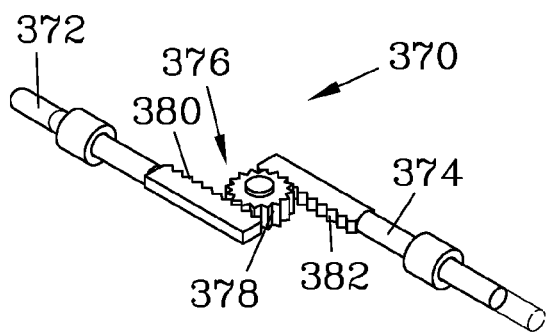
Figure 3I:
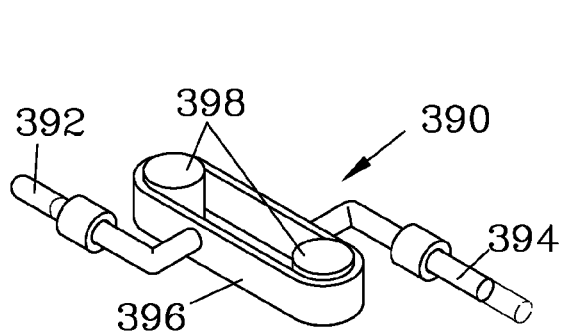

FIGS. 3H and 3I illustrate examples of alternative inverters that could be employed. FIG. 3H illustrates an inverter 370 having an inverter input 372 and an inverter output 374, which are moved reciprocally by a rack-and-pinon mechanism 376. The rack-and-pinion mechanism 376 has a pinion gear 378, which engages an input rack 380, attached to the inverter input 372, and an output rack 382, attached to the inverter output 374. FIG. 3I illustrates an inverter 390 having an inverter input 392 and an inverter output 394 that are moved reciprocally by a belt 396 that passes over a pair of rollers 398, and to which the inverter input 392 and the inverter output 394 are attached on opposite sides.

Figure 4:
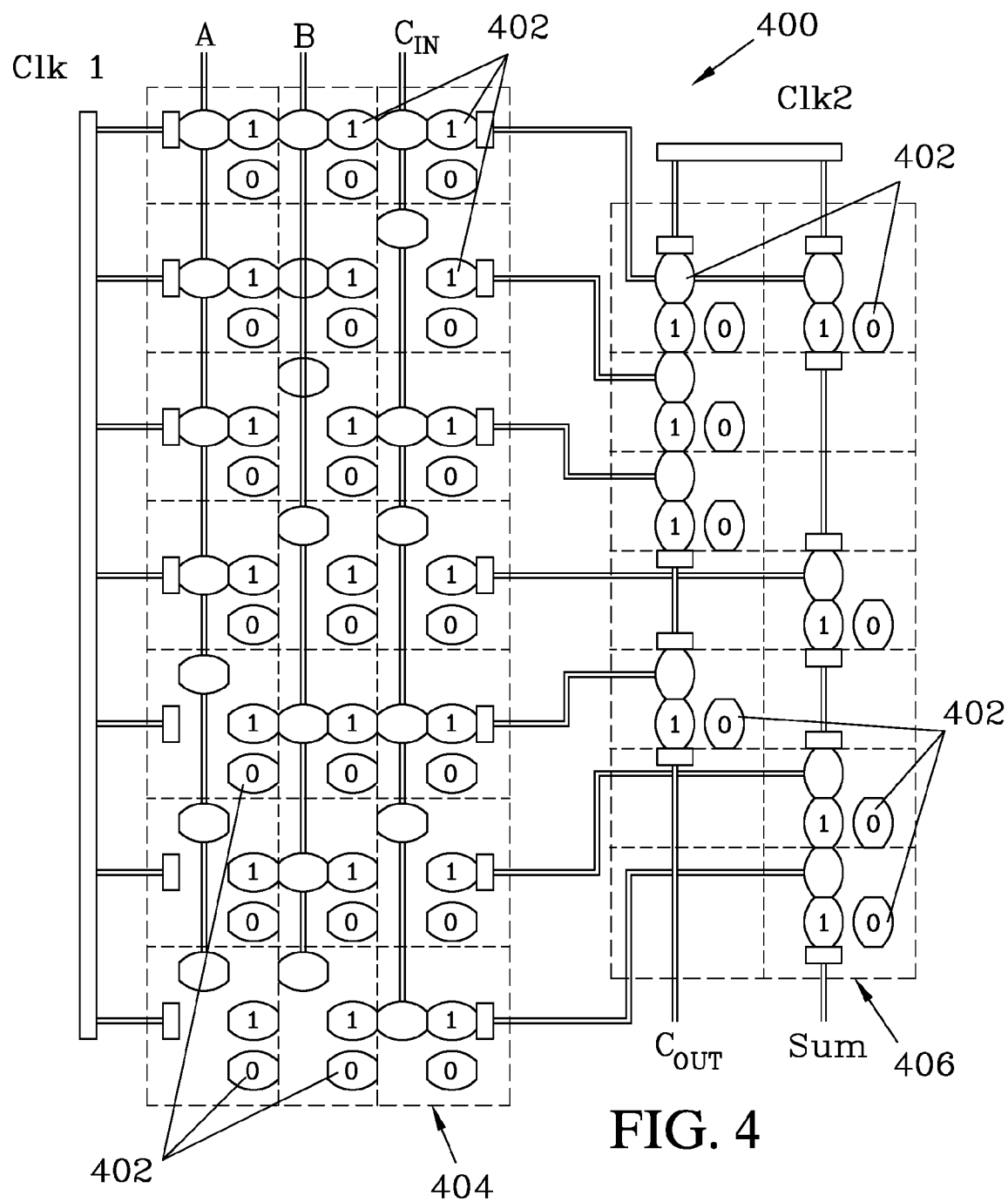
FIG. 4 illustrates one example of a higher level mechanism constructed from alignable elements such as shown in FIGS. 1A-3E, in this case a full adder that employs two arrays of mechanical gates.

FIG. 4 illustrates one example of how logic elements employing aligned or misaligned motion-transmitting elements such as shown in FIGS. 1A-3E and discussed above can be employed in a higher-level mechanism, in this example a mechanism 400 that provides the function of a full adder. The mechanism 400 has a number of gates 402 arranged in a first array 404 (operated by a first clock signal Clk 1) and a second array 406 (operated by a second clock signal Clk 2). For simplicity, the gates 402 shown are single-rail gates, which only provide a displacement output representing a value of 1 (functionally similar to the gate 300' shown in FIG. 3D, with 0-output knobs that do not push against any adjacent element included for purposes of illustration). Data inputs A, B, and $Carry_{IN}$ are each input into one of three series of gates 402 in the first array 404, each series having seven gates 402. The outputs of the last series of gates 402 are each provided as data inputs to one of seven series of gates 402 (each series here having two gates 402) in the second array 406. The series in the second array 406 provide two outputs, Sum and $Carry_{OUT}$.

In mechanisms such as shown in FIGS. 1A-4, the knobs and the elements that serve to position them responsive to the input(s) could be considered as "control elements" that determine the output value responsive to the inputs (which could include the driven element, if it is considered as an input).

Figure 5A:
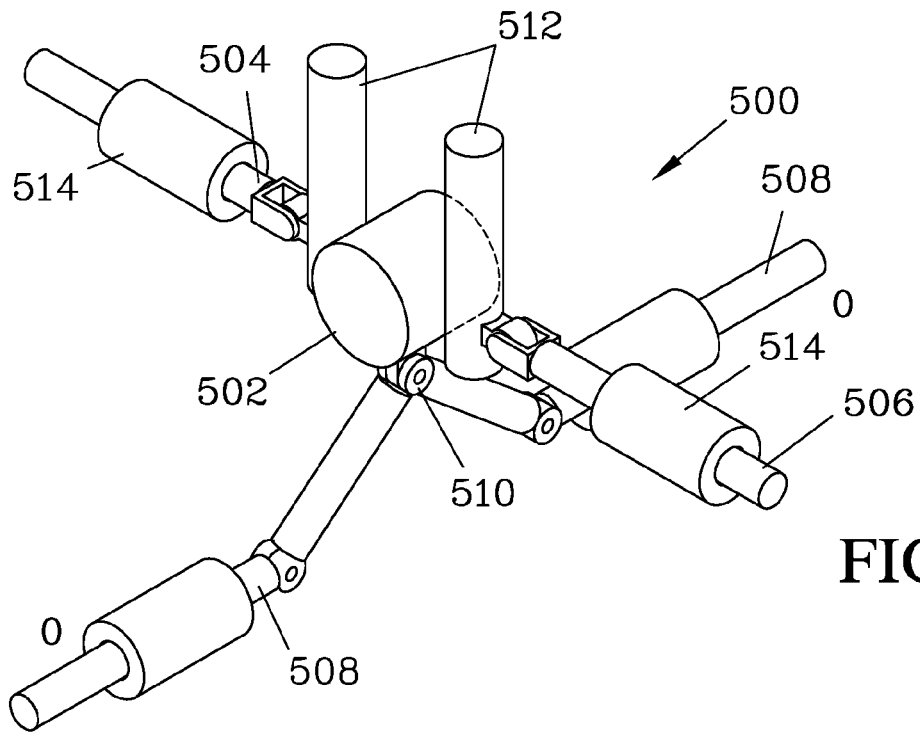
FIGS. 5A-5F illustrate a logic mechanism that provides a NOR function of two inputs employing a single motion-transmitting element, which is either aligned to transmit motion or not so aligned. In this mechanism, the inputs are opposed rather than parallel.
Figure 5B:
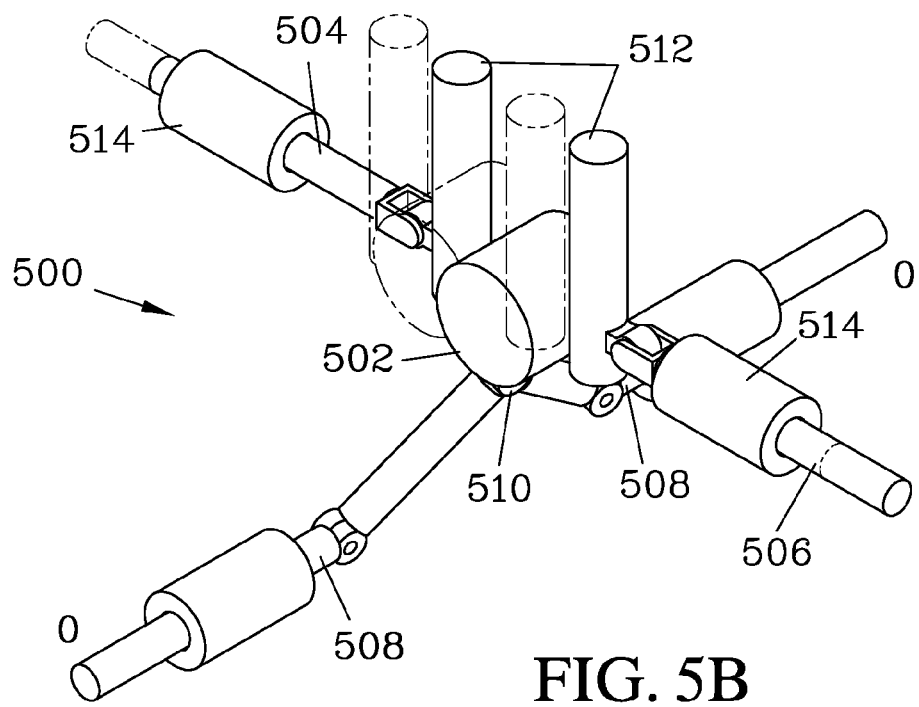
Figure 5C:
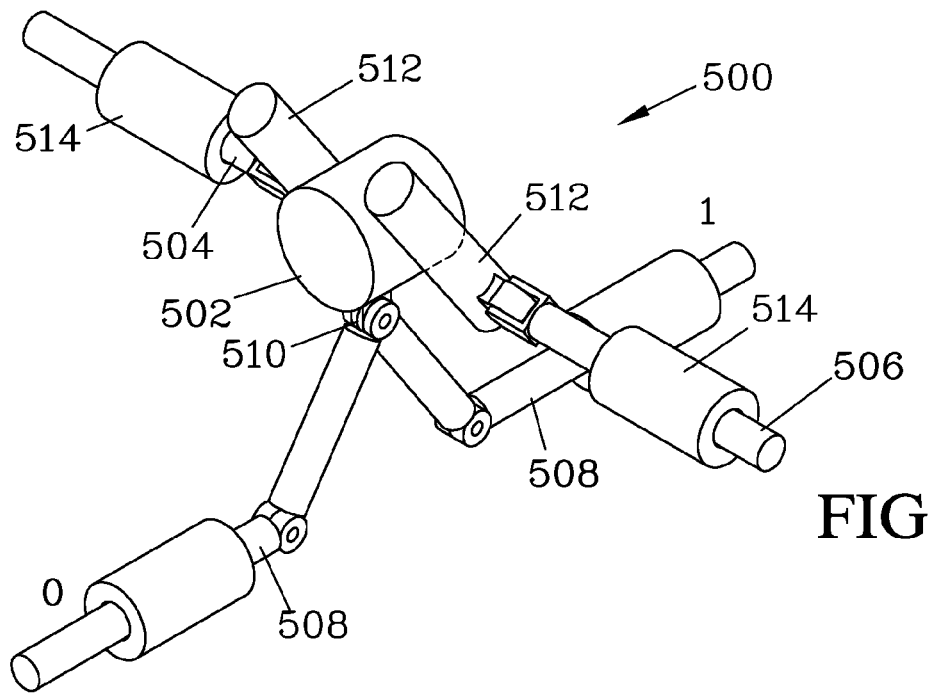
Figure 5D:
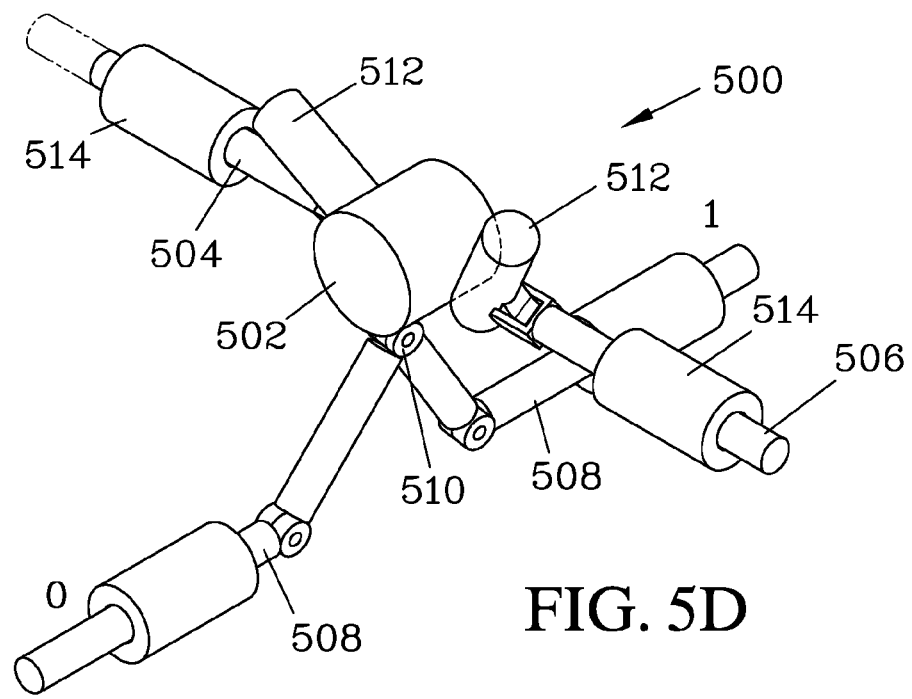
Figure 5E:
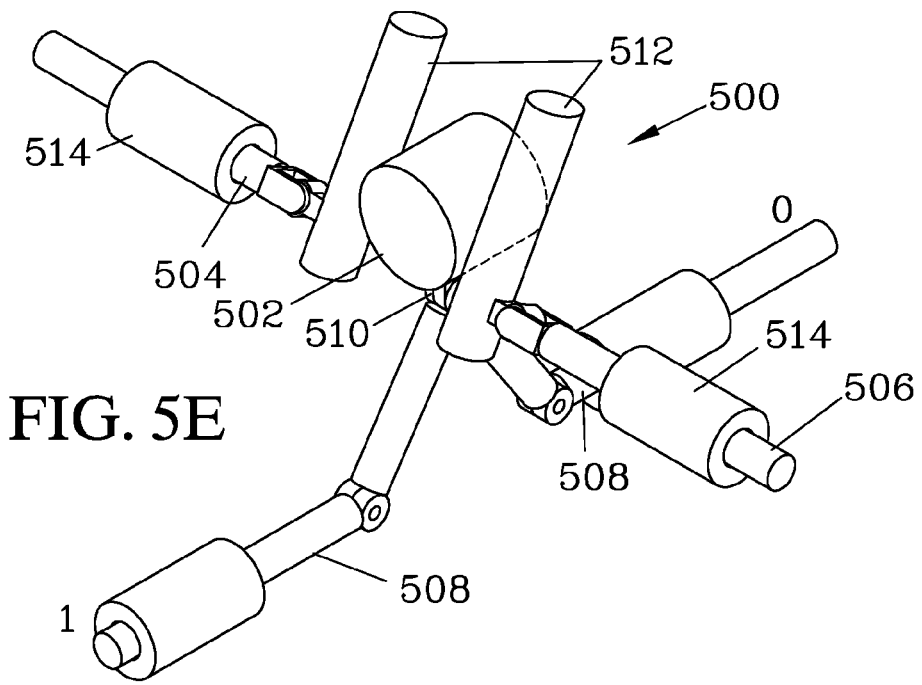
Figure 5F:
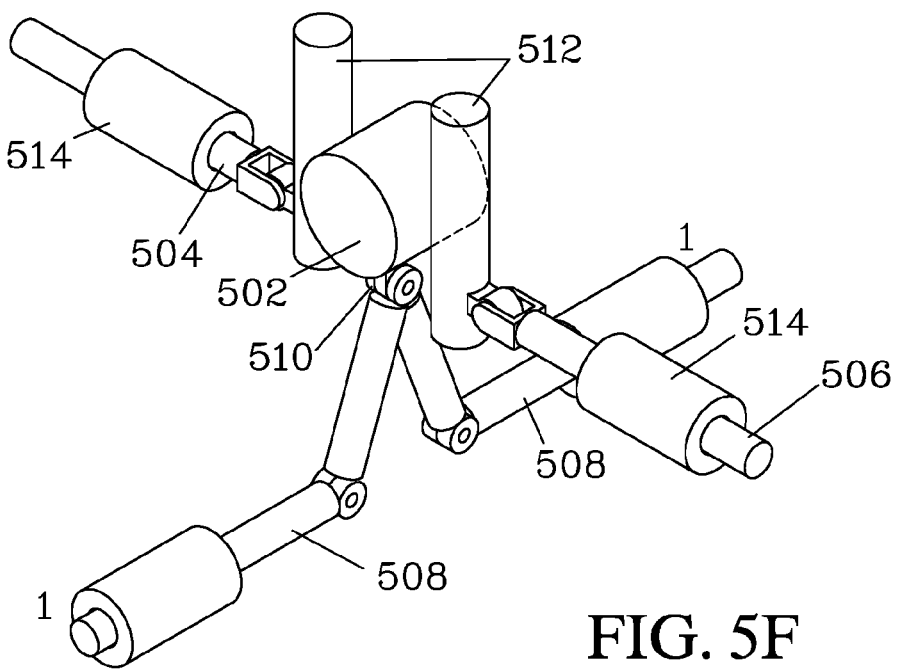

FIGS. 5A-5F illustrate a mechanism 500 that provides a NOR logic function, while avoiding the potential need to overcome VDW forces in order to either form or disrupt a path for transmitting movement responsive to input values. In the mechanism 500, the single motion-transmitting element 502 is either positioned in alignment to transmit motion from a driven element 504 to an output 506 (as shown in FIGS. 5A & 5B for input values (0, 0), FIGS. 5A & 5B respectively showing before and after moving the driven element 504), or is positioned out of alignment so as to not transmit motion (as shown in FIGS. 5C-5F, with FIG. 5D showing the mechanism 500 in one of such positions when the driven element 504 has been displaced). The position of the motion-transmitting element 502 in this example is dependent on two inputs 508, each of which acts to move one side of a hinge 510 to which the motion-transmitting element 502 is mounted. Thus, the hinge 510 can be considered a "control element" that is positioned by the combined positions of the inputs 508, and the motion-transmitting element 502 can be placed into any of three misaligned positions. To avoid changes in VDW forces as the motion-transmitting element 502 is moved into or out of its aligned, motion-transmitting position, the driven element 504 and the output 506 are provided with track elements 512 that can pivot to allow transmission of force when aligned with the driven element 504 and the output 506 (as shown in FIG. 5B, where the driven element 504 has been displaced, pushing the motion-transmitting element 502 and causing the hinge 510 to pivot). Rotation of the driven element 504 and the output 506 within guides 514 allows the track elements 512 to extend along the path that the motion-transmitting element 502 moves when one or both of the inputs 508 is displaced (such as the inclined positions shown in FIGS. 5C-5E), regardless of which input(s) 508 is moved. Since the track elements 512 extend along the path of motion of the motion-transmitting element 502, the VDW force between the motion-transmitting element 502 and the track elements 512 remains constant. Again, it should be apparent that for larger-scale implementations, where changes in VDW forces are small enough not to create sufficient resistance to movement to impact the function, the track elements 512 could be omitted, and the motion-transmitting element 502 would simply be aligned with the driven element 504 and output 506 to transmit movement therebetween, or could be positioned away from such alignment, by action of the inputs 508.

Figure 6A:
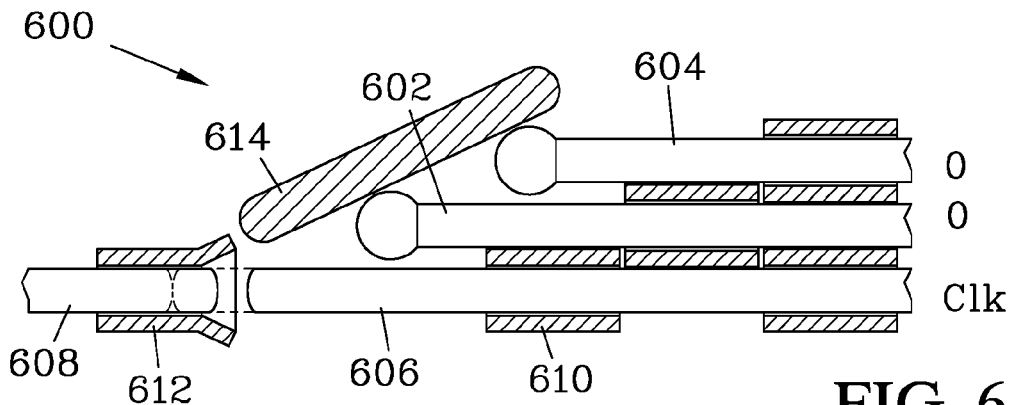
FIGS. 6A-6D illustrate a logic mechanism where extension of either one of two inputs, or extension of both, acts to misalign a driven element with an output. Therefore, if either input is extended (a logical "1"), different positions of the driven element result in the same output value (a logical "0"), providing a NOR logic function.
Figure 6B:
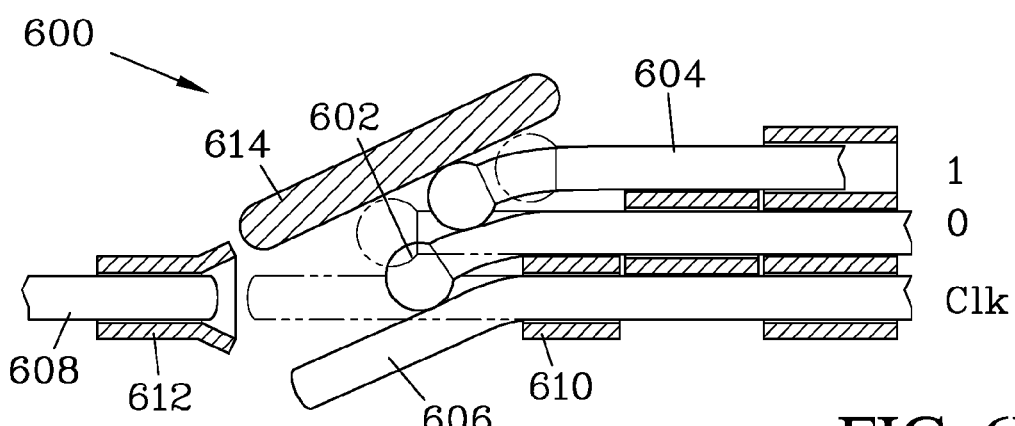
Figure 6C:
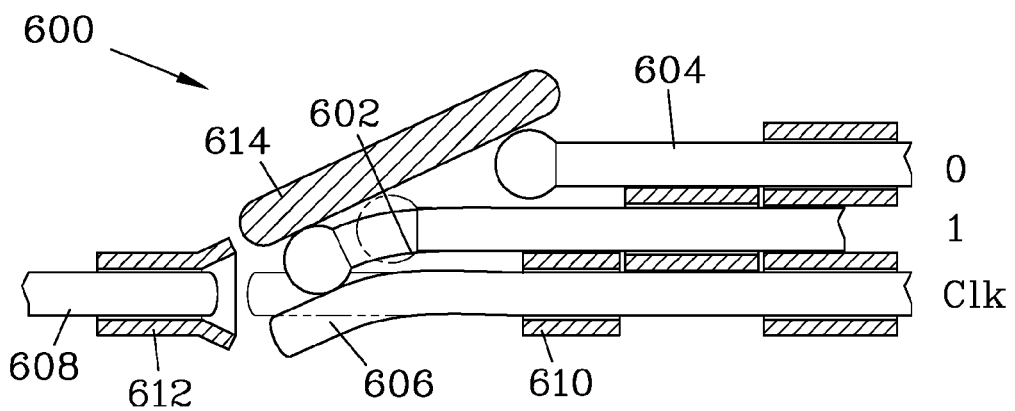
Figure 6D:
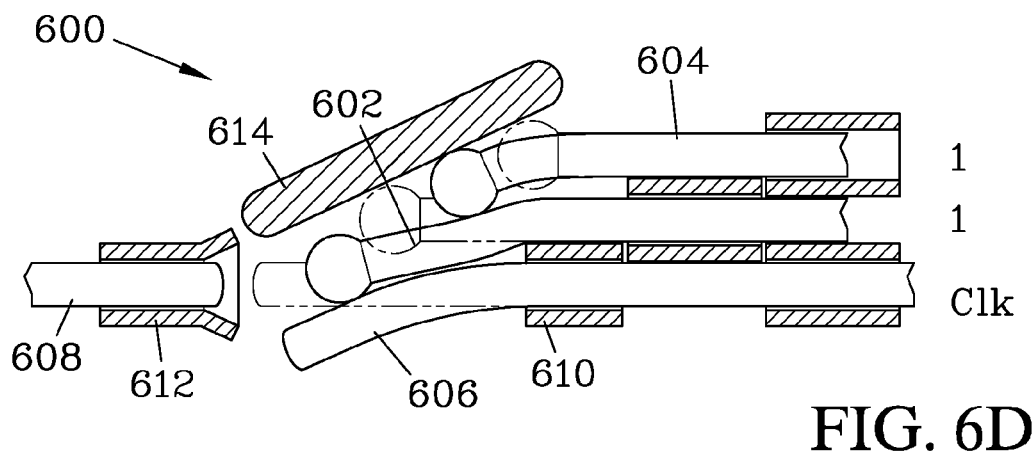

In some mechanisms, a driven element is aligned with an output by default, and when displaced, acts to displace the output unless one or both of these elements is deflected from the default alignment. In such cases, one or more inputs can determine whether or not an element is deflected. Inputs can push directly on one of the elements, or can move a guide through which an element passes. In some cases, one or more inputs can serve to position a motion-transmitting element that is interposable between the driven element and the output. FIGS. 6A-6D illustrate a mechanism that provides a NOR gate 600, having inputs 602 and 604, a driven element 606, and an output 608. In the gate 600, the driven element 606 is resiliently flexible, and slides within a clock guide 610 that is aligned with an output guide 612 in which the output 608 slides (which may be flared, as shown, to facilitate alignment). If not deflected, the driven element 606 engages and pushes on the output 608 when the driven element 606 is moved (such as by a mechanical clock signal), thereby pushing the output 608 to a displaced position (1-value in this example), as shown in FIG. 6A. However, as shown in FIGS. 6B-6D, if either of the inputs (602, 604) is extended (its 1-value position in this example), such input (602, 604) is forced off-axis by a ramp 614 and deflects the driven element 606 out of alignment (either directly, in the case of input 602, or via the other input 602, in the case of input 604). It is noteworthy that the driven element 606 can be displaced to various positions, some where it just misses entering the output guide 612, or further deflected positions, depending on the different input values and the configurations of the inputs (602, 604) and the ramp 614 relative to the driven element 606. As long as driven element 606 is deflected far enough to avoid entering the output guide 612, the exact positions of inputs 602 and 604 and driven element 606 do not affect the position of output 608. The NOR gate 600 has only four moving parts, including the output 608. In a nanoscale mechanism, the guides (610, 612) and ramp 614 could be provided by diamondoid material or modified carbon nanotubes (CNTs), while the movable elements (602, 604, 606, 608) could be provided by resiliently flexible molecules such as polyyne, polytetrafluorethylene, a hydrocarbon or substituted variant thereof, a graphene-based structure, or any other structure of appropriate diameter, longitudinal stiffness, and lateral flexibility, possibly having low drag with respect to movement within guides.

Figures 7A, 7B:
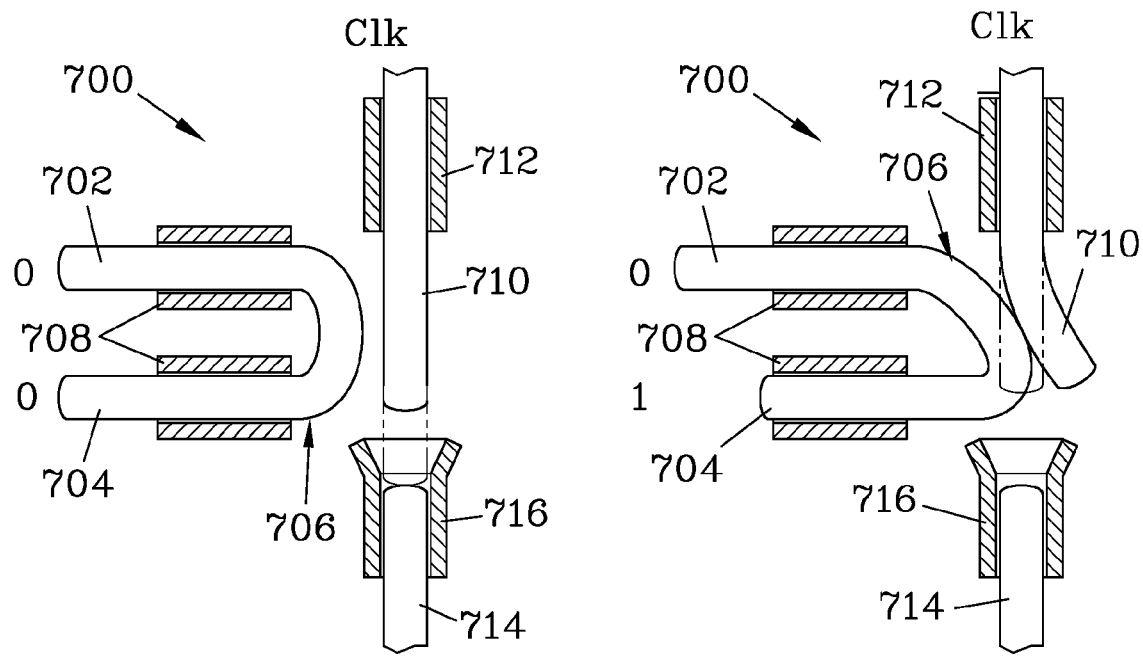
FIGS. 7A-7D illustrate another example of a logic mechanism where extension of either one of two inputs, or extension of both, acts to misalign a driven element with an output. In this mechanism, the inputs are provided on a common element, reducing the number of parts.
Figure 7C:
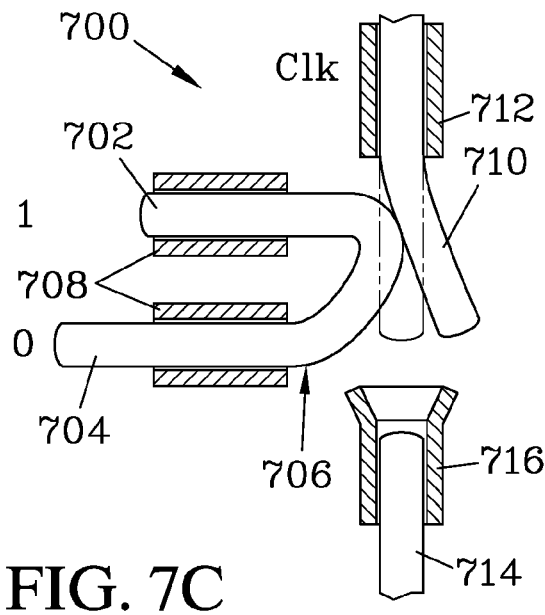
Figure 7D:
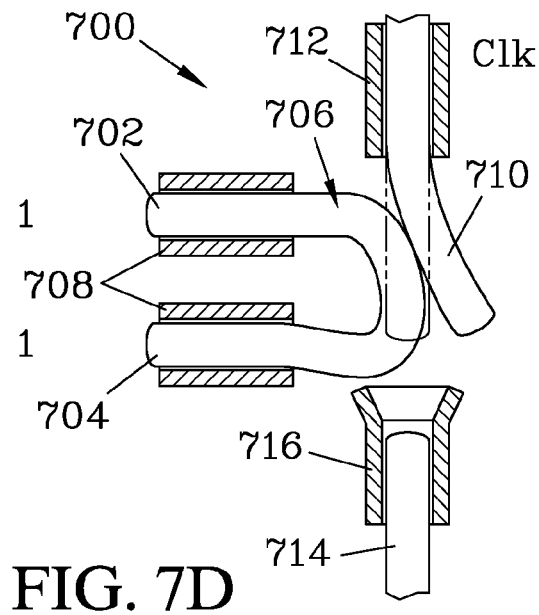
Figure 7E:
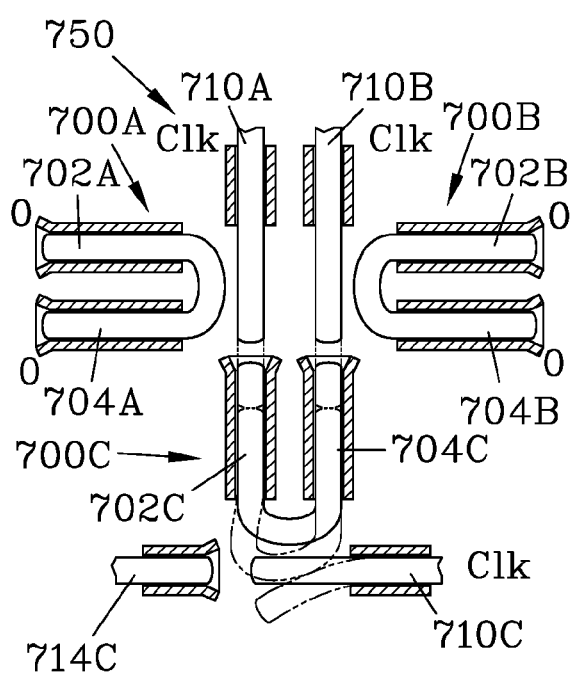
FIGS. 7E-7I illustrate two examples of logic mechanisms formed by combining sub-mechanisms similar to the mechanism shown in FIGS. 7A-7D.
Figure 7F:
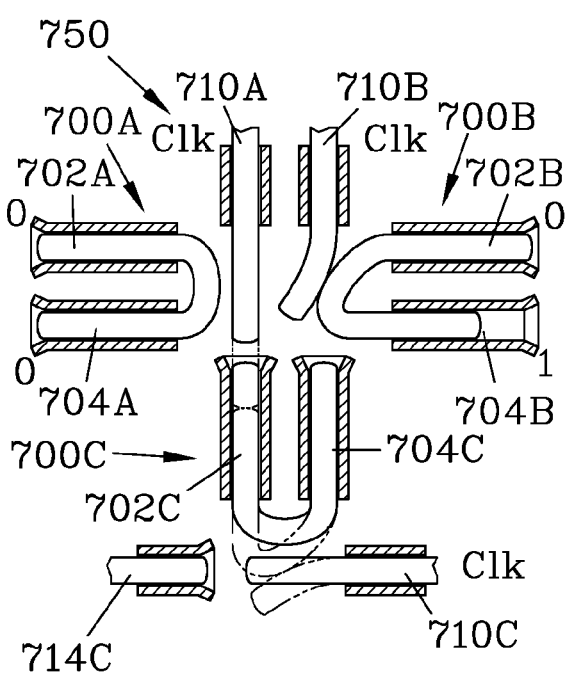
Figure 7G:
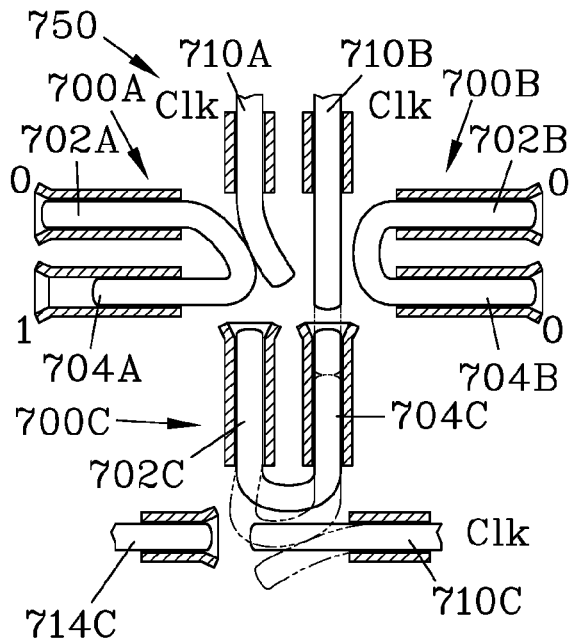

FIGS. 7A-7D illustrate another example that uses deflection, a NOR gate 700. The gate 700 employs only three moving parts, as inputs 702 and 704 are both provided on a flexible U-shaped element 706, which slides within fixed guides 708 that position it to engage and deflect a driven element 710 if either or both of the inputs (702, 704) is extended. The driven element 710 slides within a fixed guide 712. If not deflected (in the example illustrated, this is the case for the input positions (0, 0), as shown in FIG. 7A), the driven element 710 is aligned to engage an output 714 sliding within a fixed guide 716 when the driven element 710 is extended. As with the gate 600, multiple positions of the driven element 710 result in the same resulting position of the output 714, as shown in FIGS. 7B-7D, showing the deflection of the driven element 710 resulting from input positions (0, 1), (1, 0), and (1, 1).

Figure 7H:
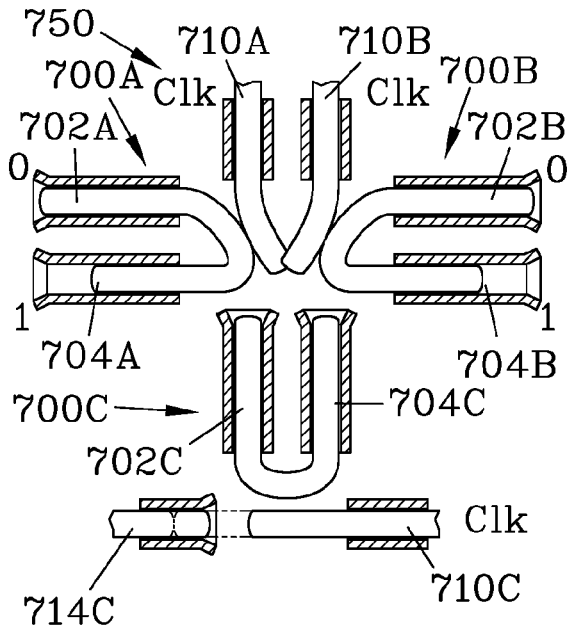

FIGS. 7E-H illustrate one example of how three gates 700A-C can be combined to form a different logic mechanism, in this example an AND logic mechanism 750, driven by driven elements 710A, 710B, and 710C. As arranged, the inputs 702C and 704C of the gate 700C are positioned to serve as the outputs of the gates 700A and 700B. If inputs 702A and 702B are held at their retracted (0-value) positions, then the inputs 704A and 704B respectively determine the positions of the inputs 702C and 704C, providing an AND function that could be inverted to provide a NAND function (some examples of mechanical inverters are shown in FIGS. 3F-3H, while FIG. 3E shows how an effective inversion can be attained by arranging successive gates). If neither or only one of the inputs (704A, 704B) is extended (i.e., for input values (0, 0), (0, 1), (1, 0) shown in FIGS. 7E-7G), such input(s) (704A, 704B) act to force the associated driven element (710A, 710B) out of alignment, and at least one of the driven elements (710A, 710B) pushes on the associated input (702C, 704C), thereby deflecting the driven element 710C from pushing the output 714C (as); the output 714C remains in place (here representing an output value of 0). It is only when both inputs (704A, 704B) are extended (input value (1, 1) as shown in FIG. 7H) that both of the driven elements (710A, 710B) are deflected, and thus neither is aligned to push on the associated input (702C, 704C); in this case, the driven element 710C is not deflected, and is aligned to push on the output 714C when displaced.

The following truth table shows the possible states when the inputs 702A and 702B are held undisplaced, such that the resulting output 714C is defined by an AND logic function of the "free" inputs 704A and 704B.

| A inputs | A output | B inputs | B output | C input A (A output) | C input B (B output) | C output |
|---|---|---|---|---|---|---|
| 0, 0 | 1 | 0, 0 | 1 | 1 | 1 | 0 |
| 0, 0 | 1 | 0, 1 | 0 | 1 | 0 | 0 |
| 0, 1 | 0 | 0, 0 | 1 | 0 | 1 | 0 |
| 0, 1 | 0 | 0, 1 | 0 | 0 | 0 | 1 |

Figure 7I:
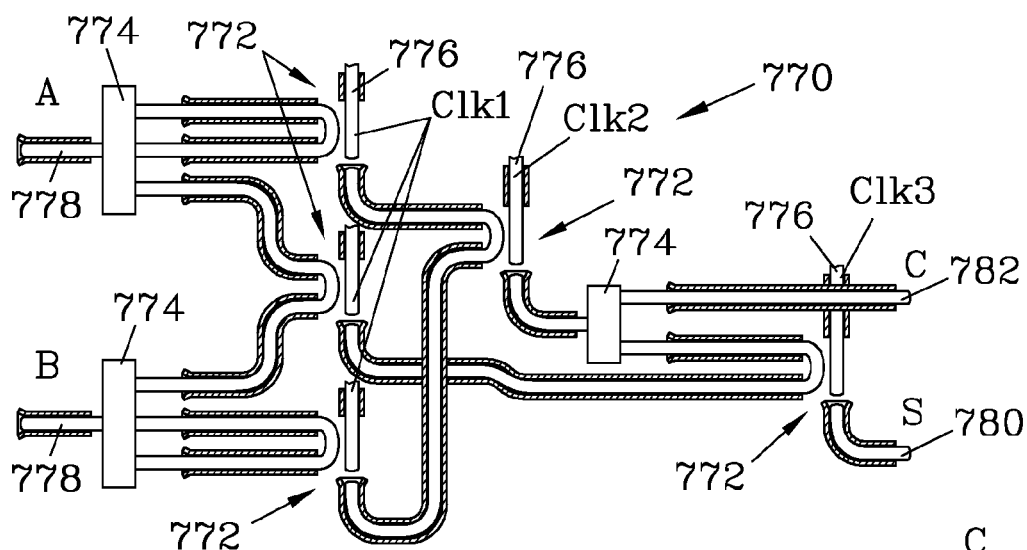
Figure 7J:
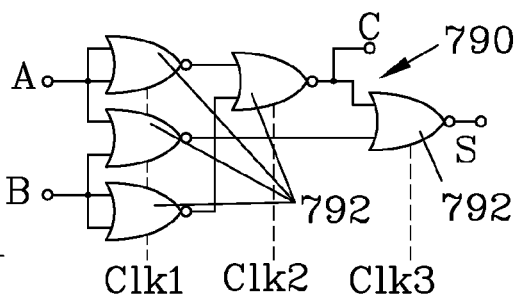
FIG. 7J shows a conventional logic diagram of an equivalent half-adder formed using four NOR gates for comparison.

FIG. 7I illustrates a half adder 770 that illustrates one example of how NOR gates similar to the NOR gates 700 discussed above can be combined into a higher-level mechanism. Five NOR gates 772 are connected together, in some case with signal splitters 774 that serve to provide multiple outputs from a single input. The gates 772 are operated by three sequential clock inputs 776. The values encoded by two data inputs 778 are sequentially processed to provide values at sum output 780 and a carry output 782. For comparison, FIG. 7J is a conventional logic circuit 790 of a half adder, which could be made with conventional NOR gates 792. The function of any circuit made using conventional NOR gates could be provided by using mechanical NOR gates similar to those discussed.

One issue that may arise when elements are forcibly deflected is that such action may apply force tending to move an input backwards. Similar "backwards" forces can result in mechanisms where one element blocks another, but the blocking action is directed on an incline rather than perpendicular, in which case there may be a tendency to create a ramp or camming effect, or in mechanisms where motion of a blocking element is limited by engagement with the element it blocks, rather than by a fixed structure. Such "backwards" forces can accumulate in systems where multiple logic mechanisms are employed, and thus it is frequently desirable to design mechanisms so as to avoid such forces and/or to block their propagation across multiple mechanisms. Positioning blocking elements such that their movement is perpendicular to the motion that they are blocking is one common approach to avoiding such forces.

Figure 8A:
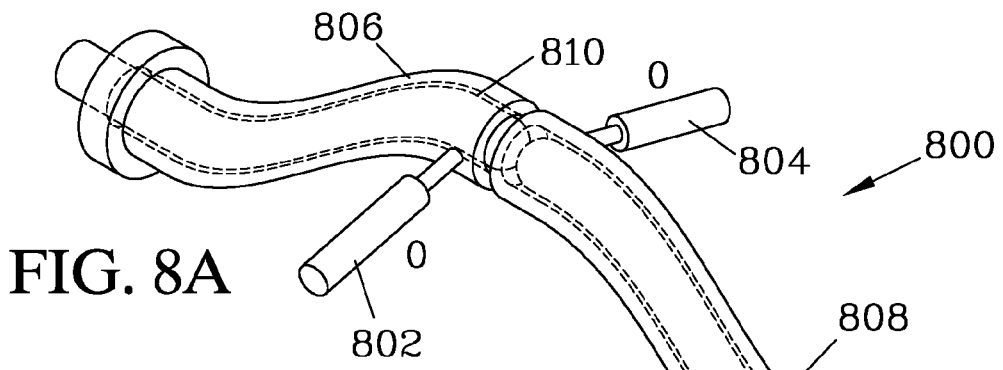
Figure 8B:
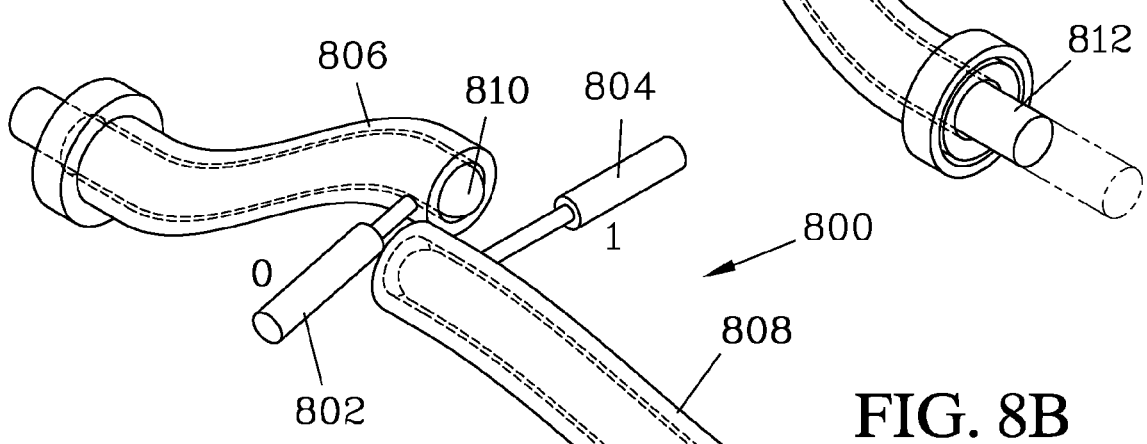

Instead of pushing directly on elements, as in the mechanisms 600, 700, 750, and 770, inputs can act to move guides through which elements pass, thus serving to direct such elements when they are displaced. FIGS. 8A and 8B illustrate a logic mechanism 800 where inputs 802 and 804 act to respectively move rotating guides 806 and 808 (alternatively, the guides could be resiliently movable). A flexible driven element 810 slides within guide 806, and a flexible output 812 slides within guide 808. In the scheme illustrated, the inputs (802, 804) are retracted to represent an input value of 0 and extended to represent an input value of 1; while schematically shown as extending cylinders, the inputs (802, 804) could be provided by the outputs of similar logic mechanisms. When both inputs (802, 804) are retracted, as shown in FIG. 8A, the guides (806, 808) are positioned in alignment, so that the driven element 810 engages and pushes the output 812 when displaced. Such extension of the output 812 can be considered to represent an output value of 1, while no movement can be considered to represent an output of 0. If either or both of the inputs (802, 804) is extended, representing an input value of 1, it pushes its associated guide (806, 808) out of alignment with the other, with the result that extension on the driven element 810 does not engage the output 812; FIG. 8B illustrates the case for input values (0, 1). With this configuration, inputs of 0, 0 provide an output of 1, while inputs of (0, 1), (1, 0), or (1, 1) result in an output value of 0, providing a NOR logic operation. Other logic operations could be provided by different numbers of and/or configurations of the inputs, guides, and/or outputs.

Figure 8C:
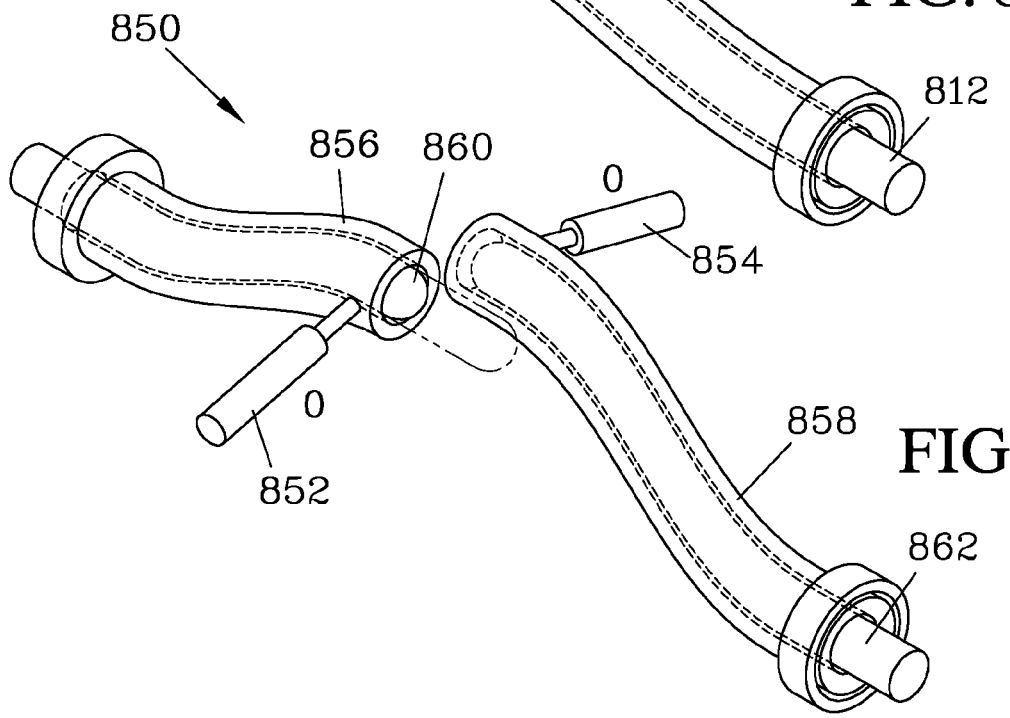

As one example, FIGS. 8C-F illustrate components identical to those employed in the mechanism 800, but arranged to form a mechanism 850 that provides an XOR logic function. Again, the gate 850 has two inputs (852 and 854), which act to position two guides 856 and 858. A driven element 860 slides withing the guide 856, and an output 862 slides within the guide 858. However, the inputs (852, 854) and the guides (856, 858) are arranged such that one must be displaced to align the guides (856, 858), rather than the guides being aligned when neither input is displaced, as in the mechanism 800. Thus, when both inputs (852, 854) are undisplaced, as shown in FIG. 8C for input values (0, 0), the guides (856, 858) are misaligned, and displacement of the driven element 860 is not conveyed to the output 862. If either one of the inputs (852, 854) is displaced while the other is not (input values (0, 1) as shown in FIG. 8D or input values (1, 0) as shown in FIG. 8E), then the guides (856, 858) are aligned, and the output 862 is displaced by the driven element 860. It is noteworthy that the aligned positions are different depending on which of the inputs (852, 854) is displaced, but the function and resulting position of the output 862 are the same. If both inputs (852, 854) are displaced, as shown in FIG. 8F for input values (1, 1), the guides (856, 858) are pushed past their aligned position relative to each other and are again misaligned. The resulting truth table is that of a XOR gate. Comparing the NOR gate 800 and the XOR gate 850 shows one example of how different logic functions can be obtained from similar structures by selecting the arrangements of the inputs and the elements that determine the resulting position of the output.

| A<br>852 | B<br>854 | Output<br>862 |
|---|---|---|
| 0 | 0 | 0 |
| 0 | 1 | 1 |
| 1 | 0 | 1 |
| 1 | 1 | 0 |

FIGS. 9A and 9B illustrate an example of a 3-input NOR gate 900, having inputs 902, 904, and 906. The gate 900 again relies on alignment or misalignment of elements to either transmit or not transmit motion (such as from a clock signal) from a driven element 908 to an output 910. In the arrangement illustrated, non-displacement of the inputs (902, 904, 906) and output 910 represents a 0 value and displacement represents a 1 value. Each of the inputs (902, 904, 906) is connected to an associated guide 912, 914, or 916. The driven element 908 is slidable within the guide 912 (attached to input 902) and a fixed guide 918. Two motion-transmitting elements (920, 922) are provided, each of which slides within an associated fixed guide (924, 926), and within one of the guides (914, 916) that are attached to the remaining inputs (904, 906). The output 910 slides within a fixed guide 928. In each case, when the respective input (902, 904, 906) is not displaced (its 0-value position), the guide (912, 914, 916) attached thereto is aligned with the adjacent fixed guide (924, 926, 928), and is misaligned when the input (902, 904, 906) is displaced. The guides (912, 914, 916) are only aligned to transmit motion from the driven element 908 to the output 910 (via the two motion-transmitting elements (920, 922)) when all three of the inputs (902, 904, 906) is in its 0-value position (as shown in FIG. 9A). If any one or more of the inputs (902, 904, 906) is extended into its 1-value position (as shown in FIG. 9B for input values 0, 1, 0), then the resulting misalignment breaks the path of aligned elements before the motion can be transmitted to the output 910. Thus, the value of the output 910 is a NOR logic function of the values of the three inputs (902, 904, 906).

| W<br>902 | X<br>904 | Y<br>906 | Z<br>910 |
|---|---|---|---|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

The driven element 908 and the motion-transmitting elements (920, 922) shown are sufficiently flexible as to remain slidable even when forced out of alignment, but stiff enough to transmit the displacement to the next element when aligned therewith; alternatively, hinged or otherwise misalignable elements could be substituted, and may be advantageous in some cases to reduce the force needed to deflect an element to its non-aligned state (or to its aligned state in the case where the element is misaligned by default). The attachment of the guides (912, 914, 916) to the inputs (902, 904, 906) can have sufficient flexibility (by a flexible joint, hinge, or similar structure) to allow the guide (912, 914, 916) to match its angle to that of the element (908, 920, or 922) sliding within when that element (908, 920, 922) is moved out of alignment, to reduce binding. If the guides (912, 914, 916) are counted as separate elements from the inputs (902, 904, 906), this 3-input NOR gate is composed of only ten moving parts, including the output 910. It should be noted that the gate 900 could be considered a variant of a deflection-based logic mechanism such as discussed above, but where the inputs act on guides rather than acting on the elements themselves (as is done in the gates 600 and 700), and with the addition of intermediate motion-transmitting elements interposed between the driven element and the output.

Figure 10A:
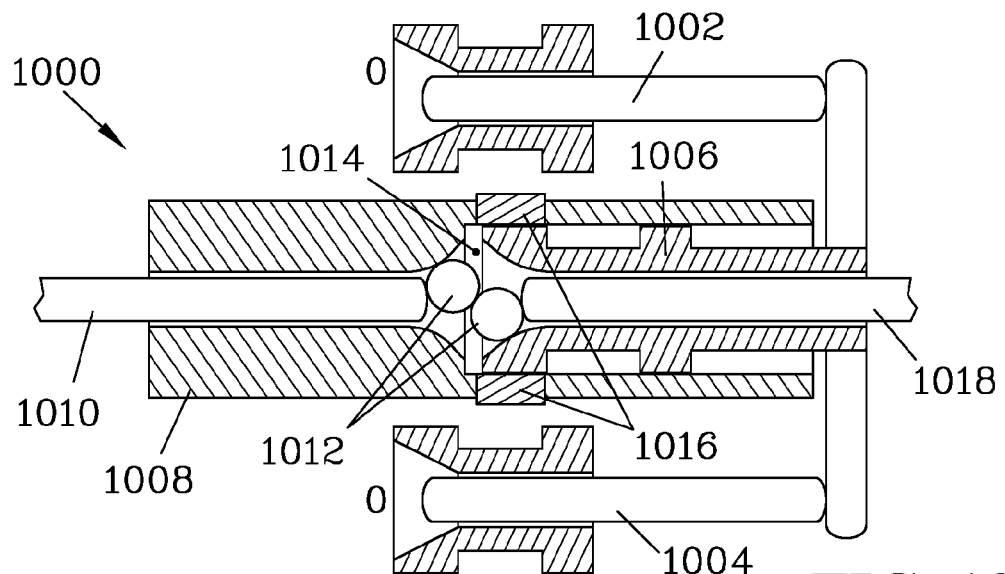
FIGS. 10A-10G illustrate a logic mechanisms where inputs determine whether or not one or more motion-transmitting elements is constrained, such constraint determining whether they are able to transmit movement from a driven element to an output.
Figure 10B:
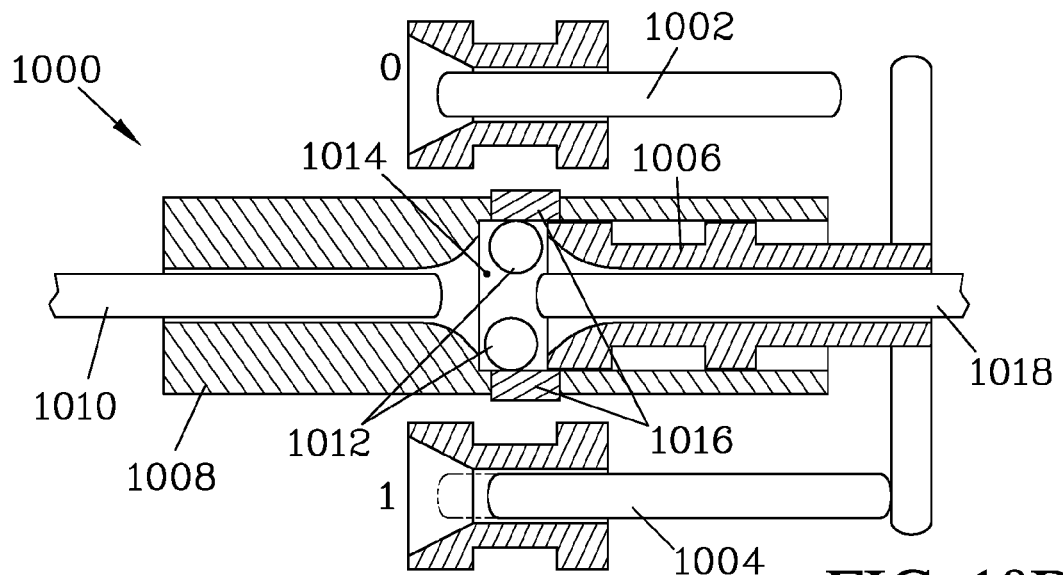

FIGS. 10A and 10B illustrate a gate mechanism 1000 where a logic function results from alignment or misalignment of motion-transmitting elements to either transmit or not transmit a mechanical displacement; however, in this case the motion-transmitting elements are constrained in their available motion to place them into alignment. The gate 1000 has inputs 1002 and 1004 which are positioned to push on a constraint tube 1006, which slides within a constraint housing 1008. These two constraint elements (1006, 1008) combine to provide a constraining structure. A driven element 1010 slides through the constraint housing 1008, and a pair of motion-transmitting elements 1012 reside in a chamber 1014 of the constraint housing that is sized to slidably engage the constraint tube 1006. The motion-transmitting elements 1012 are biased outwards in the chamber 1014; in the illustrated example, the motion-transmitting elements 1012 can be provided by steel bearings, and can be attracted outwards by magnets 1016 mounted to the chamber 1014 (for smaller-scale structures, other forces such as electrostatic charge or van der Waals attraction could be employed). When the constraint tube 1006 is in a retracted position in the chamber 1014 (as shown in FIG. 10A for input values (0, 0)), the constraining structure formed by the constraint tube 1006 and the constraint housing 1008 acts to constrain the position of the motion-transmitting elements 1012, maintaining their alignment to transmit movement from the driven element 1010 to an output 1018 that slides within the constraint tube 1006; in this case, the output 1018 is displaced responsive to motion of the driven element 1010, representing an output value of 1. If the constraint tube 1006 is displaced away from its retracted position by being pushed by either or both of the inputs (1002, 1004) being displaced to their 1-value position (as shown in FIG. 10B for the input 1004), then the motion-transmitting elements 1012 are not constrained in their position, and are attracted outwards to positions where they do not align to transmit the movement of the driven element 1010 when it is displaced. In some cases, there may be no need to attract the motion-transmitting elements 1012 outward, if resistance to movement of the output 1018 is such that the motion-transmitting elements 1012 are forced aside if not constrained by the constrain tube 1006. When the motion-transmitting elements 1012 are unconstrained (in the illustrated example, this occurs for input values (0, 1), (1, 0), or (1, 1)), the output 1018 remains in place when the driven element 1010 is displaced, representing an output value of 0; The gate 1000 thus provides a NOR logic function of the inputs (1002, 1004). The NOR gate 1000 as illustrated has only seven moving parts. While illustrated as employing the inputs to push the constraint tube away from a default position where it constrains the position of the motion-transmitting elements, a constraint-based gate could be configured with the default position being the unconstrained state, with movement of the constraint tube being required to restrain the positions of the motion-transmitting elements. Additionally, where mechanisms are shown configured such that either of two inputs can act independently to move an element, it should be understood that a single input could be employed, or that more than two inputs could be employed (in which case motion of any one of the inputs acts to displace the element in question), such as in a radial array.

Figure 10C:
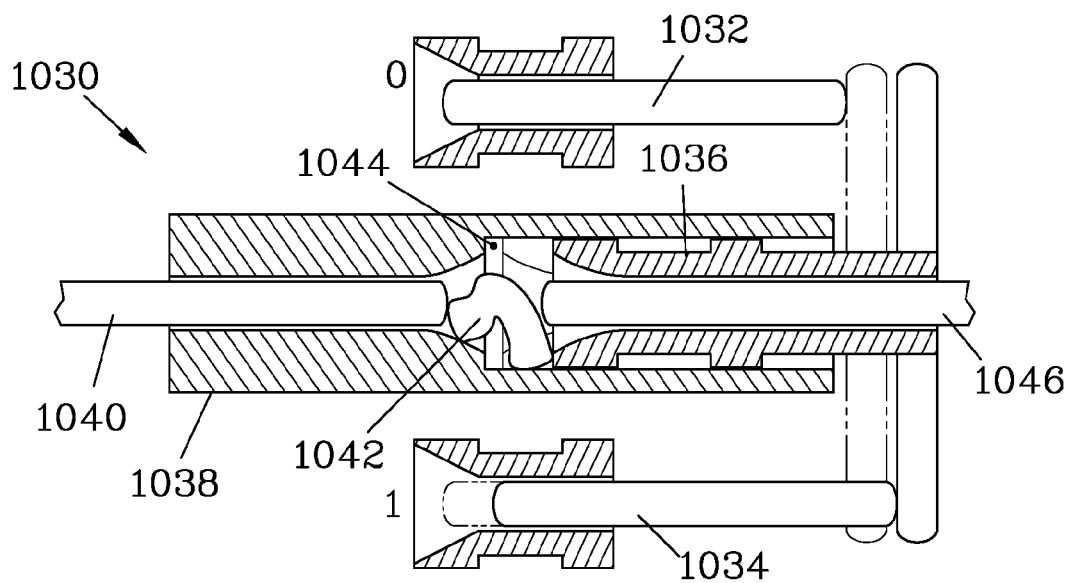
Figure 10D:
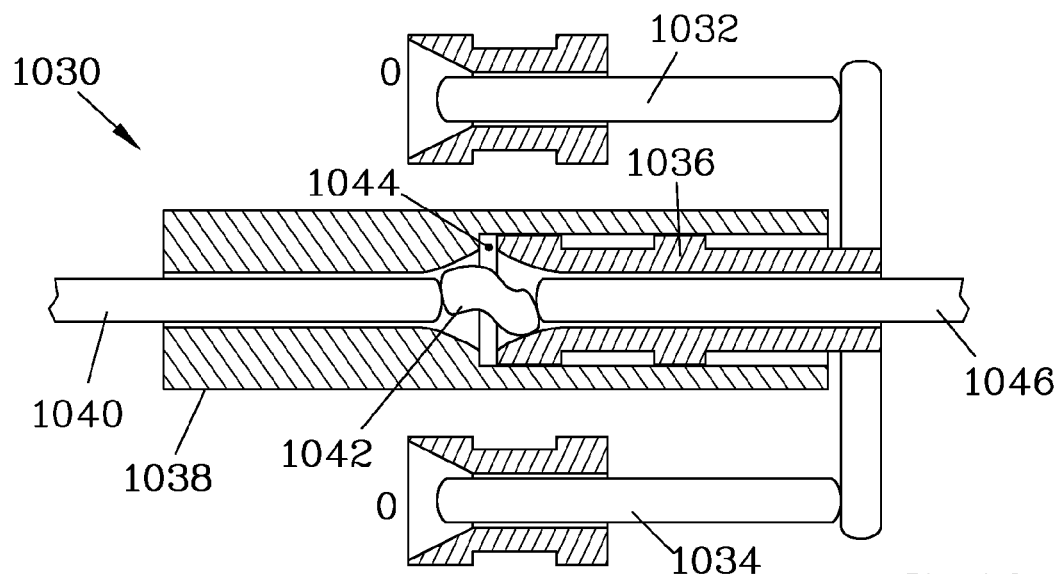

FIGS. 10C and 10D illustrate a NOR gate 1030 that functions similarly to the gate 1000, but without requiring the use of discrete motion-transmitting elements that are attracted outward. The gate 1030 again has inputs 1032 and 1034 which are positioned to push on a constraint tube 1036, and again the constraint tube 1036 slides within a constraint housing 1038 (that also serves to guide a driven element 1040), forming a constraining structure. A single motion-transmitting element 1042 resides in a chamber 1044 that is sized to slidably engage the constraint tube 1036. The motion-transmitting element 1042 is formed from a material having sufficient flexibility that, if the motion-transmitting element 1042 is unconstrained (as shown in FIG. 10C for input value (0, 1)), it is too flexible to transmit motion from the driven element 1040 to an output 1046 rather than flexing; in such case, the output 1046 is not moved, and the output value is 0. When the constraint tube 1036 is in a retracted position in the chamber 1044 (as shown in FIG. 10D for input values 0, 0), it constrains the free motion of the motion-transmitting element 1042 such that it cannot flex sufficiently to accommodate the motion of the driven element 1040, and such motion is transmitted to the output 1046, representing an output value of 1. The motion-transmitting element 1042 could be attached to either or both of the driven element 1040 and the output 1046.

Figure 10E:
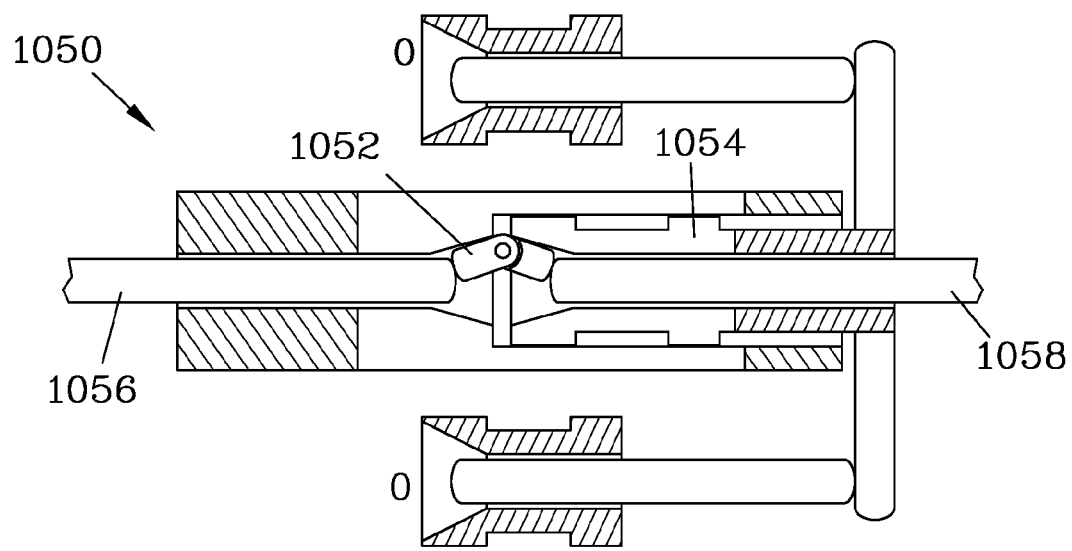

FIG. 10E illustrates an example of a NOR gate 1050 that is functionally similar to the gate 1030, but where a hinge 1052 is employed as a motion-transmitting element. A constraint element 1054 can be positioned to restrain the motion of the hinge 1052 (as shown), in which case the hinge 1052 acts to transmit movement from a driven element 1056 to an output 1058. When not so constrained, the hinge 1052 is free to bend to accommodate the movement of the driven element 1056, and thus the movement of the driven element 1056 is not transmitted. Since the hinge 1052 shown is inherently constrained to movement within a plane, the constraint element 1054 only needs to constrain the motion of the hinge 1052 on two sides. If the bending direction of the hinge 1052 were further constrained (such as by forming and/or installing the hinge with a bias that allows it to only bend one way), constraint on only one side would be effective. The generally planar arrangement should make such gates employing hinge structures well-suited to fabrication by additive manufacturing techniques such as micro- and nano-lithography. Additional mechanisms that employ the constraint of a hinge to determine an output are discussed below with regard to FIGS. 11A-11H.

Figure 10F:
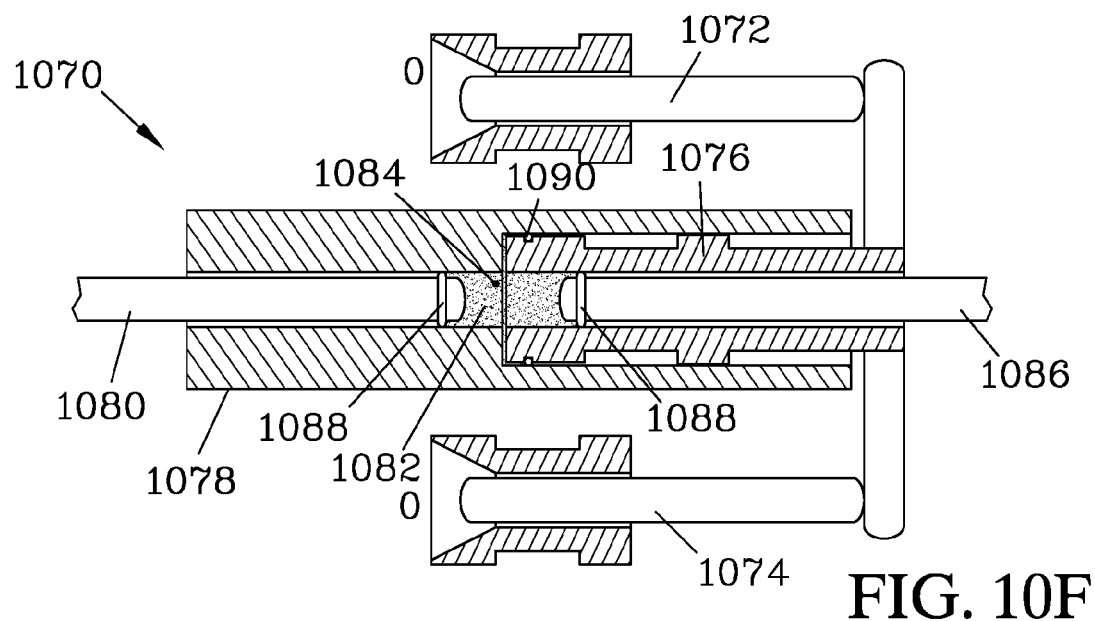
Figure 10G:
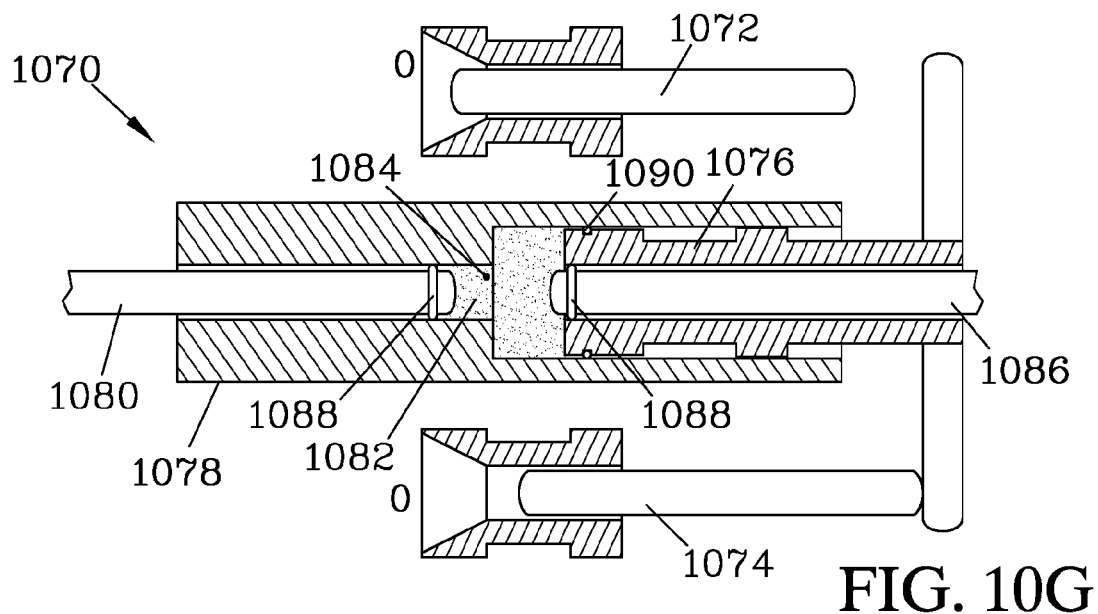

FIGS. 10F and 10G illustrate a NOR gate 1070 that functions similarly to the gates 1030 and 1050, but where a fluid is employed to transmit or not transmit movement based on the positions of two inputs 1072 and 1074. The inputs (1072, 1074) again are positioned to push on a constraint tube 1076, and again the constraint tube 1076 slides within a constraint housing 1078 that also serves to guide a driven element 1080. A fluid 1082 resides in a chamber 1084 between the driven element 1080 and an output 1086, both equipped with seals 1088. The chamber 1084 slidably engages the constraint tube 1076, and when the constraint tube 1076 is not displaced (as shown in FIG. 10F), the chamber 1084 is sized relative to the volume and/or compressibility of the fluid 1082 so as to allow fluid pressure to displace the output 1086 when the driven element 1080 is displaced.

If either of the inputs (1072, 1074) is displaced, the constraint tube 1076 is also displaced (as shown in FIG. 10G), expanding the size of the chamber 1084. The constraint tube 1076 is equipped with a seal 1090. When the chamber 1084 is expanded, it creates free additional volume into which the fluid 1082 can flow. In this case, when the driven element 1080 is displaced, the change in volume caused by such displacement is small enough compared to the available additional volume of the chamber 1084 that the change does not generate sufficient fluid pressure to move the output 1086.

FIGS. 11A-11H illustrate examples of mechanisms where the use of constraint of motion is somewhat more complex; in these examples, the available motion of a hinge is constrained, based on the position of an input, to either allow the hinge to bend in order to accommodate the motion of a driven element, or to translate in order to transmit the motion of the driven element to an output. Thus, these mechanisms (at least as illustrated) incorporate both constraint and alignment principals, as they constrain available motion of an element along a path, and either align or misalign such path with the direction of possible motion of the output.

Figure 11A:
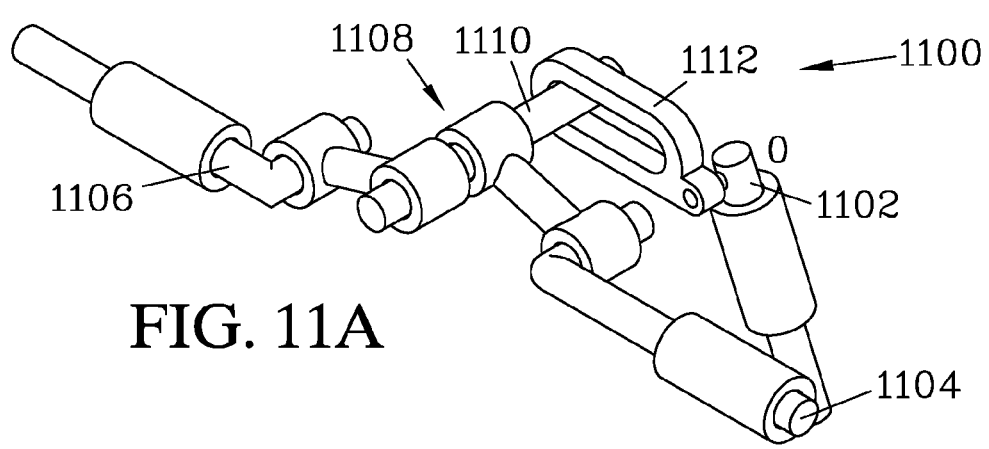
Figure 11B:
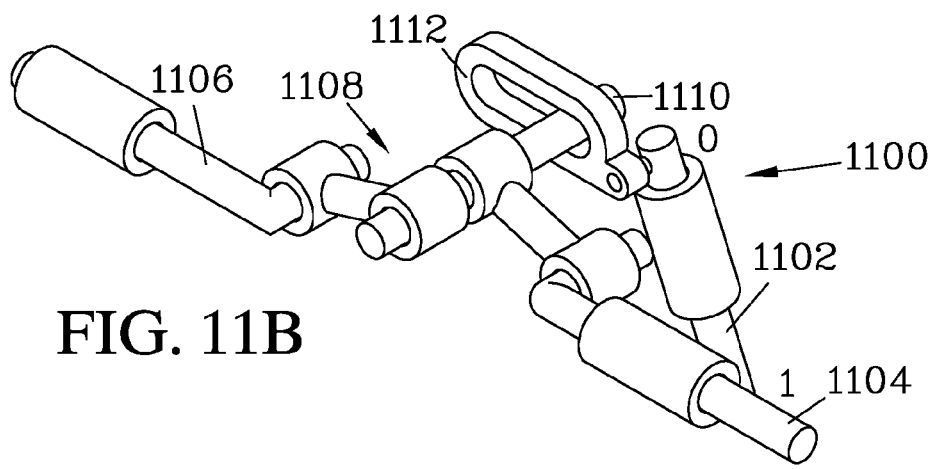

FIGS. 11A-D show a mechanism 1100 with an input 1102, which is positioned to determine the value of an output 1104 that will result when a driven element 1106 is displaced. The output 1104 and the driven element 1106 are aligned with each other and connected together by a hinge 1108 having an extending pin 1110. The pin 1110 in turn is constrained by a slot 1112, which is positioned by the input 1102. When the input 1102 is undisplaced (as shown in FIGS. 11A & 11B), the slot 1112 is positioned in alignment parallel to the direction of displacement of the driven element 1106. In this position, displacement of the driven element 1106 moves the pin 1110 along the slot 1112, maintaining the hinge 1108 at the same angle of bend, as shown in FIG. 11B. Since the geometry is maintained constant, movement of the hinge 1108 by the driven element 1106 transmits the motion to the output 1104.

Figure 11C:
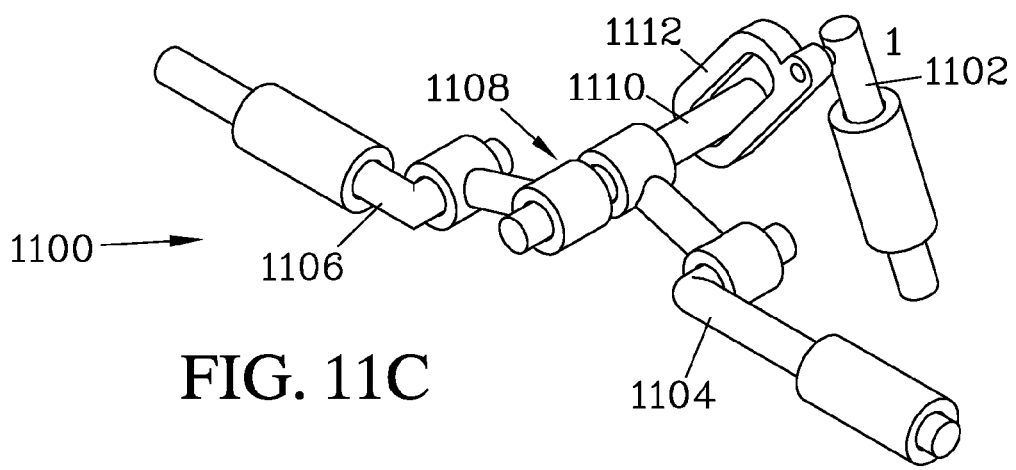
Figure 11D:
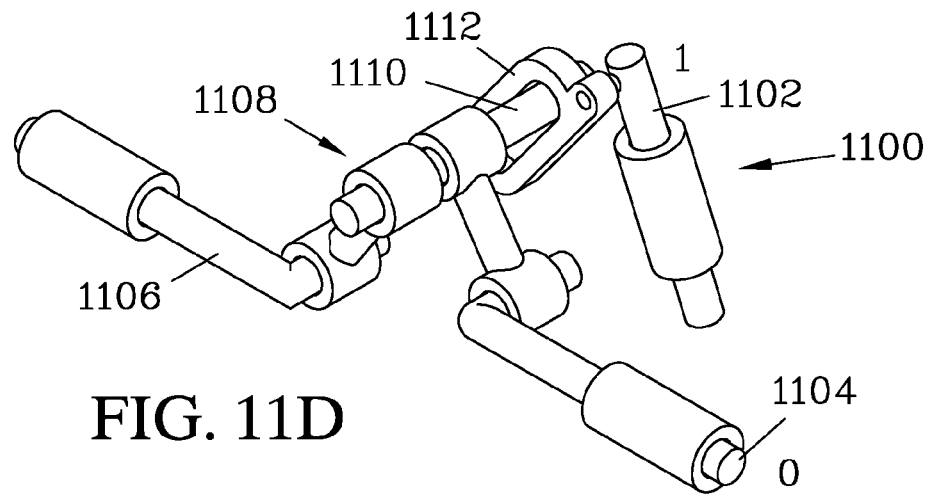
Figure 11E:
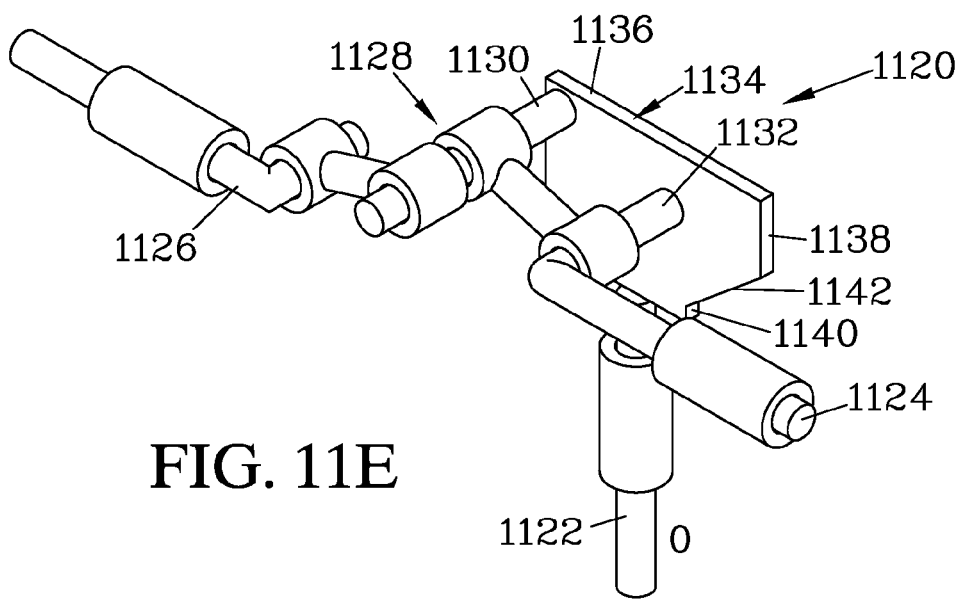
In FIGS. 11E-11H e a shaped plate engages pins via non-contact forces to constrain motion of the hinge.

FIGS. 11C and 11D show the mechanism 1100 when the input 1102 has been displaced, positioning the slot 1112 such that it is no longer aligned with the path of motion of the driven element 1106. Instead, in this position, the slot 1112 is aligned with the path that the pin 1110 moves along when hinge 1108 bends, in the case where the driven element 1106 moves while the output 1104 remains in place (note that this may require flexibility in the mounting and/or extension of the input 1102). Since the available path of movement of the pin 1110 is not aligned with the path of motion of the driven element 1106, the hinge 1108 cannot simply translate to move the output 1104. The constraint of available motion of the pin 1110 requires the hinge 1108 to bend in order to accommodate the displacement of the driven element 1106, while leaving the output 1104 in place, as shown in FIG. 11D. The combination of the hinge 1108 and the slot 1112 can be considered to provide a motion-controlling structure, with the slot 1112 serving as a motion-control element that is positioned by the input 1102 to determine the allowable motion of the hinge 1108, which serves as a motion-transmitting element. The position of the slot 1112 determines whether the motion-controlling structure is in a motion-accommodating configuration (as shown in FIGS. 11C & 11D) or in a motion-transmitting configuration, as shown in FIGS. 11A & 11B). The combination of the hinge 1108 and the slot 1112 can be considered to form a structure to determine constraint on the allowable free movement of the hinge 1108, determining whether or not it can accommodate movement of the driven element 1106 without forcing movement of the output 1104.

FIGS. 11E-11H show a mechanism 1120 that employs non-contact forces and edges to selectively constrain available motion in the mechanism 1120 based on the position of an input 1122; again, such constraint determines the position of an output 1124 responsive to displacement of a driven element 1126. The driven element 1126 is again aligned with the output 1124 and connected thereto by a hinge 1128. The hinge 1128 has extending pins 1130 and 1132 (1132 being formed integrally with the output 1124 in this example), which interact with a shaped plate 1134 via non-contact forces such as magnetic, electrostatic, or VDW attraction (although the pins (1130, 1132) may actually be in contact with the plate 1134). The plate 1134 is positioned by the input 1122, and in this example moves between a (lower) first position (shown in FIGS. 11E & 11F) and a (raised) second position (shown in FIGS. 11G & 11H). The hinge 1128 (including pins 1130 and 1132) can be considered a motion-transmitting element, and the plate 1134 can be considered a motion-control element, the two in combination serving as a motion-controlling structure. The shaped plate 1134 can be considered as a constraint structure that determines the allowable motion of the hinge 1128 (via pins 1130 & 1132) to determine whether displacement of the driven element 1126 can be accommodated without forcing motion of the output 1124.

Figure 11F:
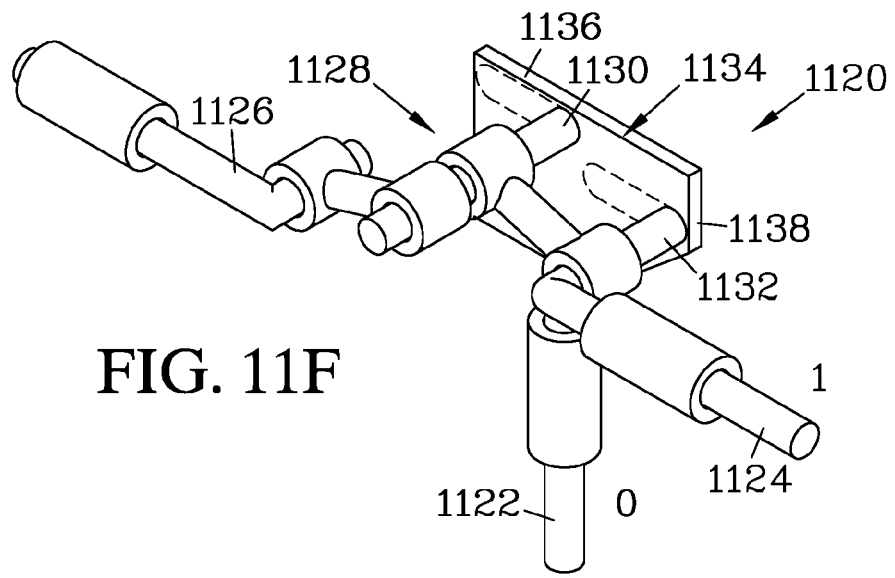
Figure 11G:
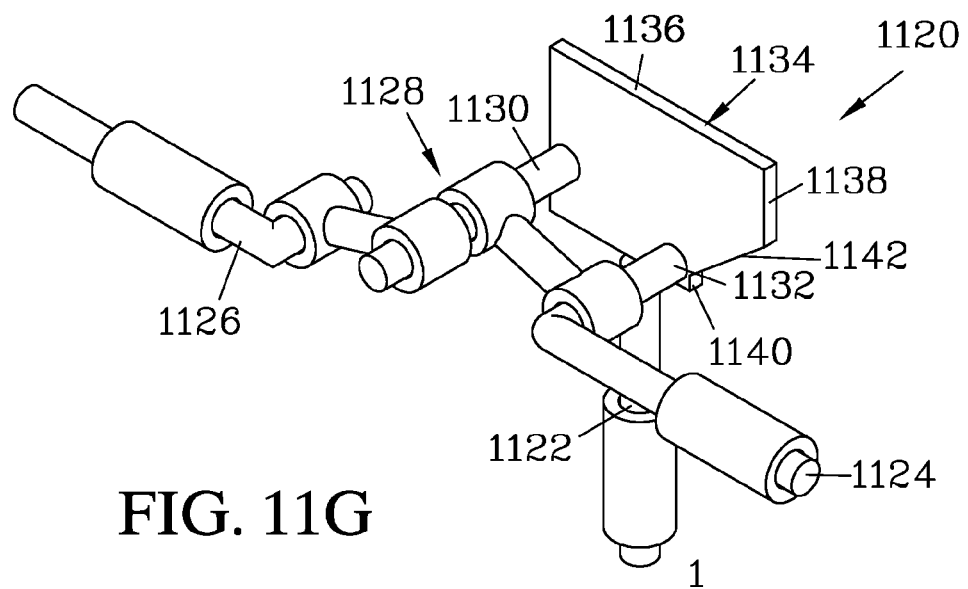

When the plate 1134 is in its first position (FIGS. 11E & 11F), bending of the hinge 1128 is blocked by the proximity of the pin 1130 to a plate first edge 1136. When the driven element 1126 is displaced, the proximity of the pin 1130 to the plate first edge 1136 constrains the motion of the pin 1130, preventing it from moving to bend the hinge further (upward motion in the orientation shown). Thus, the displacement of the driven element 1126 is accommodated by moving the entire hinge 1128, which also moves the output 1124 (as shown in FIG. 11F); the plate first edge 1136 can be considered to constrain available motion in a direction along which the output 1124 is movable. The plate 1134 is configured with a plate second edge 1138 that is positioned relative to the pin 1132 to accommodate its movement with the remainder of the hinge 1128. The first position of the plate 1134 can be considered to place the motion-controlling structure in a motion-transmitting configuration, where the output 1124 moves responsive to motion of the driven element 1126.

Figure 11H:
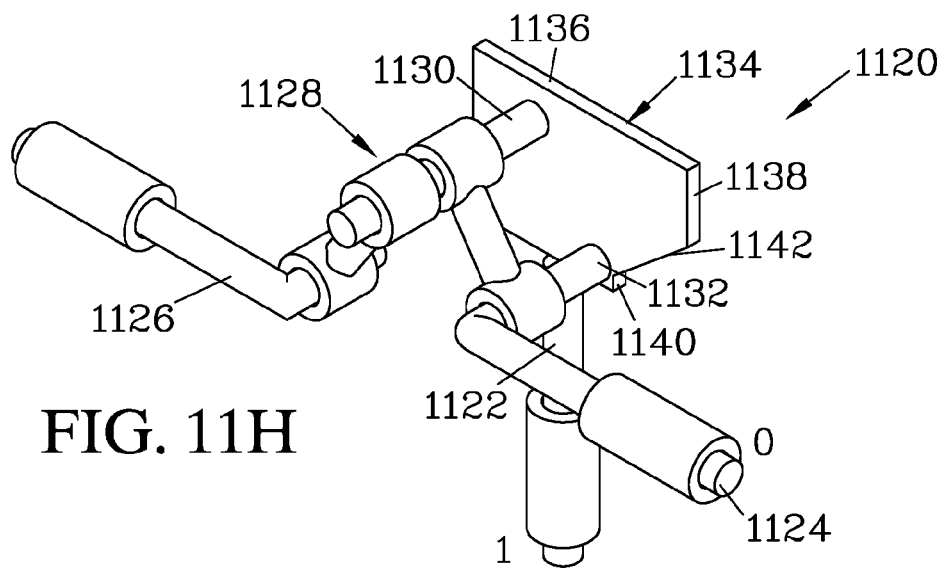

When the plate 1134 is in its second position (FIGS. 11G & 11H), the plate first edge 1136 is positioned away from the pin 1130, while a plate third edge 1140 is positioned to constrain movement of the pin 1132 to prevent the hinge 1128 from simply translating, and hence blocking movement of the output 1124. In this case, displacement of the driven element 1126 is accommodated by the hinge 1128 bending, moving the pin 1130 closer to the plate first edge 1136 (as shown in FIG. 11H); the plate third edge 1140 can be considered to constrain the available motion to a direction that is not aligned with the direction of motion available to the output 1124. The second position of the plate 1134 can be considered to place the motion-controlling structure in a motion-accommodating configuration, where movement of the driven element 1126 can be accommodated without movement of the output 1124. The plate 1134 can optionally include a plate ramp edge 1142 adjacent to the plate third edge 1140 (in the plate 1134 shown, extending to the plate second edge 1138). The plate ramp edge 1142 acts on the pin 1132 to move the output 1124 to its non-displaced position when the input 1122 moves the plate 1134 to its second position. The mechanism 1120 could be fabricated from diamondoid material for the plate 1134 (possibly covered with graphene to reduce friction), with the remaining elements formed from modified CNTs.

Figure 11I:
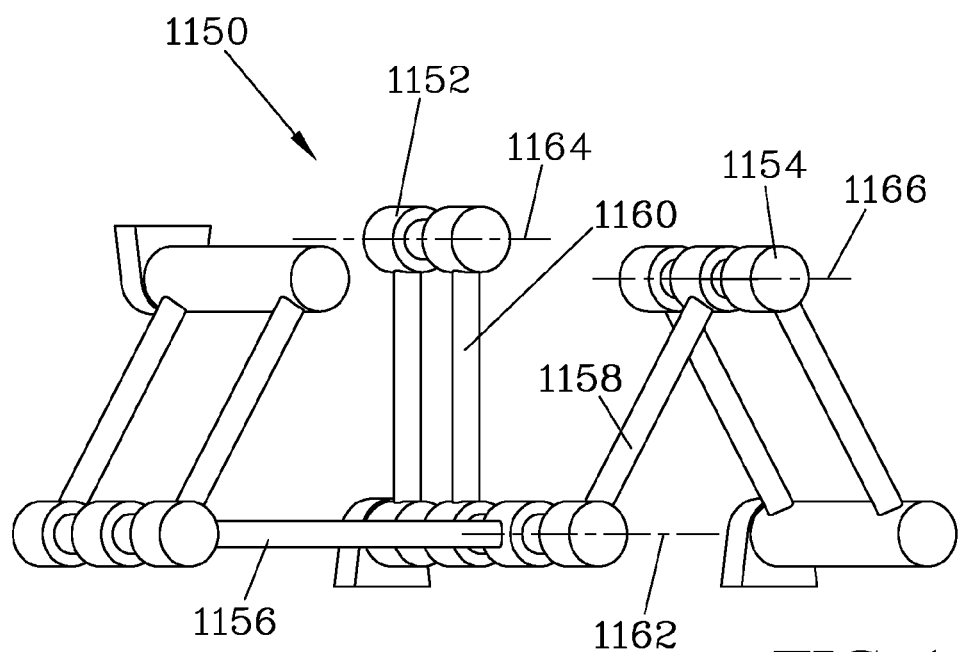
Figure 11J:
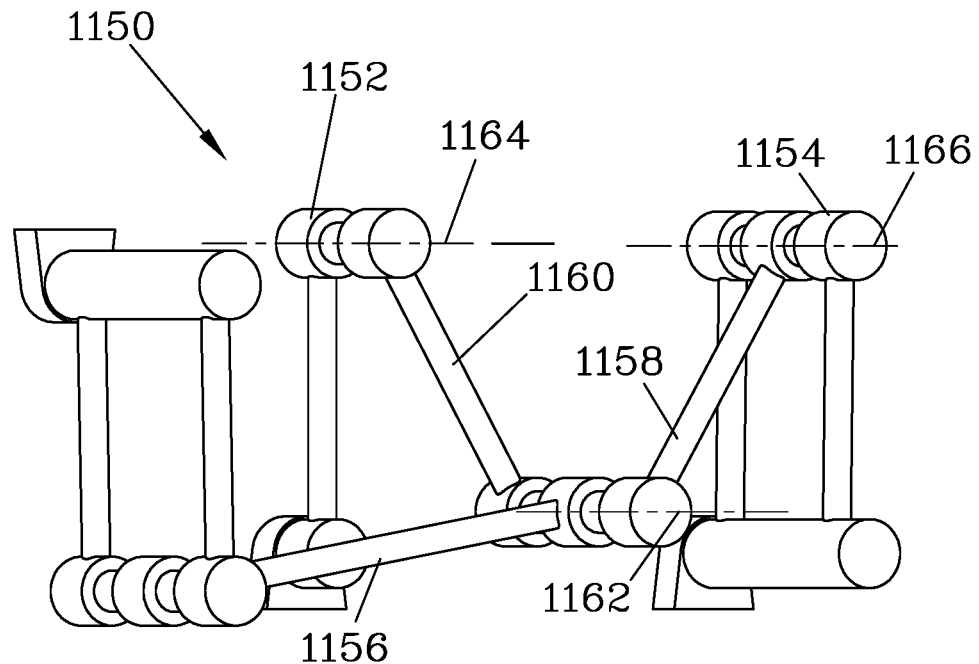
Figure 11K:
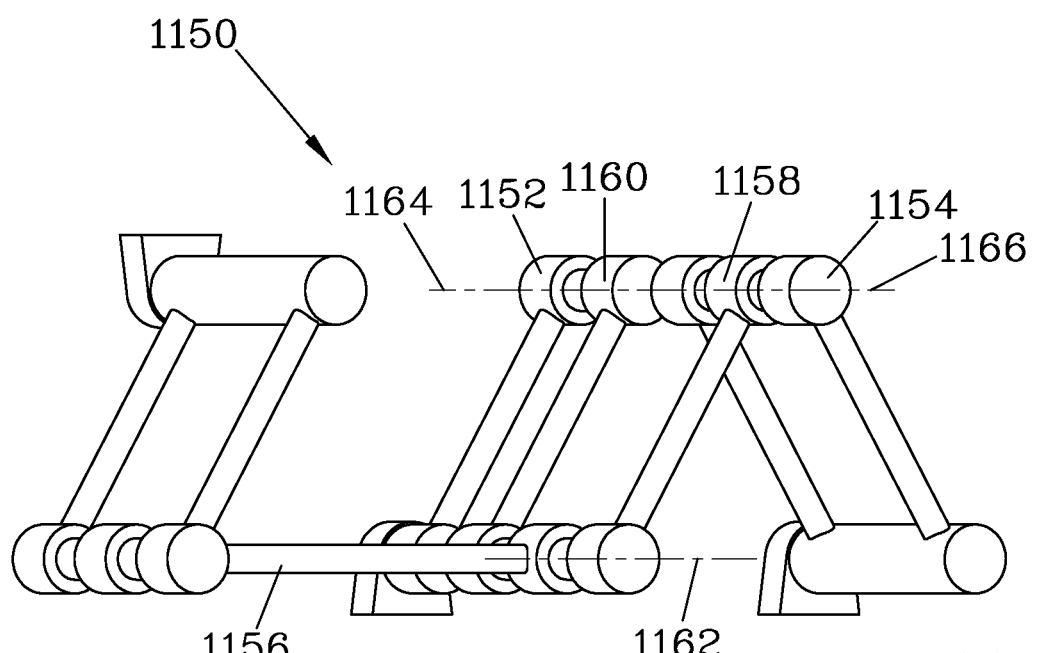
Figure 11L:
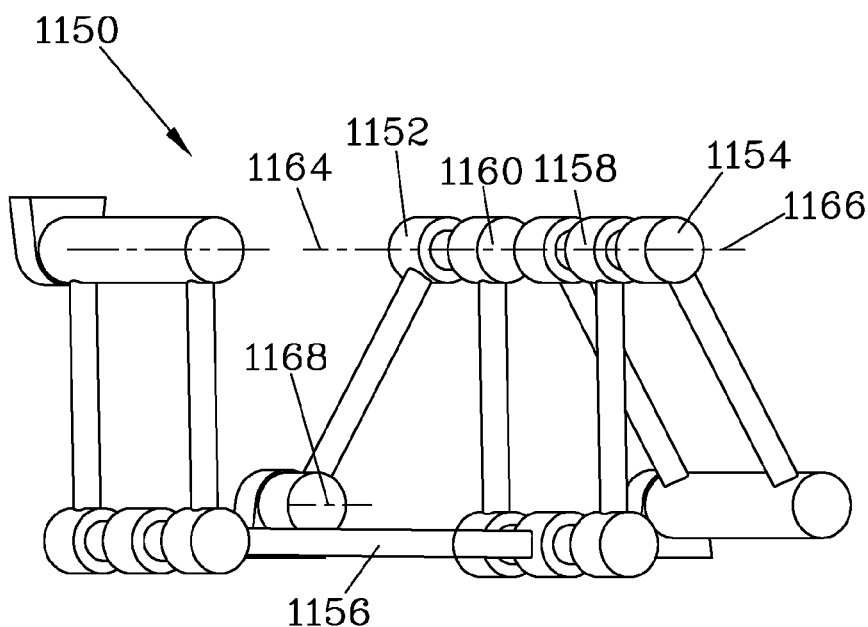

Motion of hinges can also be controlled by aligning or misaligning axes of rotation to determine which elements are free to pivot. FIGS. 11I-11L show a mechanism 1150 where, again, an input 1152 is positioned to determine the value of an output 1154 that will result when a driven element 1156 is displaced; in the mechanism 1150, alignment or misalignment of axes of rotation (responsive to the position of the input 1152) determines whether or not motion of the driven element 1156 can be accommodated without causing motion of the output 1154. The output 1154 is connected to the driven element 1156 by a hinge link 1158, and the input 1152 is connected to the driven element 1156 by a control link 1160. The driven element 1156, the hinge link 1158, and the control link 1160 are connected to pivot about a common drive axis 1162, the input 1152 and the control link 1160 are pivotably connected together about an input axis 1164, and the hinge link 1158 and the output 1154 are pivotably connected together about an output hinge axis 1166. FIGS. 11I and 11K illustrate the mechanism 1150 prior to displacing the driven element 1156, and FIGS. 11J and 11L illustrate the mechanism 1150 after the driven element 1156 has been displaced.

When the input 1152 is undisplaced (FIGS. 11I & 11J), the input axis 1164 is spaced apart from the output hinge axis 1166. In this position, displacement of the driven element 1156 causes the control link 1160 to pivot about the input axis 1164, as well as moving the hinge link 1158 (as shown in FIG. 11J). Since the input axis 1164 is spaced apart from the output hinge axis 1166, movement of the hinge link 1158 can only be accommodated by moving the output 1154, and thus movement of the hinge link 1158 by the driven element 1156 is transmitted to the output 1154.

FIGS. 11K and 11L show the mechanism 1150 when the input 1152 has been displaced, positioning the input axis 1564 in alignment with the output hinge axis 1166. In this position, since the control link 1160 and the hinge link 1158 pivot about a common axis (aligned axes 1164 and 1166), displacing the driven element 1156 merely causes the control link 1160 and the hinge link 1158 to pivot together about the aligned axes (1164, 1166), while the output 1154 remains in place. Thus, the displacement of the driven element 1156 is accommodated by the pivoting action without being transmitted to the output 1154 when the input 1152 is displaced. The resulting output action is that of a NOT gate. If the input 1152 were configured to be displaced by either or both of two input elements, a NOR logic function would result. The control link 1160 could be considered to form a motion-control structure (or an element thereof) that has a motion-accommodating position/configuration and a motion-transmitting position/configuration. Similarly, multiple mechanisms 1150 could be chained such that any one or more inputs being displaced would result in a break in the chain of transmission, in a manner similar to the 3-input NOR gates shown in FIGS. 9A & 9B (and in FIG. 12C discussed below), or combined to form structures such as the switch gate shown in FIGS. 12G & 12H (discussed below), or the address-selecting structure employed in FIG. 17F (discussed below). In the mechanism 1150, the input 1152 pivots about an input base axis 1168 (visible in FIG. 11L) that is coincident with the common drive axis 1162 when the driven element 1156 is undisplaced; this alignment of the input base axis 1168 assures that the movement of the input 1152 and the control link 1160 does not cause displacement of the hinge link 1158. The mechanism 1150 is noteworthy in that it can be fabricated using only links and pivot joints, making it well suited for molecular-scale fabrication. For example, the links could be formed by modified CNTs or beams of diamond/lonsdaleite, with acetylenic bonds providing the pivot joints (such as taught in U.S. Pat. No. 10,481,866 and related patents/applications), or nested CNTs providing the pivot joints.

Figure 11M:
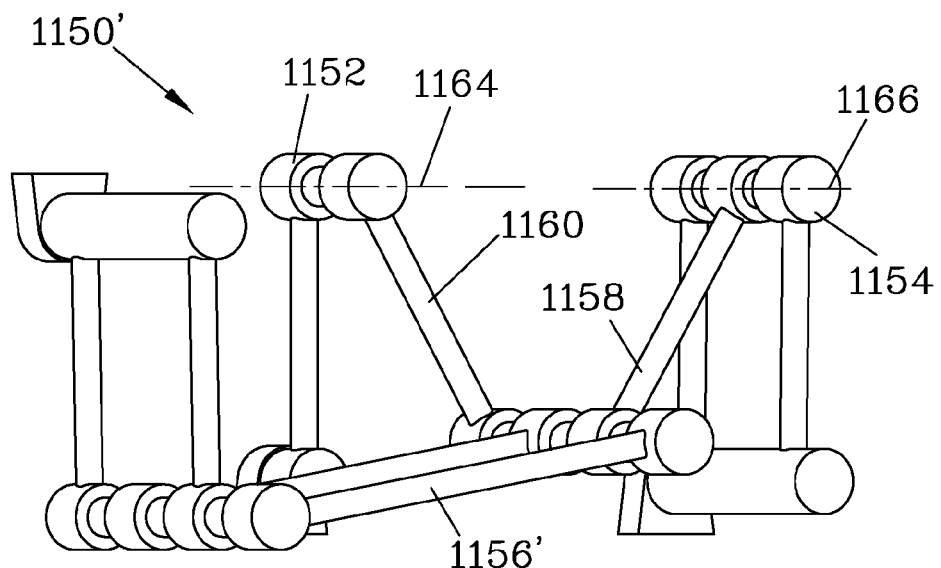

FIG. 11M shows an alternative mechanism 1150', which is similar to the mechanism 1150 except for having a driven element 1156' that has two parallel bars to provide greater stability. FIG. 11N shows another alternative mechanism 1150", which differs in the position of the input 1152. In the mechanism 1150", the input 1152 is mounted to pivot about an input base axis 1168' that is displaced away from the common drive axis 1162, but still acts to pivot the control link 1160 to move the input axis 1164 into or out of alignment with the output hinge axis 1166. Note that, since the pivoting action of the input 1152 and the control link 1160 is not about an axis aligned with the common drive axis 1162, the movement of the control link 1160 will cause some displacement of the hinge link 1158 and the output 1154 as it moves between its aligned and misaligned positions.

In some cases, motion of an output responsive to motion of a driven element can be determined by aligning or misaligning a path that accommodates the motion of the driven element, rather than an aligned path of transmission of motion; this distinction may be dependent on perspective, as a path that does not accommodate motion can be considered as creating a path of transmission, even if that path may span physical gaps and thus not be in a direct line through elements. Such a control scheme can be considered as using one or more inputs to determine the constraint on free motion of the mechanism, determining whether the motion of a driven element can be accommodated without forcing the motion of an output.

FIGS. 12A and 12B illustrate a transmission gate 1200 that employs a shaped plate 1202 that serves to either transmit or not transmit motion from a driven element 1204 to an output 1206. The plate 1202 has a cutout 1208, and the driven element 1204 has a driven element attractive element 1210 that is attracted to the plate 1202. For larger-scale devices, the plate 1202 can be formed of a ferromagnetic material and the attractive element 1210 can be provided by a magnet. For a molecular-scale gate, the plate 1202 and the attractive element 1210 could be any material subject to van der Waals attraction (some examples of structures suitable for molecular-scale fabrication are shown in FIGS. 12E, 12F, 13A, & 13B); alternative gates could employ electrostatic attraction. Depending on the relative forces, the attractive element 1210 could be in contact with the plate 1202 or could merely be closely spaced to it. The output 1206 has an output attractive element 1212 (which can also be provided by a magnet). The plate 1202 is movably mounted to an input 1214, and the position of the input 1214 determines whether the cutout 1208 is or is not positioned in the path of the driven element 1204 (specifically, the attractive element 1210) when the driven element 1204 is displaced.

When the cutout 1208 is positioned so as not to intercept the path of the driven element 1204 (as shown in FIG. 12A for input value 1), then the driven element 1204 can simply extend without any effect, since the attractive force between the driven element attractive element 1210 and the plate 1202 does not change as the driven element 1204 moves the attractive element 1210 across the plate 1202. The plate 1202 in this position provides a path for accommodating motion of the driven element 1204 which is aligned with its direction of motion. In contrast, when the cutout 1208 is positioned to intercept the path of the driven element 1204 (as shown in FIG. 12B for input value 0), the attractive force between the attractive element 1210 and the plate 1202 acts to resist relative motion therebetween, since such motion would require forcing the attractive element 1210 over the cutout 1208, which would require overcoming the attractive force between the attractive element 1210 and the plate 1202. In this case, the resistance to relative motion causes the driven element 1204 to move the plate 1202 with it. The cutout 1208 is also positioned such that attraction between the output attractive element 1212 and the plate 1202 serves to move the output 1206, since the output 1206 remaining in position would force the output attractive element 1212 to overcome the attractive force to move over the cutout 1208. In this position of the plate 1202, the path to accommodate motion of the driven element 1204 is misaligned, and thus the plate 1202 is moved with the driven element 1204, and this motion is in turn transmitted to the output 1206. In this manner, the position of the input 1214 controls whether or not the displacement of the driven element 1204 is transmitted to the output 1206. The plate 1202 can be considered as a motion-control element that provides a motion-controlling structure, positioned by the input 1214 in either a motion-accommodating configuration (FIG. 12A) or a motion-transmitting configuration (FIG. 12B). Similarly, the plate 1202 could be considered as having an active portion, containing the cutout 1208 and serving as a motion-transmitting element when this portion is interposed between the driven element 1204 and the output 1206, and an inactive portion that can accommodate movement of the driven element 1204 when this portion is interposed between the driven element 1204 and the output 1206. In the plate 1202, the cutout 1208 is configured with its edges perpendicular to the direction of motion of the driven element 1204 and the output 1206, to avoid any unwanted cam-like forcing of the plate 1202 by motion of these elements.

While the gate 1200 shows the plate 1202 being positioned by only the single input 1214, a similar mechanism could be configured to employ a plate that is positioned independently by one of multiple inputs (such as in a manner similar to the positioning of constraint tube 1006 by either or both of inputs 1002 and 1004), or a plate that is positioned by the combined actions of multiple inputs (such as in a manner similar to the positioning of motion-transmitting element 502 by hinge 510 and inputs 508, or similar to the positioning of connector link 1536 by balance 1534 and two inputs 1532 as discussed below for FIG. 15C). In a case where the combined displacement of multiple inputs is required to position the plate in a motion-accommodating configuration, the mechanism should provide a NAND logic function. Similarly, a plate positioned by two inputs could be configured to only transmit force when subject to displacement by one, but not both inputs, providing an XOR function, or to transmit force when either or both inputs is displaced, providing a NOR function. Additional configurations of plates and inputs, as well as possibly multiple outputs, could be designed to suit a particular purpose.

Figure 12C:
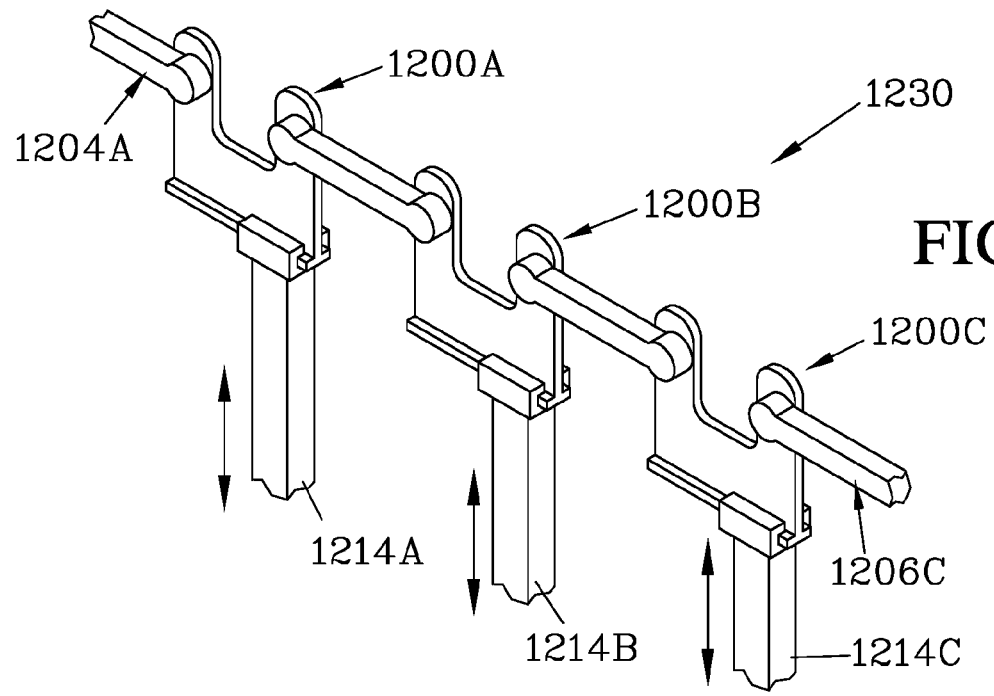

FIG. 12C illustrates one example of a logic gate formed by combining single-input transmission gates, a 3-input NOR gate 1230 that employs three transmission gates 1200A-C connected in series, each with an input 1214A-C. As shown in FIG. 12C, all inputs 1214A-C are undisplaced (input value 0), and thus a path exists to transmit motion from the driven element 1204A to the output 1206C. If any of the inputs 1214A-C is extended (input value 1), it results in a break in the chain of transmission from driven element 1204A to output 1206C. The resulting logic function is similar to that provided by the 3-input NOR gate 900 shown in FIGS. 9A & 9B.

Figure 12D:
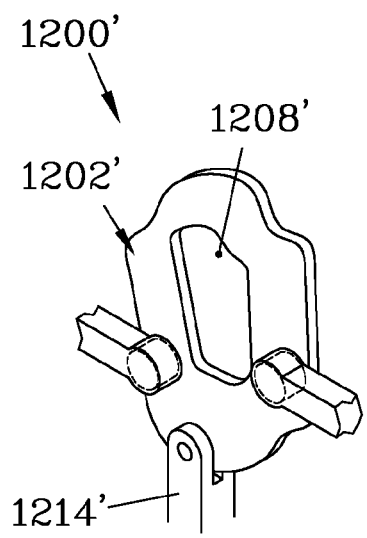

FIG. 12D shows one example of an alternative transmission gate 1200', which differs in the configuration of the plate 1202'. The plate 1202' has a cutout 1208' and its overall shape is designed to provide more reliable operation when the plate 1202' is pivotably mounted to an input 1214'.

Figure 12I:
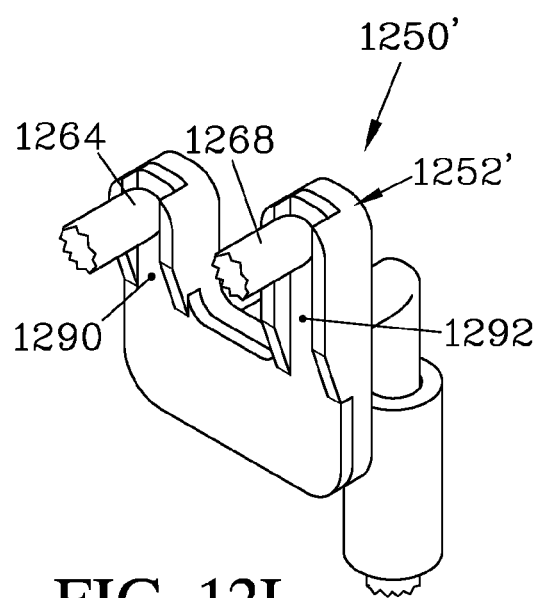
Figure 12E:
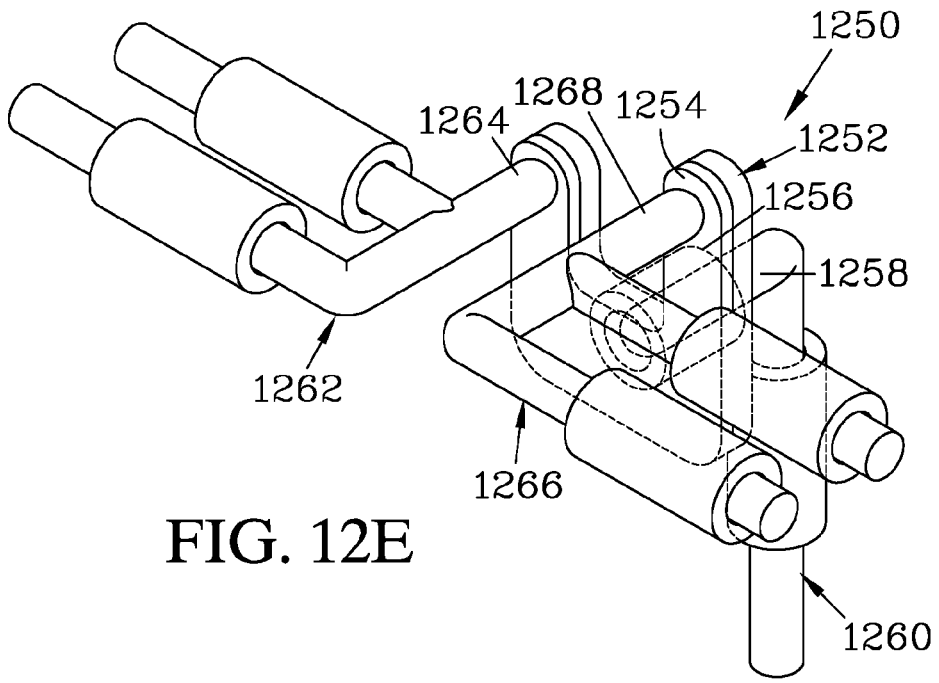
Figure 12F:
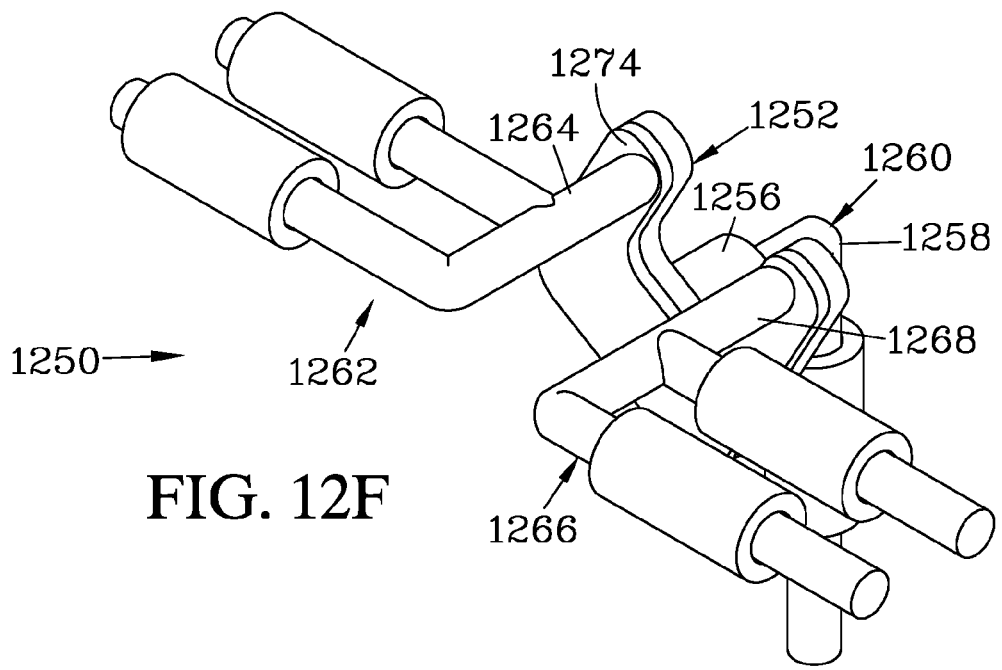

FIGS. 12E & 12F illustrate an example of a transmission gate 1250 that is well suited for nano-scale fabrication, having a shaped plate 1252 that can be formed from diamondoid or similar material and can have a graphene surface 1254 to reduce friction. The plate 1252 has a cylindrical socket 1256 on its back side that is engaged by an input pin 1258 on an input 1260 that can be formed from a CNT. A driven element 1262 having a driven pin 1264 and an output 1266 having an output pin 1268 engage the plate 1252, and can be formed from modified CNTs that engage the plate 1252 via van der Waals force.

Figure 12G:
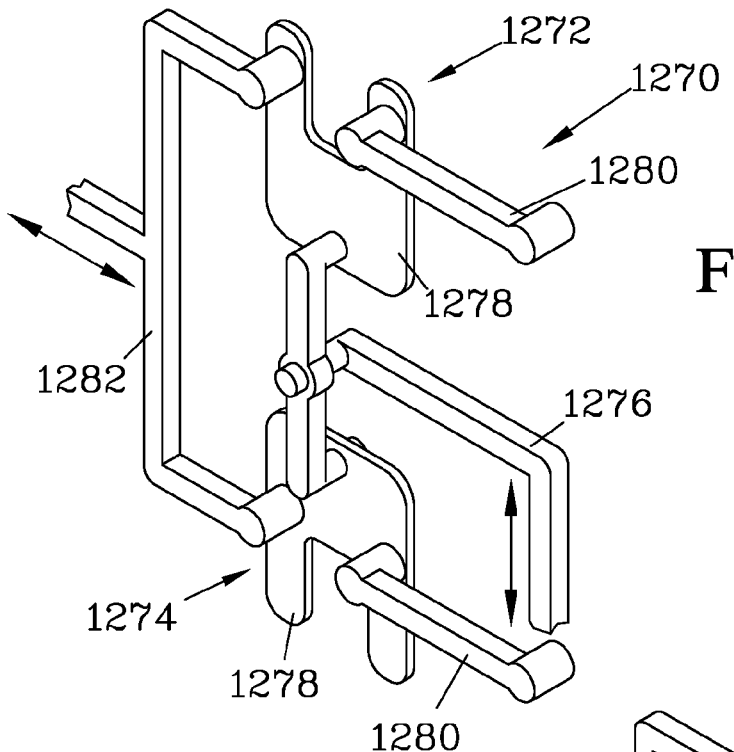
Figure 12H:
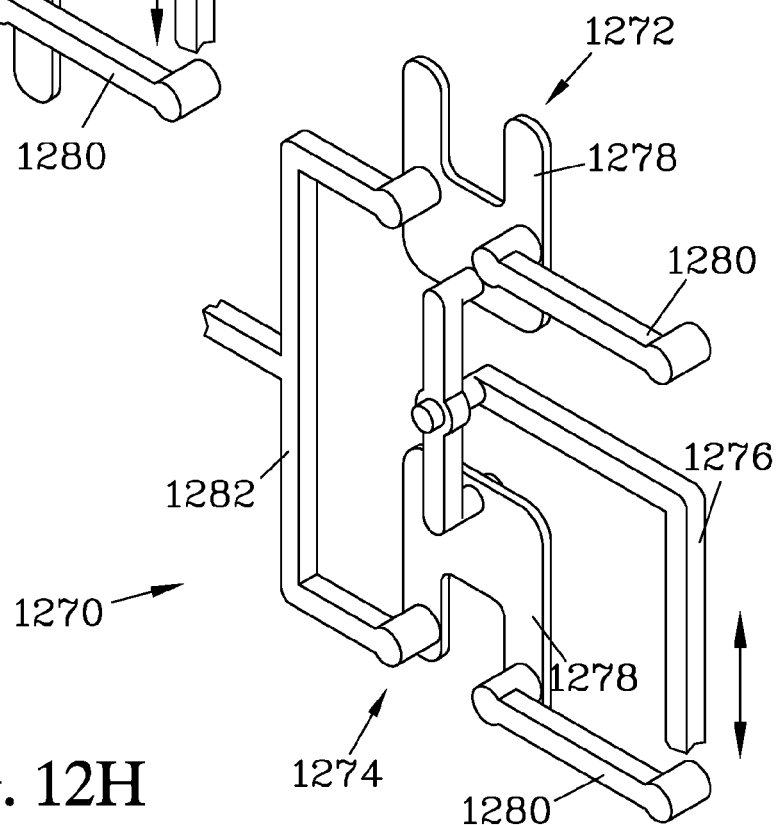

FIGS. 12G and 12H illustrate one example of a switch gate 1270 that employs a pair of transmission gates 1272 and 1274, each of which operates similarly to the transmission gate 750. The gates (1272, 1274) are positioned opposite each other, and are both moved by a common input 1276. Each gate (1272, 1274) has a shaped plate 1278 and an output 1280. Both gates (1272, 1274) are engaged by a driven element 1282. Depending on the position of the input 1276, one of the gates (1272, 1274) has its plate 1278 positioned to allow the driven element 1282 to move across the plate without any change in NCFs, while the other is positioned such that motion of the driven element brings it against an edge, and thus causes the plate 1278 to move, such motion in turn being conveyed to the associated output 1280. FIG. 12G shows the switch gate 1270 when the input 1276 is positioned such that the plate 1278 of the transmission gate 1272 is positioned to convey the motion of the driven element 1282 to its output 1280 to avoid changes in NCF, while the plate 1278 of the transmission gate 1274 is positioned to accommodate motion of the driven element 1282 without any changes in NCF. FIG. 12H shows the alternative position of the input 1276, where the transmission gate 1272 is now positioned to accommodate motion of the driven element 1282, and the transmission gate 1274 is positioned to convey the motion to its output 1280. Since the position of the input 1276 determines which path motion is directed along, the basic scheme of the switch gate 1270 can be employed to form logic mechanisms that employ a lock-and-balance scheme to provide an output value based on a number of input values. Examples of such lock-and-balance logic mechanisms, using alternative elements, are taught in U.S. Pat. Nos. 10,481,866 and 10,664,233, 10,949, 166, and U.S. Publication 2021/0149630.

One concern for molecular-scale mechanisms is that the interaction between the elements via non-contact forces may limit the magnitude of force that can be transmitted through the mechanism. One approach to increasing the magnitude of force than can be transmitted by a mechanism is illustrated in FIG. 12I, which illustrates a transmission gate 1250' having a plate 1252' that is provided with channels 1290 and 1292 that respectively engage the driven pin 1264 and the output pin 1268, providing greater forces of engagement between the plate 1252' and the pins (1264, 1268) than is provided by the non-contact forces between these elements.

Figure 13A:
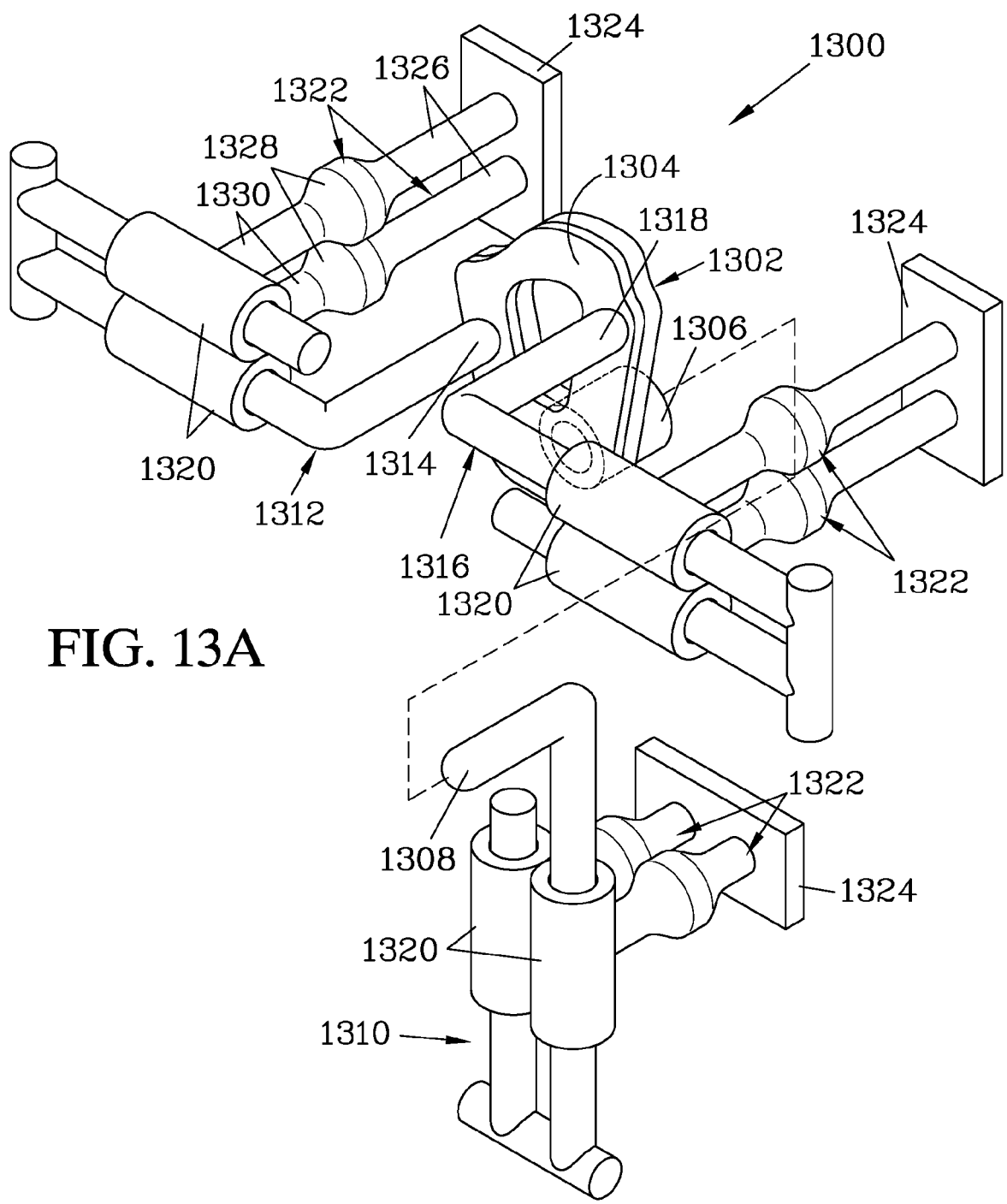

Many of the mechanical logic structure taught herein are well suited to nanoscale fabrication, including molecular fabrication using mechanosynthesis. FIGS. 13A and 13B illustrate two transmission gates that function similarly to the gate 1250 shown in FIGS. 12E & 12F, and are examples of mechanisms that could be fabricated by mechanosynthesis. Molecular modeling indicates that gates such as illustrated could be fabricated to fit within a 30 nm cube. FIG. 13A shows a transmission gate 1300 having a shaped plate 1302 that can be formed of a diamondoid material with a graphene surface 1304 (to reduce friction), which has a cylindrical socket 1306 that is engaged by an input pin 1308 on an input 1310 that can be formed from a modified CNT. A driven element 1312 having a driven pin 1314 and an output 1316 having an output pin 1318 engage the plate 1302, and can also be formed from modified CNTs that engage the plate 1302 via van der Waals attraction. The input 1310, the driven element 1312, and the output 1316 are all slidably mounted in guide sleeves 1320. If these sliding elements (1610, 1312, and 1316) are formed from 10-0 CNTs, the sleeves 1320 can be formed from 18-0 CNTs. The sleeves 1320 in turn are mounted on supports 1322 that are affixed to anchors 1324 (which could be part of a single rigid structure). The anchors 1324 can be surfaces of a diamond or diamondoid material such as lonsdaleite. As labelled for the support of the driven element 1312, the supports 1322 can be bonded to the anchors 1324 by employing base sections 1326 formed of 9-0 CNTs, which provide an arrangement of carbon atoms that closely matches the hexagonal arrangement of the lonsdalite to facilitate bonding the base sections 1326 thereto. The supports 1322 illustrated each have a transition section 1328 formed by a short section of 18-0 CNT, and a sleeve-mounting section 1330 formed by a section of 10-0 CNT; the 10-0 CNT forms a stable T-branch with the 18-0 CNT that serves as the sleeve 1320, and both the 10-0 and 9-0 CNTs can be transitioned into the 18-0 CNT of the transition section 1328. Additionally, the 18-0 size of the transition sections 1328 matches the size of the 18-0 CNTs of the sleeves 1320, so that placing the sleeves 1320 of each pair in contact with each other also results in the transition sections 1328 being in contact with each other, serving to stabilize the spacing of the supports 1322.

FIG. 13B illustrates an another transmission gate 1350 that is also suitable for molecular-scale fabrication. The gate 1350 again has a shaped plate 1352 with a graphene surface 1354 and a cylindrical socket 1356, and an input 1358 with an input pin 1360 that engages the socket 1356. The gate 1350 also has a driven element 1362 with a driven pin 1364 and an output 1366 with an output pin 1368, where the driven pin 1364 and the output pin 1368 engage the graphene surface 1354 of the plate 1352 by non-contact forces. To provide a simpler, more compact structure than the gate 1300, the gate 1350 mounts each of the sliding elements (1358, 1362, and 1366) in a single guide sleeve 1370, mounted to an anchor 1372 by a support 1374. Each of the sliding elements (1358, 1362, and 1366) is stabilized by a guide pin 1376 that engages a track 1378 formed on the anchor 1372. The track 1378 may have a graphene surface 1380 for slidably engaging the guide pin 1376. In combination with the limit on motion resulting from the elements (1358, 1362, and 1366) sliding within the associated guide sleeve 1370, the track 1378 can be formed narrow enough to serve to direct the guide pin 1376.

FIG. 14 illustrates a transmission gate 1400 which operates similarly to the gate 1250 discussed above, but which provides a mechanical gain in the displacement of an output 1402 relative to the motion of a driven element 1404 when a plate 1406 is moved by an input 1408 to place the plate 1406 in an active position where an edge 1410 is positioned to intercept the driven element 1404. The position where the driven element 1404 engages the plate 1406 can be adjusted, and the difference in distance from the location where the plate 1406 pivotably engages the input 1408 results in a difference in displacement of the driven element 1404 and the output 1402; if the output 1402 is twice as far from the input 1408 as the driven element 1404, it will be displaced twice the amount that the driven element 1404 is. When the input 1408 is displaced, the plate 1406 is positioned such that the driven element 1404 moves across a path region 1412, and thus the motion of the driven element 1404 can be accommodated without it passing beyond any edges of the plate 1406.

Figure 15A:
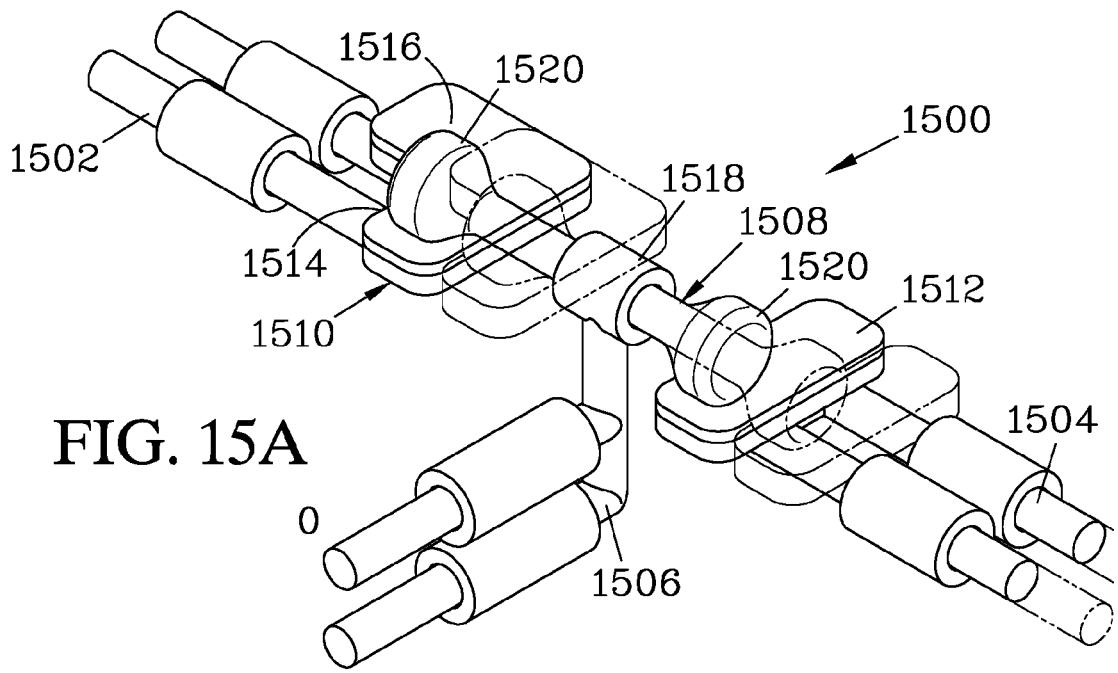
Figure 15B:
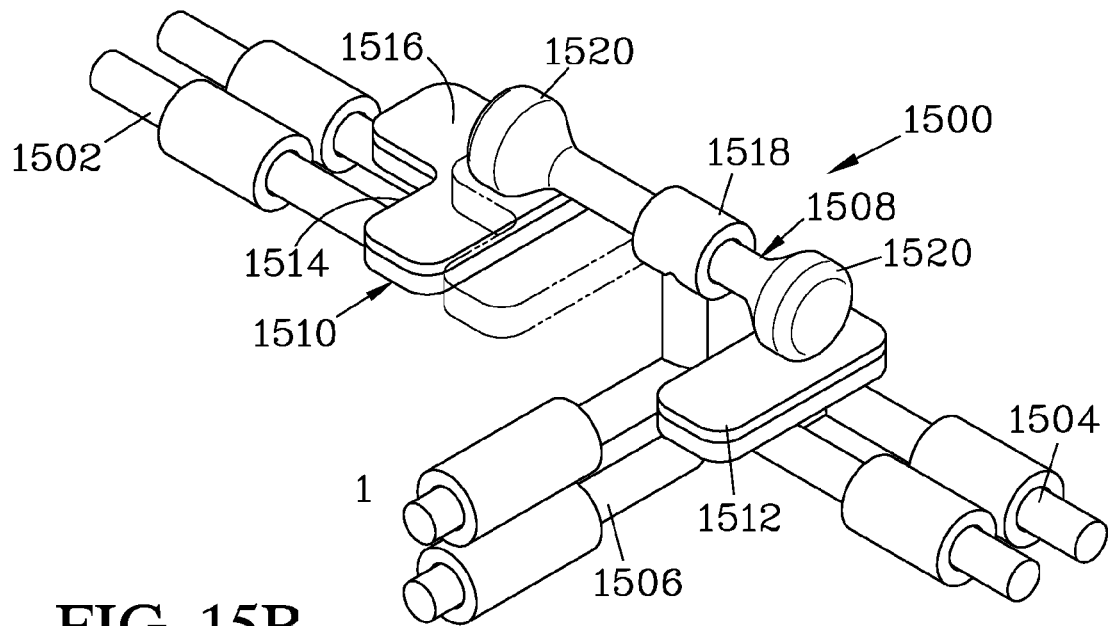

FIGS. 15A & 15B illustrate a mechanism 1500 that uses a principle of accommodating or transmitting motion from a driven element 1502 to an output 1504 that is similar to that of the mechanisms (1200, 1250, 1300, 1400) described above. The mechanism 1500 has an input 1506 that controls the position of a connector 1508, which is engaged via non-contact forces (NCFs) with a driven plate 1510 and an output plate 1502, either or both of which can be shaped to provide the desired logic response to the position of the input 1506. Whether or not movement of the driven element 1502 is transmitted to the output 1504 is determined by the position of the connector 1508 and the configuration of the plates (1510, 1512). In this example, the driven plate 1510 is L-shaped, having an edge 1514 and a path region 1516. When the connector 1508 is in an undisplaced position (with respect to a direction perpendicular to the motion paths of the driven element 1502 and the output 1504) as shown in FIG. 15A (typically encoding input value 0), displacement of the driven plate 1510 acts to move the edge 1514 in the direction of the connector 1508. The connector 1508, which is slidably engaged with the input 1506 via a connector sleeve 1518, moves with the driven plate 1510 to avoid having to overcome the NCF barrier to move beyond the edge 1514. Similarly, NCF forces between the connector 1508 and the output plate 1512 act to move the output plate with the connector 1508 (as shown in phantom lines). The connector 1508 is formed with enlarged ends 1520 for engaging the plates (1510, 1512).

When the connector 1508 is displaced by displacement of the input 1506 as shown in FIG. 15B (typically encoding input value 1), it is aligned with the path region 1516 of the driven plate 1510, and thus the motion of the driven plate 1510 can be accommodated by the connector 1508 simply moving along the path region 1516 (actually the path region 1516 moving), with no change in NCFs; since the connector 1508 does not move, motion is not transmitted to the output plate 1512. In this mechanism, the input 1506 moves the motion-transmitting element (connector 1508) relative to a motion-controlling element (driven plate 1510 in this case), rather than moving a single motion-controlling element as in the mechanisms 1200, 1250, 1300, 1350 as discussed above. In this case, the motion-transmitting element and shaped plate(s) can both be considered parts of a motion-controlling structure, with their relative positions determining whether such structure is in a motion-accommodating or a motion-transmitting configuration. Similarly, the connector 1508 could be considered a motion-transmitting element that is either interposed between an active portion of the driven element (portion of driven plate 1510 that is bounded by the edge 1514) and the output (output plate 1512) or is not so interposed; in this case, while the connector can be positioned such that it is interposed between the path region 1516 and is physically interposed between the plates (1510, 1512), it can be considered functionally not interposed, because the portion of plate 1510 that it is interposed with can be considered an inactive portion of the driven plate 1510.

If the input is connected to remaining elements such that it can be moved to position the connector at multiple positions, the driven plate and/or the output plate can be configured to provide an appropriate response to each such position. FIG. 15C illustrates one possible mechanism 1530 that provides a NAND logic function performed on two inputs 1532 that are connected to a balance 1534, which in turn positions a connector link 1536 and a connector 1538 based on the combined positions of the inputs 1532. A driven plate 1540 has an edge 1542 and a path region 1544, and the mechanism 1530 is configured such that the connector 1538 is aligned with the path region 1544 only when both inputs 1532 are displaced. Thus, when neither or only one of the inputs 1532 is displaced (such as shown in FIG. 15C for input values (1, 0)), the edge 1542 is positioned to force motion of the connector 1538 when the driven plate 1538 is displaced, also displacing an output plate 1546. When both inputs 1532 are displaced, the connector 1538 is positioned in alignment with the path region 1544, which accommodates motion of the driven plate 1538 relative to the connector 1538. In this case, the connector 1538 is not forced to move with the driven plate 1540, so the output plate 1546 also does not move. The response of the mechanism to the input values is determined by the configurations of the driven plates and/or the output plates, which can be configured to provide alternative responses. For example, a plate with two path regions bracketing an edge could provide an XOR logic function, and a plate with a shorter edge and a double-width path region could provide a NOR function.

FIG. 15D shows a mechanism 1550 that is functionally similar to the mechanism 1500, but where an output plate 1552 is partially superimposed over the driven plate 1510, with an enlarged end 1554 of a connector 1556 positioned between the plates (1510, 1552). Superimposing the plates (1510, 1552) reduces the overall volume of the mechanism 1550 compared to the mechanism 1500.

FIGS. 16A-16F show mechanisms where a path for accommodating motion of a driven element can be either aligned or misaligned, and serves to either not impede or impede the advancement of the driven element itself (which could, in turn, act to move an output). In the examples illustrated, two inputs are provided, each either accommodating or not accommodating motion of the driven element. Mechanisms having a similar function could be formed using flat plates, and those mechanisms using flat plates discussed above could be adapted to mechanisms having a cylindrical structure, if the flat plates were rolled into cylinders. Mechanisms can also vary as to which elements serve to block or accommodate motion of others, according to the desired action of the mechanisms and which motions are desired to be rotational and which translational.

Figure 16A:
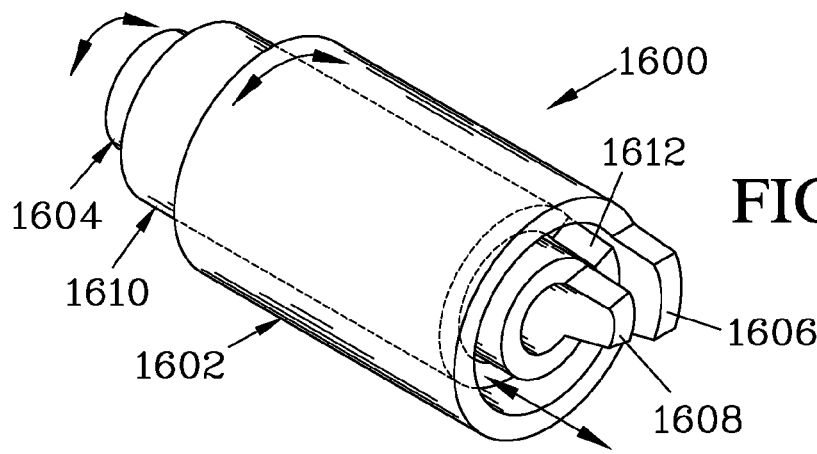
FIGS. 16A-F illustrate two examples of logic mechanisms having concentric rotating elements to selectively block or allow translation based on positions of two inputs.
Figure 16B:
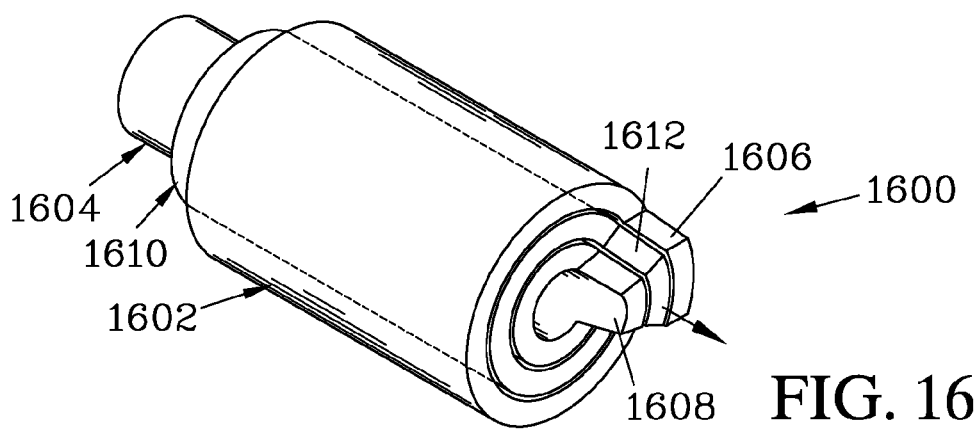
Figure 16C:
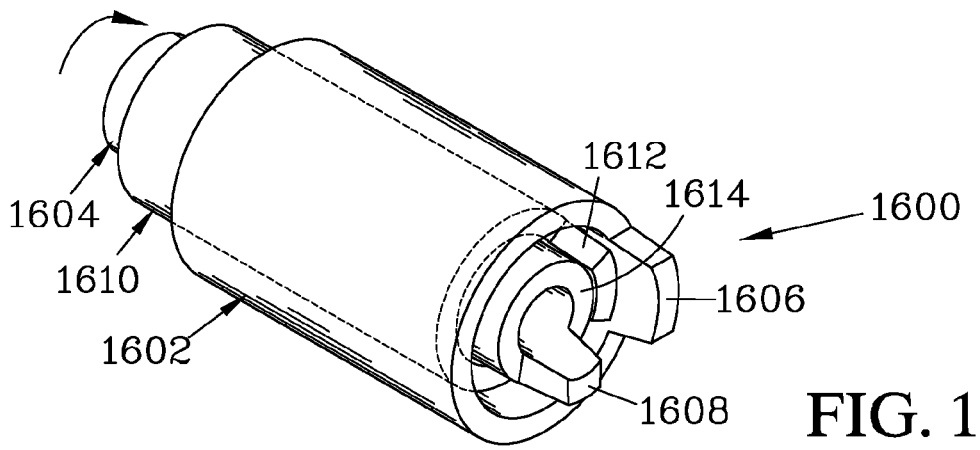

FIGS. 16A-C illustrate a logic mechanism 1600 with inputs 1602 and 1604 that are cylindrical, and are positioned by rotation rather than by translation. Each input (1602, 1604) has an extending input tab 1606, 1608. A cylindrical driven element 1610 having a driven tab 1612 is positioned between the inputs (1602, 1604), each of which is rotatable with respect to the driven element 1610. The inputs (1602, 1604) and the driven element could be formed from carbon nanotubes. The inputs (1602, 1604) can be angularly positioned such that both of the input tabs (1606, 1608) are aligned with the driven tab 1612 of the driven element 1610, as shown in FIGS. 16A & 16B; this could be designated as an undisplaced position of the inputs (1602, 1604), representing input values (0, 0). When so positioned, translational displacement of the driven element 1610 merely slides the driven tab 1612 along the input tabs (1606, 1608), and no change in attractive force need be overcome, allowing the driven element 1610 to be freely displaced from an initial position, shown in FIG. 16A, to a displaced position, shown in FIG. 16B. In effect, each input tab (1606, 1608) provides an aligned path to accommodate motion of the driven tab 1612; however, both input tabs (1606, 1608) must be aligned to avoid impeding movement of the driven tab 1612.

FIG. 16C shows the mechanism 1600 when the input 1604 has been rotated to misalign its input tab 1608 with the driven tab 1612, corresponding to input values (0, 1); in this position, translational motion of the driven element 1610 would require overcoming the attractive force to push the driven tab 1612 beyond the edge of the input 1604, and thus the attractive force impedes translational motion of the driven element 1610. If the motive force on the driven element is less stiff than this impedance to movement, the driven element 1610 is blocked from displacement. In effect, the path for accommodating motion created by input tab 1608 is no longer aligned with the driven tab 1612. A similar impedance effect would occur if the input 1602 were displaced to misalign its input tab 1606 with the driven tab 1612. Thus, the driven element 1610 only displaces without impedance if both inputs (1602, 1604) are undisplaced. If the undisplaced and displaced positions of the elements (1602, 1604, and 1610) are assigned the respective output values of 0 and 1, the response of the driven element 1610 when force is applied provides a NOR logic function of the inputs (1602, 1604); such response could be encoded by an output either attached to or moved by the driven element 1610 when displaced. Alternatively, the mechanism 1600 could be connected to other elements such that outputs are translatably moved by the inputs (1602, 1604) if they are displaced by the driven element; in such case, the input tabs (1606, 1608) each act as motion-controlling structures, either alignable with the driven tab 1612 (thus placing the motion-controlling structure into a motion-accommodating configuration where displacement of the driven element 1610 is not transmitted to the output associated with that input tab), or misaligned therewith (thus placing the motion-controlling structure into a motion transmitting configuration, where displacement of the driven element 1610 causes the output associated with the misaligned tab to also be displaced).

Figure 16D:
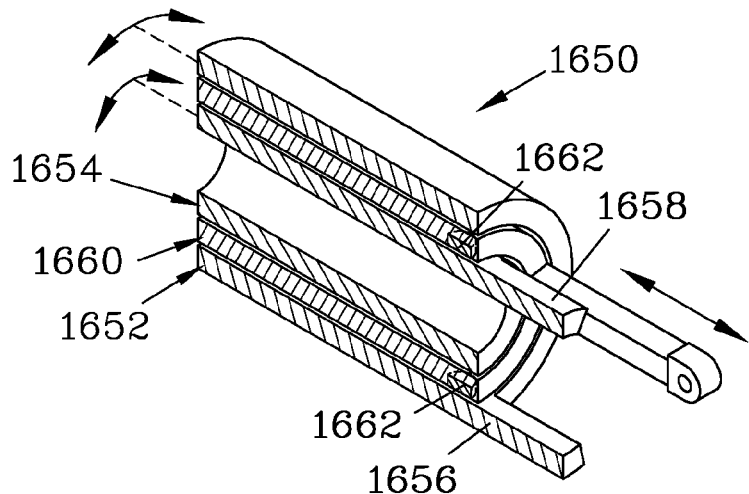
Figure 16E:
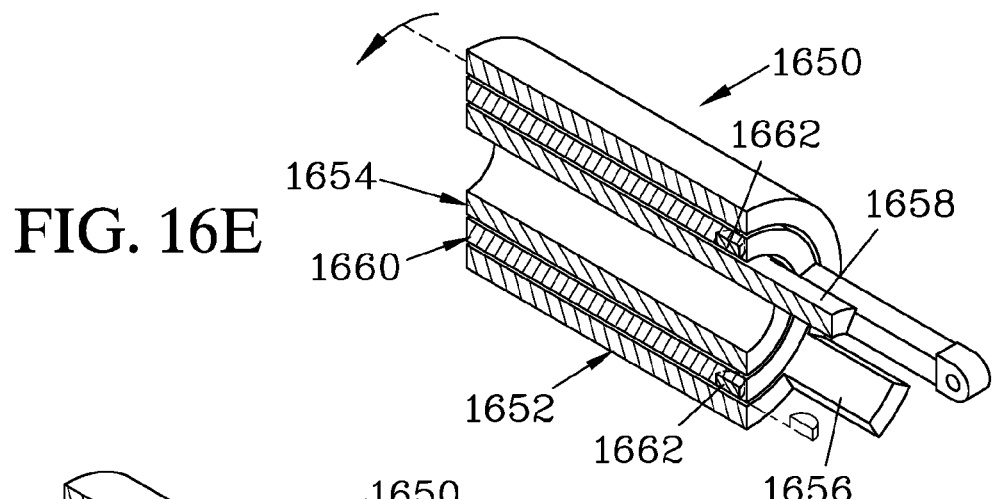
Figure 16F:
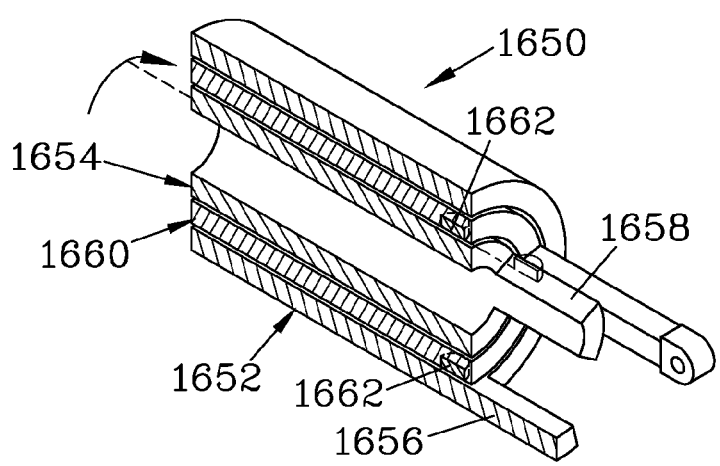

FIGS. 16D-16F illustrate a logic mechanism 1650 which operates similarly to that shown in FIGS. 16A-16C, but which employs magnets and ferromagnetic materials to provide non-contact forces between the components to provide the selective impedance function in a larger-scale mechanism. The mechanism 1650 again has two inputs 1652 and 1654, each having an extending tab (1656, 1658) with the angular positions of the tabs (1656, 1658) being determined by rotation relative to a driven element 1660 that resides concentrically between the inputs (1652, 1654), and which can be translatably displaced with respect thereto. The driven element 1660 in this case has a pair of attractive elements 1662, positioned so as to be aligned with the tabs (1656, 1658) when the tabs (1656, 1658) are in undisplaced positions, as shown in FIG. 16D. As illustrated, the attractive elements 1662 are provided by magnets, and the inputs 1652, 1654 are formed of a ferromagnetic material. When both inputs (1652, 1654) are positioned such that the tabs (1656, 1658) are each aligned with one of the attractive elements 1662, as shown in FIG. 16D, displacement of the driven element 1660 merely slides each of the attractive elements 1662 along the associated tab (1656, 1658), and no change in attractive force need be overcome. FIGS. 16E and 16F respectively show the case where one of the inputs (1652 in FIG. 16E and 1654 in FIG. 16F) has been rotated to misalign its tab (1656, 1658) with the associated attractive element 1662, such that translational motion of the driven element 1660 would require overcoming the attractive force to push the attractive element 1662 beyond the input (1652, 1654) and thus the attractive force impedes translational motion of the driven element 1660.

Figure 17A:
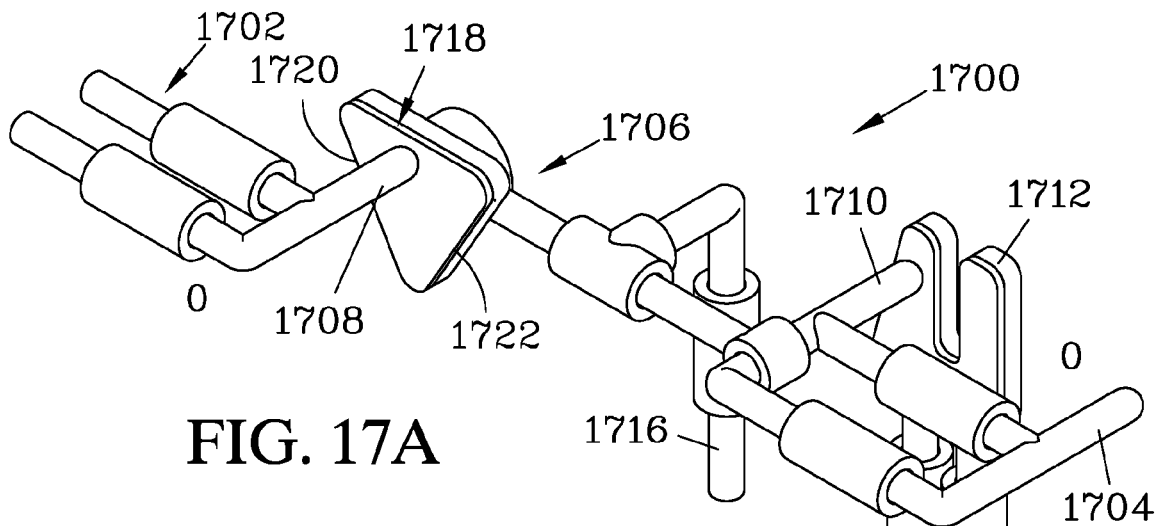
FIGS. 17A-17D illustrate a logic mechanism that serves as a non-volatile pass-through switch that can be employed to store values, such as between clock cycles; the mechanism employs a copy element with a shaped plate that moves it to a position representing the value of a first input, after which the copy element can be locked into position to retain the value while the first input is reset.
Figure 17B:
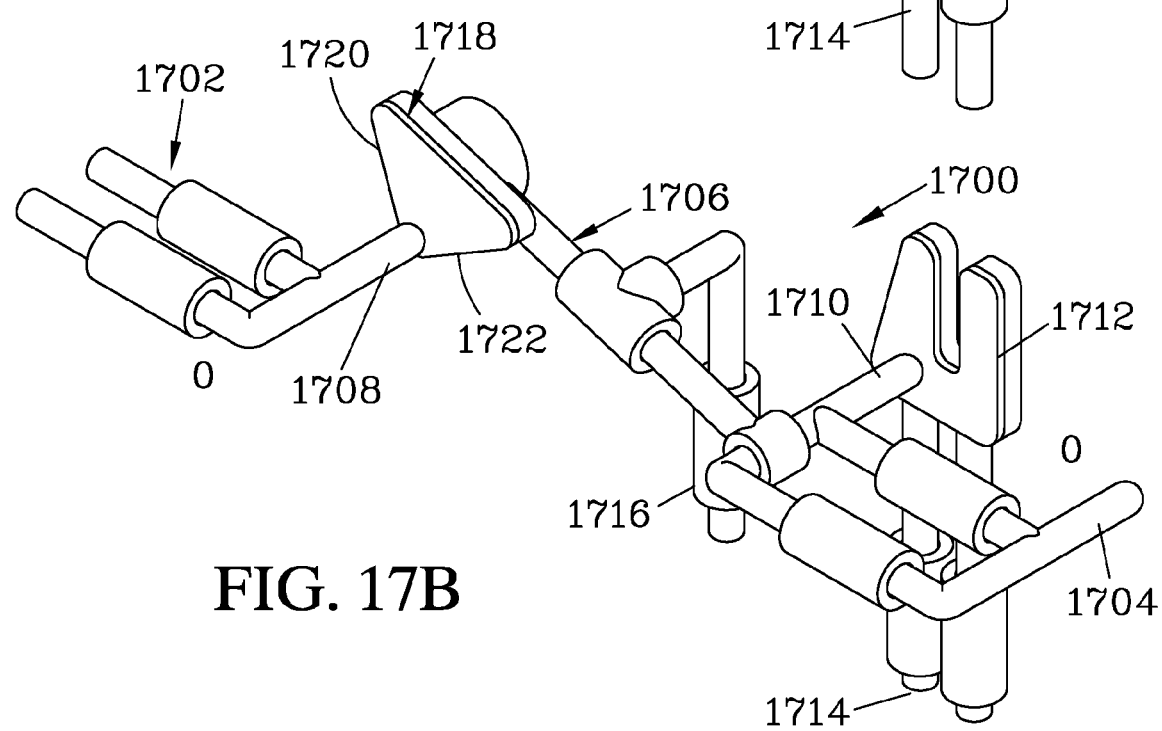
Figure 17C:
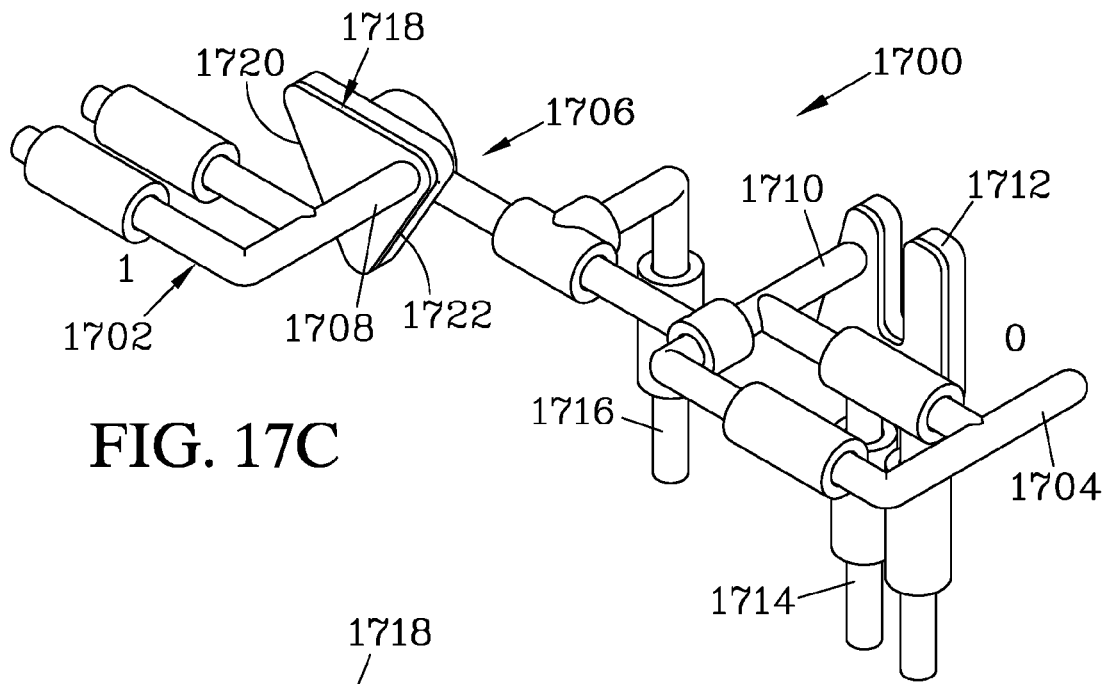
Figure 17D:
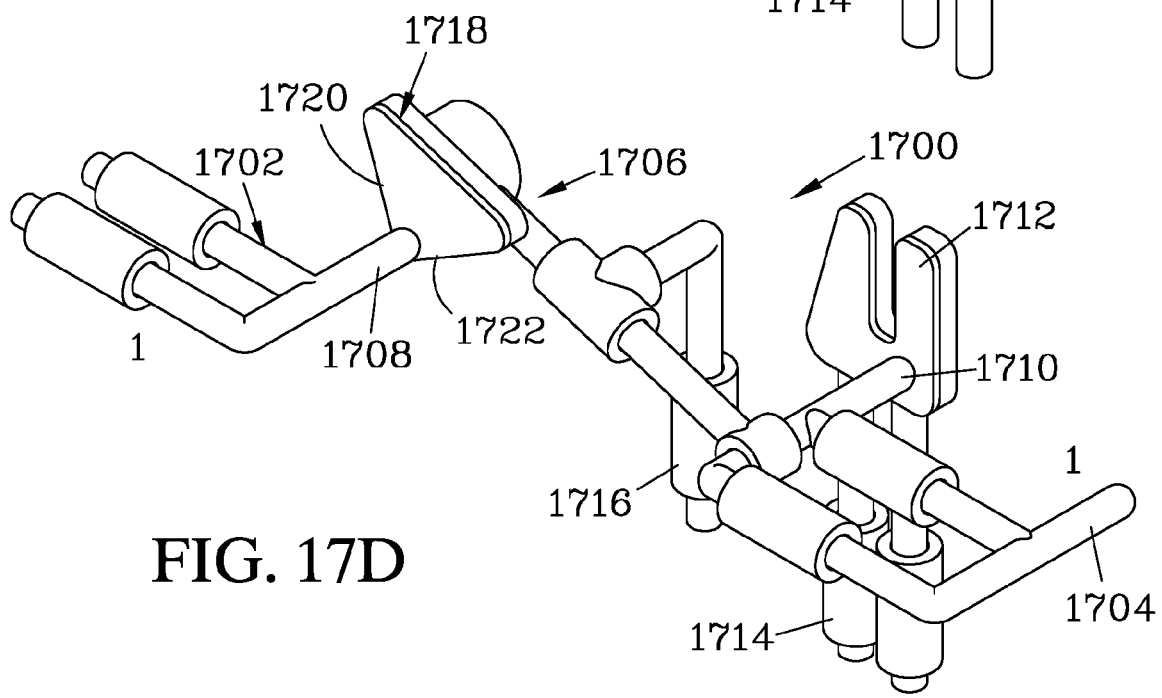

FIGS. 17A-D illustrate one example of a logic mechanism 1700 that serves as a non-volatile pass-through gate (or latch) which can store an input value between clock phases. The logic mechanism 1700 has a first input 1702 (which can also be considered a data input) and an output 1704, which are connected by a copy element 1706. As shown, the first input 1702 has an input pin 1708 that interacts with the copy element 1706 via non-contact forces (such van der Waals attraction in a nano-scale mechanism, or ferro-magnetism in a larger-scale mechanism), while the output 1704 is pivotably engaged with the copy element 1706. The copy element 1706 in turn has a copy pin 1710 (in this example formed integrally with the output 1704) that engages a lock plate 1712 via non-contact forces. The lock plate 1712 is U-shaped, and is moved between a lock position (FIGS. 17A and 17C) and an unlock position (FIGS. 17B and 17D) by a lock actuator 1714. When the lock plate 1712 is in its lock position, its edges constrain the movement of the copy pin 1710 and act to block translation of the copy element 1706 in the direction of motion of the first input 1702 and the output 1704, regardless of whether the output 1704 is in its 0-value position (FIGS. 17A-17C) or in its 1-value position (FIG. 17D).

When the lock plate 1712 is in its unlock position, the copy element 1706 and the output 1704 connected thereto are free to translate between the output's 0-value and 1-value positions without the copy pin 1710 encountering an edge of the lock plate 1712. At such time, the copy element 1706 can be pivoted relative to the output 1704 by a second input 1716 (which can be considered as a clock or actuator input, or as a driven element), moving the copy element 1706 between a free position (FIGS. 17A and 17C) and a copy position (FIGS. 17B and 17D). The copy element 1706 has a copy plate 1718 that is triangular, with edges 1720 and 1722 that interact with the input pin 1708 to move the copy element 1706 and the output 1704 to a position determined by the position of the first input 1702 as the copy element 1706 pivots to its copy position. If the first input 1702 is in its 0-value position, the edge 1720 acts to move the copy element 1706 and the output 1704 as the copy element 1706 is pivoted, to place the output 1704 in its 0-value position if not already there. Similarly, If the first input 1702 is in its 1-value position, the edge 1722 acts to move the copy element 1706 and the output 1704 to place the output 1704 in its 1-value position as the copy element 1706 is pivoted if the output 1704 is not already there. In either case, if the output 1704 is already in the corresponding position, the movement of the copy plate 1718 can be accommodated without forcing motion of the copy element 1706 and the output 1704. The input pin 1708 and the copy plate 1718 can be considered to form a motion-controlling structure that acts to either accommodate the motion of the copy element 1706 responsive to the driven element 1716 without moving the output 1704 (when the current position of the output 1704 matches the position of the first input 1702) or to transmit motion to the output 1704 (when the current position of the output 1704 does not match the position of the first input 1702). Thus, in this case, whether or not the motion-controlling structure is in a motion-accommodating configuration or a motion-transmitting configuration depends partly on the current position of the output 1704, rather than only on the position of the first input 1702. The action of the mechanism 1700 could be considered as having the first input 1702 define whether or not free motion of the second input (driven element) 1716 is constrained, and thus whether or not its motion can be accommodated without forcing motion of the output 1704 (with such determination being based on the output 1704 either matching or not matching the first input 1702 position).

Once the output 1704 has been moved to the correct position to reflect the value of the first input 1702, the lock plate 1712 can be returned to its lock position, preventing further translation of the copy pin 1710 and effectively locking the output 1704 in its current position. The copy element 1706 can then be pivoted back to its free position by retracting the second input 1716, at which time the first input 1702 is free to move between its 0-value and 1-value positions, while its previous value is stored by the locked position of the output 1704.

Figure 17E:
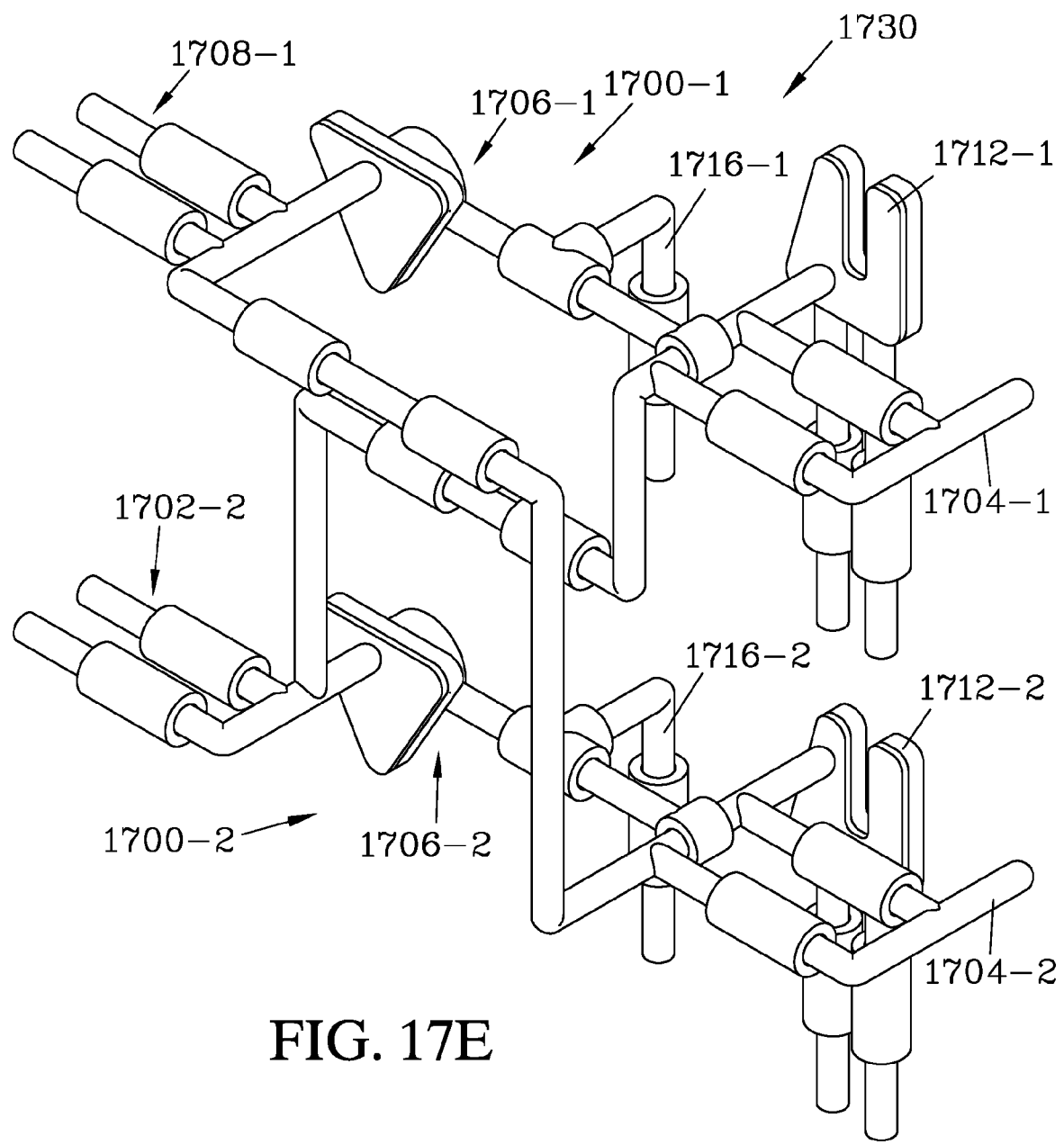
FIG. 17E illustrates two such mechanisms connected together to form a mechanical flip flop.

One use of such mechanisms 1700 is to chain two mechanisms 1700 to provide a D-type flip flop 1730, as shown in FIG. 17E, where the output 1704 of each logic mechanism 1700 defines the data input 1702 (i.e., first input 1702) of the other, and the lock plates 1712 are moved sequentially. To avoid binding, the lock plate 1712 for each logic mechanism 1700 is moved to its unlock position, allowing its associated data input 1702 to move freely, before the actuator input 1716 (i.e., second input 1716) of the other logic mechanism 1700 is activated to pivot the copy element 1706, which acts to set the associated output 1704 and the now-free data input 1702 of the non-associated logic mechanism 1700.

Thus, in sequence, the lock plate 1712-1 of the first logic mechanism 1700-1 is placed in its unlock position, and the first copy element 1706-1 is pivoted to its copy position by the first actuator input 1716-1 to set the first output 1704-1. Once set, the first lock plate 1712-1 is moved to its lock position, setting the output 1704-1 (which also sets the second data input 1702-2), and the first copy element 1706-1 is returned to its free position, allowing movement of the first data input 1702-1. The second lock plate 1712-2 is then moved to its unlock position, and the second copy element 1706-2 is moved to its copy position by the second actuator input 1716-2, which acts to place the second output 1704-2 (which also defines the first data input 1702-1) into the position defined by the second data input 1702-2 (which is defined by the first output 1704-1).

Figure 17F:
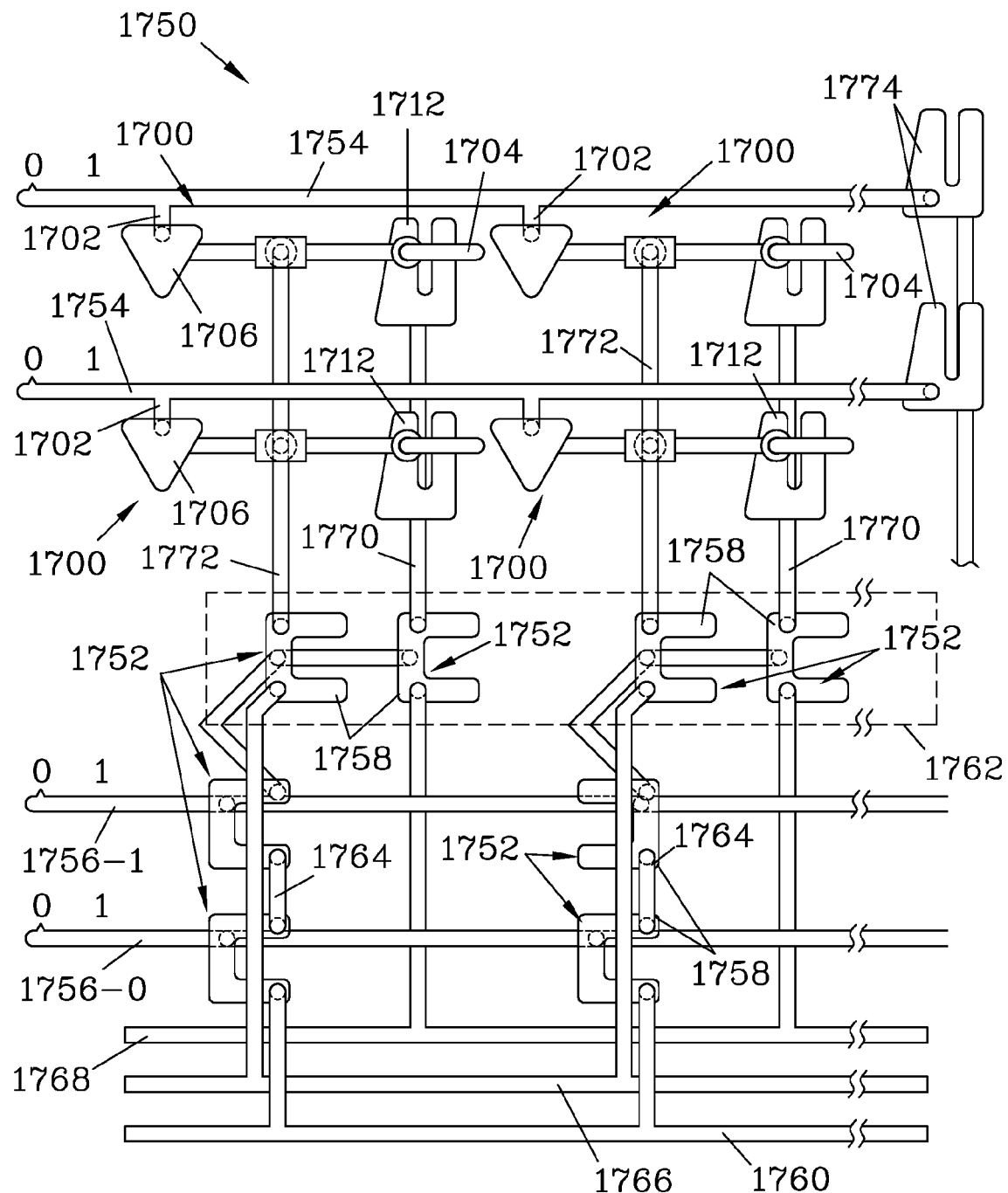
FIG. 17F illustrates a portion of a grid memory array that is formed from mechanisms such as shown in FIGS. 17A-D combined with an array of transmission gates connected to select a memory address where values can be either written or retrieved.

FIG. 17F shows another example of a mechanism employing logic mechanisms 1700, a portion of a grid memory 1750 (the view shown illustrates 2 of 4 columns of the entire memory structure). In this case, the logic mechanisms 1700 are used in combination with an arrangement of transmission gates 1752 that can be similar to the gates (1250, 1272, 1274, 1300, 1350) shown in FIGS. 12E-12H, 13A, & 163B. In the memory 1750, the logic mechanisms 1700 can store values received from a pair of data lines 1754, until these values are "read" back to the data lines 1754; in this scheme, the positions of the outputs 1704 are not read, and the outputs 1704 serve only to limit the motion of the copy elements 1706. FIG. 17F shows two memory addresses (00 and 01), and a similar additional pair of memory addresses (10 and 11, positioned in the cut-out portion on the right) are not shown; each memory address can store two bits of data. Each memory address has a pair of logic mechanisms 1700, with two data inputs 1702, each connected to the data line 1754 for that bit of information. Each data line 1754 connects together the data inputs 1702 for that bit for each of the memory addresses.

The transmission gates 1752 are arranged to select one of the memory addresses for current action, based on the positions of two address bars 1756, each of which identifies one bit of the memory address. Thus, the position of the address bar 1756-0 determines the first bit of the currently-active memory address, and the position of the address bar 1756-1 determines the second bit; as shown, both address bars (1756-0, 1756-1) are in their 0-value positions, so the memory address 00 is currently active. In each case, the positions of address bars (1756-0, 1756-1) place at least one transmission plate 1758 of a transmission gate 1752 for the inactive memory addresses into a position to interrupt transmission of motion from a memory select bar 1760 to transmission gates 1752 in a cell selector 1762 (in a manner similar to the chained transmission gates 1200A-C in the NOR gate 1230 shown in FIG. 12C). In such position, the transmission plate 1758 is positioned to accommodate motion of either the memory select bar 1760 itself or a memory select link 1764, without causing motion of the transmission plate 1758. For example, in the position shown, for the currently inactive memory address 01, the lower transmission plate 1758 is positioned to transmit motion of the memory select bar 1760 to the memory select link 1764, but the upper transmission plate 1758 is positioned to accommodate movement of the memory select link 1764 without transmitting such motion to the cell selector 1762. The transmission plates for the memory addresses 10 and 11 are arranged similarly to those for the addresses 00 and 01, but with their lower transmission plates positioned such that they can accommodate motion of the memory select bar 1760 when the address bar 1756-0 is in its 0-value position (thus they are inactive in the situation illustrated), but transfer movement to memory select links when the address bar 1756-0 is in its 1-value position, with the position of the upper transmission plates (positioned by the address bar 1756-1) determining which memory select link 1764 can be accommodated, and which acts to transmit movement. Thus, when the memory select bar 1760 is displaced upward, only one path of transmission through the transmission gates exists, defining the active memory address based on the positions of the address bars (1756-0, 1756-1).

In the cell selector 1762, displacement of the transmission gates 1752 in the selected path acts on a pair of linked transmission gates 1752; such action moves the pair of gates 1752 from inactive positions (where movement of an unlock bar 1766 and a copy bar 1768 can be accommodated without moving the transmission plates 1758, as shown) to active positions, where the transmission plates 1758 act to transmit movement of the unlock bar 1766 to an unlock link 1770, and movement of the copy bar 1768 to a copy link 1772. When moved, the unlock link 1770 serves as a lock actuator to move the lock plates 1712 of the logic mechanisms in the active memory address, while the copy link 1772 serves as an actuator input to move the copy elements 1706.

To store values encoded by the current positions of the data lines 1754 into the copy elements 1706 of the currently selected memory address, the data lines are first immobilized by data locks 1774. The unlock bar 1766 is then raised, to free translational motion of the copy elements 1706 for the selected address. The copy bar 1768 is then raised, and the interaction of the copy elements 1706 with the data inputs 1702 (fixed in position by the data locks 1774) acts to move the copy elements 1706 to positions that correspond to the positions of the data inputs 1702 as they are pivoted upwards by the copy link 1772. The unlock bar 1766 is then lowered, preventing the copy elements 1706 from translating between positions, and thus storing the encoded values. Thereafter, the copy bar 1768 can be lowered, and the data locks 1774 released to allow the data lines 1754 to be reset to new values.

To retrieve the stored values, the actions of the copy bar 1768 and the unlock bar 1766 can be reversed. The data lines 1754 are unlocked to allow the data inputs 1702 to move, and then the copy bar 1768 is raised. Since the unlock bar 1766 has not yet been raised, the copy elements 1706 for the selected memory address are blocked from translating, and thus each retain the position reflecting their current value (the value previously stored after copying the value of the associated data input 1702); when the copy bar 1768 is raised, the pivoting movement of each copy element 1706 acts to move the associated data input 1702 to either its 0-value or 1-value position, to match the value currently encoded by the copy element 1706. The data inputs 1702 (which are effectively serving as outputs in this scenario) are then locked in position by activating the data locks 1774, and the copy bar 1768 can then be lowered, before the memory select bar 1760 is lowered to allow selection of a new memory address from which to retrieve values.

Although the present invention is described with reference to particular examples, other mechanisms are possible for obtaining the benefit of the present invention. Accordingly, the spirit and scope of the appended claims should not be limited to the description of the particular examples contained herein.

The invention claimed is:

1. A logic mechanism comprising:
   a driven element;
   a mechanical output; and
   at least one mechanical input;
      the mechanism being configured such that the position(s) of said input(s) determine whether elements of the mechanism are aligned to form a path to transmit movement of said driven element to said output, in which case movement of said driven element is transmitted to said output, the elements of the mechanism otherwise being positioned such that they do not form any path for transmitting motion of said driven element to said output.

2. The logic mechanism of claim 1 comprising at least two mechanical inputs wherein the determination of whether or not motion of said driven element is transmitted to said output is defined by a Boolean logic operation of the positions of at least two of said inputs.

3. The logic mechanism of claim 2 wherein said Boolean logic operation is a NOR, NAND, or XOR logic operation.

4. The logic mechanism of claim 1 further comprising:
   at least one motion-transmitting element selectively interposable between said driven element and said output, the position(s) of said motion-transmitting element(s) being defined by position(s) of said input(s) such that the position(s) of said input(s) determine whether or not said motion-transmitting element(s) is/are interposed between said driven element and said output so as to transmit motion therebetween.

5. The logic mechanism of claim 4 wherein said motion-transmitting element(s) are attached to said input(s) and directly positioned thereby.

6. The logic mechanism of claim 4 having at least one motion-transmitting element that is connected to at least two inputs and positioned by the combined positions thereof.

7. The logic mechanism of claim 4 further comprising at least one guide which directs one of said motion-transmitting element(s), said guide(s) being attached to said input(s) and directly positioned thereby.

8. The logic mechanism of claim 4 wherein said motion-transmitting element has an active portion, which is interposable between said driven element and said output and acts to transmit motion therebetween when so interposed, and an inactive portion, which can accommodate motion of said driven element without transmitting such motion to said output when interposed between said driven element and said output.

9. The logic mechanism of claim 1 further comprising:
   at least one guide for directing at least one of said driven element and said output, the position(s) of said guide(s) being defined by position(s) of said input(s) such that the position(s) of said input(s) determine whether or not said driven element and said output are positioned relative to each other so as to transmit motion therebetween.

10. The logic mechanism of claim 1 wherein said driven element and said output have aligned positions in which said driven element and said output are positioned such that motion of said driven element is transmitted to said output, and further wherein said input(s) can be positioned to displace at least one of said driven element and said output away from its aligned position.

11. The logic mechanism of claim 10 wherein said driven element is aligned to transmit motion to said output unless deflected from such alignment, and at least a subset of said input(s) act to either deflect or not deflect said driven element.

12. The logic mechanism of claim 1 further comprising:
   at least one motion-transmitting element positionable so as to transmit motion between said driven element and said output;
   a constraining structure for selectively limiting the range of free motion of said motion-transmitting element(s) based on the position(s) of said input(s) so to either constrain or not constrain said motion-transmitting element(s),
   said motion-transmitting element(s) having sufficient free motion to accommodate movement of said driven element without causing motion of said output when unconstrained, and being positioned to transmit motion from said driven element to said output when constrained by said constraining structure.

13. The logic mechanism of claim 1 further comprising:
   at least one complimentary mechanical output which defines a value different from that defined by said output,
   wherein the position(s) of said input(s) determine whether or not motion is transmitted to said output or to said complimentary output.

14. A logic mechanism comprising:
a driven element;
a mechanical output; and
at least one mechanical input;
   the mechanism being configured such that the position(s) of said input(s) determine whether elements of the mechanism are positioned to constrain free motion of said driven element such that movement of said driven element can only be accommodated by transmitting motion to said output.

15. The logic mechanism of claim 14 comprising at least two mechanical inputs wherein the determination of whether or not motion of said driven element can be accommodated without transmitting motion to said output is defined by a Boolean logic operation of the positions of at least two of said inputs.

16. The logic mechanism of claim 14 wherein the position(s) of said input(s) determine whether or not elements of the mechanism are aligned along a common axis of rotation, such alignment condition determining whether or not movement of said driven element can be accommodated by rotational motion without transmitting motion to said output.

17. The logic mechanism of claim 14 further comprising:
at least one motion-transmitting element positionable so as to transmit motion between said driven element and said output; and
a constraining structure for selectively limiting the range of free motion of said motion-transmitting element(s) based on the position(s) of said input(s) so to either constrain or not constrain said motion-transmitting element(s),
   said motion-transmitting element(s) having sufficient free motion to accommodate movement of said driven element without causing motion of said output when unconstrained, and being positioned to transmit motion from said driven element to said output when constrained by said constraining structure.

18. A logic mechanism comprising:
a driven element;
a mechanical output;
at least one mechanical input; and
a motion-controlling structure having at least one motion-control element positioned by said input(s) to selectively place said motion-controlling structure in at least a motion-accommodating configuration, where motion of said driven element can be accommodated without causing movement of said output, and a motion-transmitting configuration, where motion of said driven element is transmitted to said output by at least one element of said motion-controlling structure,
   the mechanism being configured such that the position(s) of said input(s) determine whether or not movement of said driven element is transmitted to said output by determining whether or not a path for transmitting such motion exists.

19. The logic mechanism of claim 18 wherein a single motion-control element provides said motion-controlling structure.

20. The logic mechanism of claim 18 wherein said motion-controlling structure further comprises a motion-transmitting element, and wherein the position(s) of said motion-control element(s) determines the allowable motion of said motion-transmitting element.

21. A logic mechanism comprising:
a driven element;
a mechanical output;
at least one mechanical input; and
a motion-controlling structure having at least one motion-control element positioned by said input(s) to selectively place said motion-controlling structure in at least a motion-accommodating configuration, where motion of said driven element can be accommodated without causing movement of said output, and a motion-transmitting configuration, where motion of said driven element is transmitted to said output by at least one element of said motion-controlling structure,
   the mechanism being configured such that the position(s) of said input(s) determine whether or not free motion of said driven element is constrained, and thus determine whether or not movement of said driven element can be accommodated without transmitting motion to said output.

22. The logic mechanism of claim 21 wherein a single motion-control element provides said motion-controlling structure.

23. The logic mechanism of claim 21 wherein said motion-controlling structure further comprises a motion-transmitting element, and wherein the position(s) of said motion-control element(s) determines the allowable motion of said motion-transmitting element.

* * * * *